US012695438B2

(12) United States Patent
Goto

(10) Patent No.: US 12,695,438 B2
(45) Date of Patent: Jul. 28, 2026

(54) ACOUSTIC WAVE DEVICE WITH INTERDIGITAL TRANSDUCER ELECTRODES HAVING TWO BUS BARS

(71) Applicant: Skyworks Solutions, Inc., Irvine, CA (US)

(72) Inventor: Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 306 days.

(21) Appl. No.: 18/627,976

(22) Filed: Apr. 5, 2024

(65) Prior Publication Data

US 2024/0364305 A1 Oct. 31, 2024

Related U.S. Application Data

(60) Provisional application No. 63/457,742, filed on Apr. 6, 2023.

(51) Int. Cl.
*H03H 9/25* (2006.01)
*H03H 3/08* (2006.01)
(Continued)

(52) U.S. Cl.
CPC .............. *H03H 9/25* (2013.01); *H03H 9/145* (2013.01); *H03H 9/64* (2013.01); *H04B 1/38* (2013.01)

(58) Field of Classification Search
None
See application file for complete search history.

(56) References Cited

U.S. PATENT DOCUMENTS 5,646,584 A 7/1997 Kondratyev et al.
5,895,996 A 4/1999 Takagi et al.
(Continued)

FOREIGN PATENT DOCUMENTS

CN 113098432 7/2021
FR 3105894 A1 7/2021
(Continued)

OTHER PUBLICATIONS

Kapp, M., et al., "Investigation of GeO2 thin film properties for improvement of temperature coefficient of frequency of SAW devices", 2014 European Frequency and Time Forum (EFTF), Jun. 2014, 4 pages.
(Continued)

*Primary Examiner* — Tuan A Tran
(74) *Attorney, Agent, or Firm* — VIA LLP

(57) ABSTRACT

An acoustic wave device has a layer of piezoelectric material and two interdigital transducer electrodes disposed on an upper surface of the layer of piezoelectric material. Each interdigital transducer electrode of the two interdigital transducer electrodes includes a first bus bar, a second bus bar arranged in parallel to the first bus bar and having a smaller width than the first bus bar, and a plurality of electrode fingers extending from the second bus bar towards the respective other interdigital transducer electrode. The electrode fingers of the two interdigital transducer electrodes are interleaved. The second bus bar of each interdigital transducer electrode is connected with the first bus bar of the same interdigital transducer electrode via a plurality of bridges. Each bridge extends collinearly with one of the electrode fingers of the same interdigital transducer electrode. Each bridge has a width smaller than a smallest width of the electrode finger with which it is collinear.

22 Claims, 79 Drawing Sheets

(51) Int. Cl.

| | |
|---|---|
| *H03H 9/02* | (2006.01) |
| *H03H 9/13* | (2006.01) |
| *H03H 9/145* | (2006.01) |
| *H03H 9/17* | (2006.01) |
| *H03H 9/64* | (2006.01) |
| *H04B 1/38* | (2015.01) |

(56) References Cited

U.S. PATENT DOCUMENTS

| | | | | |
|---|---|---|---|---|
| 7,230,512 B1 | 6/2007 | Carpenter et al. | | |
| 7,352,104 B2 | 4/2008 | Yamazaki et al. | | |
| 7,554,242 B2 | 6/2009 | Aoki et al. | | |
| 7,786,827 B2 * | 8/2010 | Yoneya | H03H 9/25 | |
| | | | 331/107 A | |
| 8,294,331 B2 | 10/2012 | Abbott et al. | | |
| 8,741,683 B2 | 6/2014 | Huang et al. | | |
| 9,065,424 B2 | 6/2015 | Nakanishi et al. | | |
| 9,124,240 B2 | 9/2015 | Shimizu et al. | | |
| 9,136,458 B2 | 9/2015 | Komatsu et al. | | |
| 9,257,960 B2 | 2/2016 | Ruile et al. | | |
| 9,413,330 B2 | 8/2016 | Shimizu et al. | | |
| 9,419,584 B2 | 8/2016 | Tsuranari et al. | | |
| 9,438,201 B2 | 9/2016 | Hori et al. | | |
| 9,537,464 B2 | 1/2017 | Yamanaka | | |
| 9,640,750 B2 | 5/2017 | Nakanishi et al. | | |
| 9,641,152 B2 | 5/2017 | Nakamura et al. | | |
| 9,673,779 B2 | 6/2017 | Ruile et al. | | |
| 9,712,139 B2 * | 7/2017 | Taniguchi | H03H 9/6426 | |
| 9,748,923 B2 | 8/2017 | Kando et al. | | |
| 9,748,924 B2 | 8/2017 | Komatsu et al. | | |
| 10,090,825 B2 | 10/2018 | Kuroyanagi | | |
| 10,097,158 B2 * | 10/2018 | Kaneda | H03H 9/725 | |
| 10,153,748 B2 | 12/2018 | Tanaka | | |
| 10,355,668 B2 * | 7/2019 | Iwaki | H03H 9/02559 | |
| 10,361,678 B2 | 7/2019 | Iwaki et al. | | |
| 10,469,050 B2 * | 11/2019 | Gamble | H03H 3/10 | |
| 10,476,470 B2 | 11/2019 | Takamine | | |
| 10,483,942 B2 | 11/2019 | Goto et al. | | |
| 10,574,207 B2 | 2/2020 | Yoon et al. | | |
| 10,727,844 B1 | 7/2020 | Gong et al. | | |
| 10,749,497 B2 | 8/2020 | Tang et al. | | |
| 10,812,044 B2 * | 10/2020 | Okunaga | H03H 9/725 | |
| 10,826,507 B1 | 11/2020 | Gong et al. | | |
| 10,873,313 B2 | 12/2020 | Zou et al. | | |
| 10,958,246 B2 * | 3/2021 | Miyamoto | H03H 9/6483 | |
| 11,050,406 B2 | 6/2021 | Maki et al. | | |
| 11,095,266 B2 | 8/2021 | Inoue et al. | | |
| 11,165,411 B2 | 11/2021 | Liu et al. | | |
| 11,239,817 B2 | 2/2022 | Hatano et al. | | |
| 11,245,378 B2 | 2/2022 | Tang et al. | | |
| 11,296,672 B2 | 4/2022 | Hiratsuka et al. | | |
| 11,368,137 B2 | 6/2022 | Goto et al. | | |
| 11,496,116 B2 * | 11/2022 | Takata | H03H 9/1452 | |
| 11,522,514 B2 | 12/2022 | Zou et al. | | |
| 11,606,078 B2 | 3/2023 | Tang et al. | | |
| 11,611,325 B2 * | 3/2023 | Suzuki | H03H 9/02921 | |
| 11,616,491 B2 | 3/2023 | Tang et al. | | |
| 11,646,713 B2 * | 5/2023 | Suzuki | H03H 9/64 | |
| | | | 333/193 | |
| 11,677,380 B2 | 6/2023 | Fujiwara et al. | | |
| 11,689,180 B2 * | 6/2023 | Suzuki | H03H 9/02574 | |
| | | | 310/313 B | |
| 11,705,883 B2 * | 7/2023 | Hiramatsu | H03F 3/72 | |
| | | | 333/193 | |
| 11,722,122 B2 | 8/2023 | Goto et al. | | |
| 11,750,172 B2 | 9/2023 | Goto et al. | | |
| 11,824,515 B2 | 11/2023 | Tang et al. | | |
| 11,870,421 B2 * | 1/2024 | Hiramatsu | H03H 9/6483 | |
| 11,962,283 B2 | 4/2024 | Zou et al. | | |
| 11,990,892 B2 * | 5/2024 | Liu | H03H 9/02228 | |
| 12,040,784 B2 | 7/2024 | Tang et al. | | |
| 12,047,053 B2 | 7/2024 | Maki et al. | | |
| 12,136,908 B2 * | 11/2024 | Hiramatsu | H03H 9/14541 | |
| 12,255,632 B2 * | 3/2025 | Nakamura | H03H 9/14547 | |
| 12,255,635 B2 * | 3/2025 | Nakamura | H03H 9/02637 | |
| 12,294,351 B2 * | 5/2025 | Ochiai | H03H 9/6483 | |
| 12,355,424 B2 * | 7/2025 | Chauhan | H03H 9/02858 | |
| 12,368,431 B2 * | 7/2025 | Abbott | H03H 9/14541 | |
| 12,476,608 B2 * | 11/2025 | Abbott | H03H 9/14541 | |
| 12,483,226 B2 * | 11/2025 | Goto | H03H 9/6483 | |
| 12,542,524 B2 * | 2/2026 | Goto | H03H 3/08 | |
| 2004/0222717 A1 | 11/2004 | Matsuda et al. | | |
| 2005/0077982 A1 | 4/2005 | Funasaka | | |
| 2005/0127781 A1 | 6/2005 | Yamazaki et al. | | |
| 2008/0018417 A1 | 1/2008 | Igaki et al. | | |
| 2010/0265010 A1 | 10/2010 | Jian | | |
| 2012/0049968 A1 | 3/2012 | Owaki et al. | | |
| 2014/0285287 A1 | 9/2014 | Komatsu et al. | | |
| 2014/0339957 A1 | 11/2014 | Tajima et al. | | |
| 2016/0294361 A1 | 10/2016 | Yamane et al. | | |
| 2017/0063332 A1 | 3/2017 | Gilbert et al. | | |
| 2017/0099043 A1 | 4/2017 | Goto et al. | | |
| 2017/0104470 A1 | 4/2017 | Koelle et al. | | |
| 2017/0214385 A1 | 7/2017 | Bhattacharjee | | |
| 2017/0214386 A1 | 7/2017 | Kido | | |
| 2017/0222618 A1 | 8/2017 | Inoue | | |
| 2017/0250669 A1 | 8/2017 | Kuroyanagi et al. | | |
| 2017/0272051 A1 | 9/2017 | Kurihara et al. | | |
| 2017/0273183 A1 | 9/2017 | Kawasaki et al. | | |
| 2017/0288629 A1 | 10/2017 | Bhattacharjee et al. | | |
| 2017/0359048 A1 | 12/2017 | Yasuda | | |
| 2018/0013404 A1 | 1/2018 | Kawasaki et al. | | |
| 2018/0048290 A1 | 2/2018 | Sekine et al. | | |
| 2018/0097501 A1 | 4/2018 | Kikuchi et al. | | |
| 2018/0097508 A1 | 4/2018 | Iwamoto et al. | | |
| 2018/0102760 A1 | 4/2018 | Inoue et al. | | |
| 2018/0138893 A1 | 5/2018 | Caron | | |
| 2018/0316329 A1 | 11/2018 | Guenard et al. | | |
| 2018/0367119 A1 | 12/2018 | Lee | | |
| 2019/0288661 A1 | 9/2019 | Akiyama et al. | | |
| 2019/0319772 A1 | 10/2019 | Ando et al. | | |
| 2019/0379347 A1 | 12/2019 | Goto et al. | | |
| 2020/0036362 A1 | 1/2020 | Daimon | | |
| 2020/0067482 A1 | 2/2020 | Maki et al. | | |
| 2020/0106420 A1 | 4/2020 | Kodama et al. | | |
| 2020/0144984 A1 | 5/2020 | Fukuhara et al. | | |
| 2020/0212875 A1 | 7/2020 | Goto et al. | | |
| 2020/0212876 A1 | 7/2020 | Goto et al. | | |
| 2020/0212883 A1 | 7/2020 | Goto et al. | | |
| 2020/0220522 A1 | 7/2020 | Nosaka | | |
| 2020/0358424 A1 | 11/2020 | Kaneda et al. | | |
| 2020/0366268 A1 | 11/2020 | Goto et al. | | |
| 2020/0366270 A1 | 11/2020 | Matsuoka | | |
| 2020/0389151 A1 | 12/2020 | Goto | | |
| 2021/0006225 A1 | 1/2021 | Hatano | | |
| 2021/0050842 A1 | 2/2021 | Tang et al. | | |
| 2021/0058057 A1 | 2/2021 | Goto et al. | | |
| 2021/0126616 A1 | 4/2021 | Hiramatsu et al. | | |
| 2021/0167748 A1 | 6/2021 | Huck et al. | | |
| 2021/0297060 A1 | 9/2021 | Omura et al. | | |
| 2022/0014152 A1 | 1/2022 | Gebeyehu et al. | | |
| 2022/0014175 A1 | 1/2022 | Nagatomo et al. | | |
| 2022/0077840 A1 | 3/2022 | Caron | | |
| 2022/0109419 A1 | 4/2022 | Esquius Morote | | |
| 2022/0209738 A1 | 6/2022 | Torazawa et al. | | |
| 2022/0271730 A1 | 8/2022 | Abbott et al. | | |
| 2022/0271733 A1 | 8/2022 | Abbott et al. | | |
| 2022/0271734 A1 | 8/2022 | Abbott et al. | | |
| 2022/0328980 A1 | 10/2022 | Dicarlo et al. | | |
| 2022/0399867 A1 | 12/2022 | Goto et al. | | |
| 2022/0399871 A1 | 12/2022 | Goto et al. | | |
| 2023/0013597 A1 | 1/2023 | Goto et al. | | |
| 2023/0016884 A1 | 1/2023 | Goto et al. | | |
| 2023/0026465 A1 | 1/2023 | Huang et al. | | |
| 2023/0031568 A1 | 2/2023 | Tang et al. | | |
| 2023/0032325 A1 | 2/2023 | Goto et al. | | |
| 2023/0039507 A1 | 2/2023 | Kim et al. | | |
| 2023/0077266 A1 * | 3/2023 | Ishitaki | H03H 9/02881 | |
| 2023/0104405 A1 | 4/2023 | Hiramatsu et al. | | |
| 2023/0105726 A1 | 4/2023 | Tang et al. | | |
| 2023/0107376 A1 | 4/2023 | Goto et al. | | |
| 2023/0109106 A1 | 4/2023 | Hiramatsu et al. | | |
| 2023/0112677 A1 | 4/2023 | Tang et al. | | |

(56) References Cited

U.S. PATENT DOCUMENTS

| 2023/0163748 A1 | 5/2023 | Goto et al. |
|---|---|---|
| 2023/0208385 A1 | 6/2023 | Hiramatsu et al. |
| 2023/0208396 A1 | 6/2023 | Hiramatsu et al. |
| 2023/0208398 A1 | 6/2023 | Goto et al. |
| 2023/0208399 A1 | 6/2023 | Goto et al. |
| 2023/0223910 A1 | 7/2023 | Goto et al. |
| 2023/0223917 A1 | 7/2023 | Goto et al. |
| 2023/0231529 A1 | 7/2023 | Hiramatsu et al. |
| 2023/0275565 A1 | 8/2023 | Tang et al. |
| 2023/0283261 A1 | 9/2023 | Huang et al. |
| 2023/0327630 A1 | 10/2023 | Goto et al. |
| 2023/0327642 A1 | 10/2023 | Goto et al. |
| 2023/0327645 A1 | 10/2023 | Goto et al. |
| 2023/0336152 A1 | 10/2023 | Goto et al. |
| 2023/0336153 A1 | 10/2023 | Goto et al. |
| 2023/0336159 A1 | 10/2023 | Hiramatsu et al. |
| 2023/0344411 A1 | 10/2023 | Chen et al. |
| 2023/0344415 A1 | 10/2023 | Chen et al. |
| 2023/0344416 A1 | 10/2023 | Chen et al. |
| 2024/0022164 A1 | 1/2024 | Gong et al. |
| 2024/0039507 A1 | 2/2024 | Goto et al. |
| 2024/0186978 A1 | 6/2024 | Hiramatsu et al. |
| 2024/0223149 A1 | 7/2024 | Goto et al. |
| 2024/0223152 A1 | 7/2024 | Goto et al. |
| 2024/0223156 A1 | 7/2024 | Goto et al. |

FOREIGN PATENT DOCUMENTS

| JP | 2009-219045 A | 9/2009 |
|---|---|---|
| JP | 2014-135624 A | 7/2014 |
| JP | 2020-092422 A | 6/2020 |
| WO | WO 2017/161303 A1 | 9/2017 |

OTHER PUBLICATIONS

Iwamoto et al., "Transverse Modes in I.H.P. SAW Resonator and Their Suppression Method", Murata Manufacturing co., Ltd., 4 pages (2018).

Solal et al., "A method to reduce losses in buried electrodes RF SAW resonators", 2011 IEEE International Ultrasonics Symposium, pp. 324-332, doi: 10.1109/ULTSYM.2011.0078.

* cited by examiner

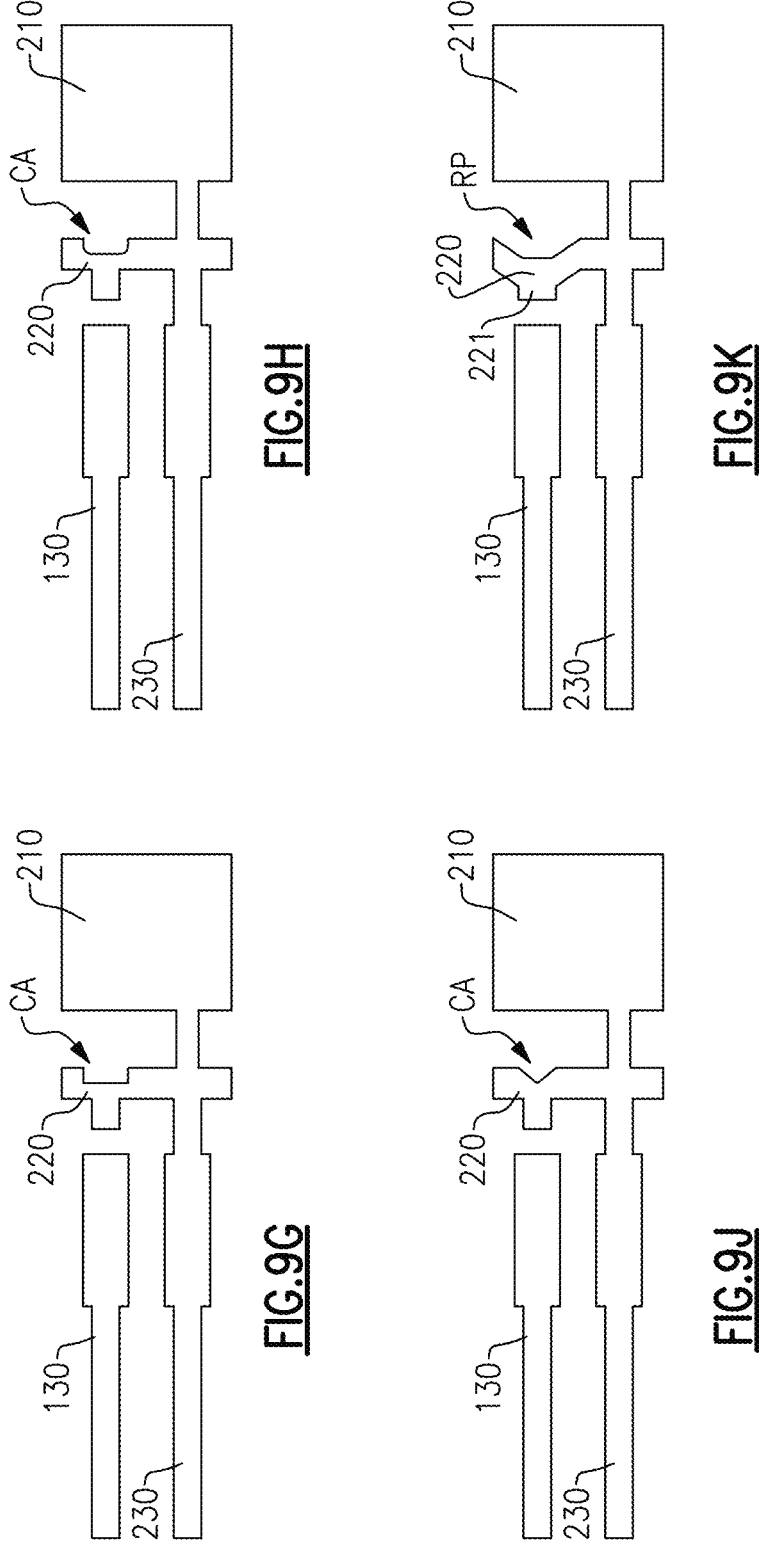

Tr2 REAL: Y(1,1) SCALE: 10.00/Div Ref −50.00

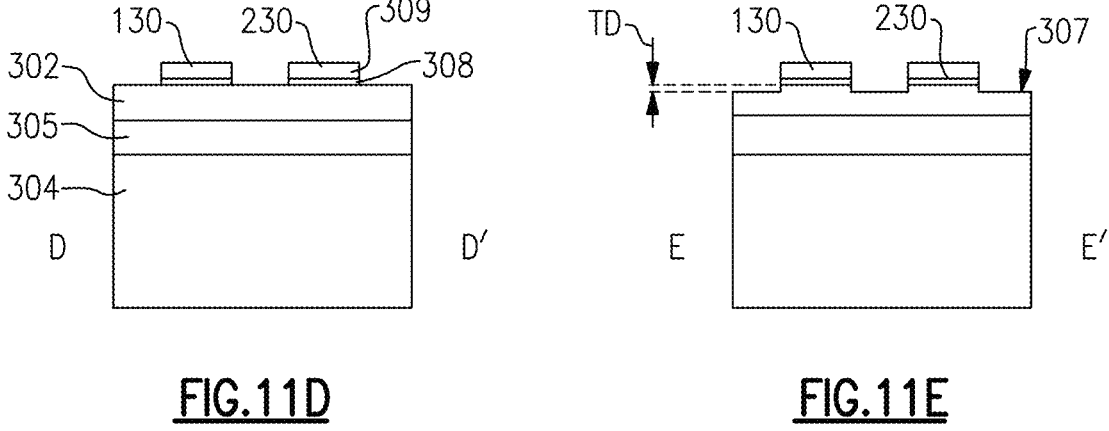
FIG.11D                    FIG.11E

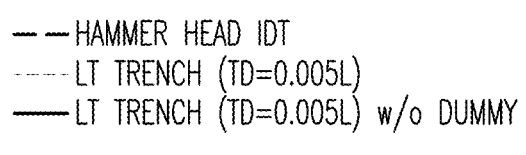
— — HAMMER HEAD IDT
······ LT TRENCH (TD=0.005L)
——— LT TRENCH (TD=0.005L) w/o DUMMY
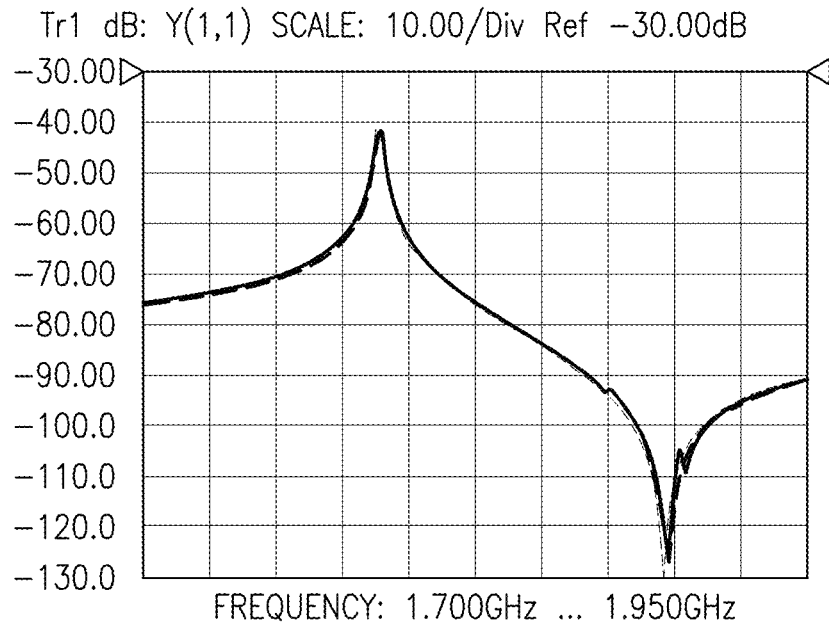
Tr1 dB: Y(1,1) SCALE: 10.00/Div Ref −30.00dB
FREQUENCY: 1.700GHz ... 1.950GHz
FIG.12A

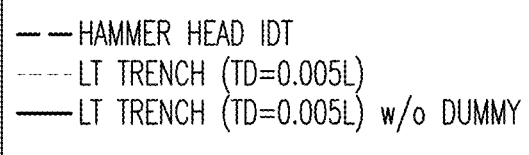
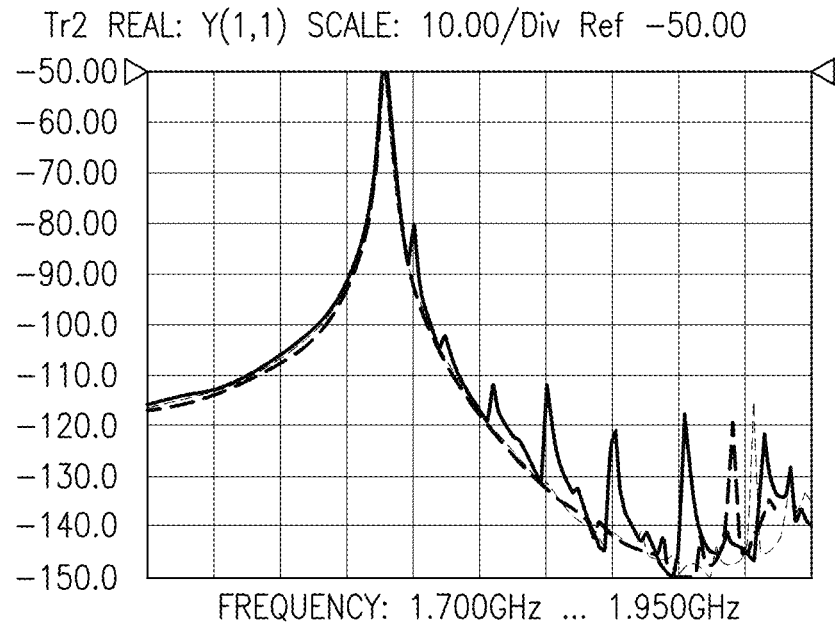
FIG.12B

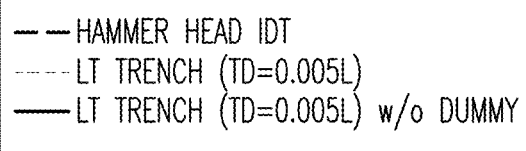
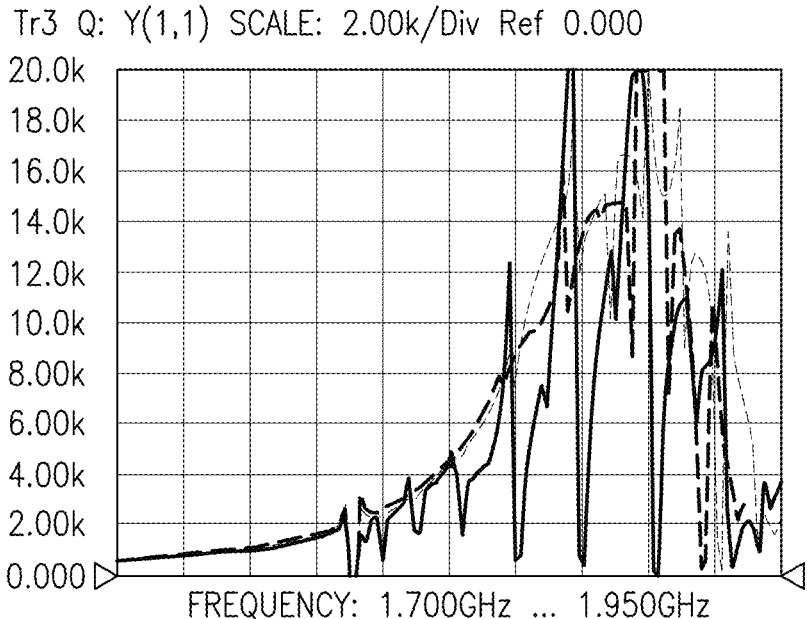
FIG.12C

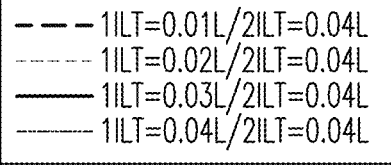
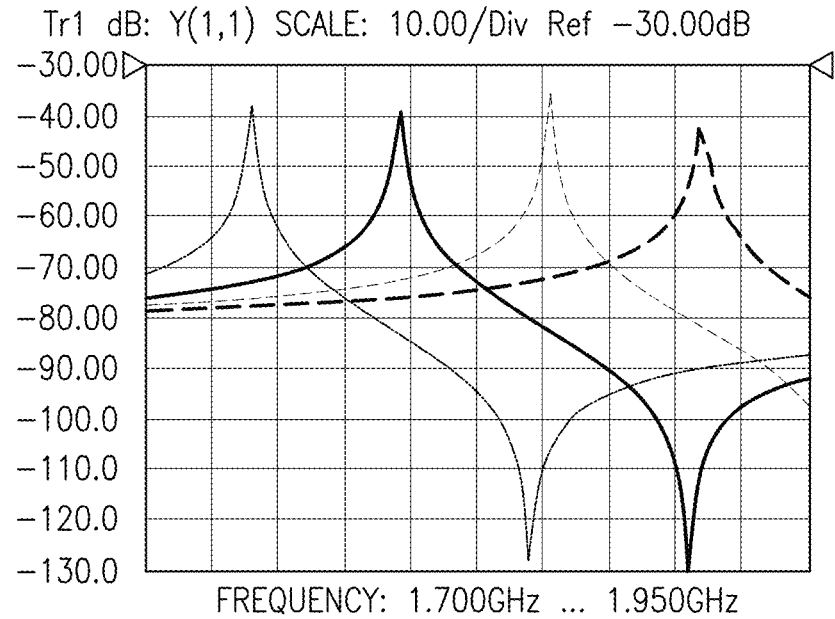
FIG.13A

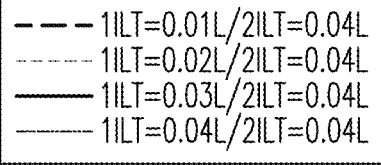
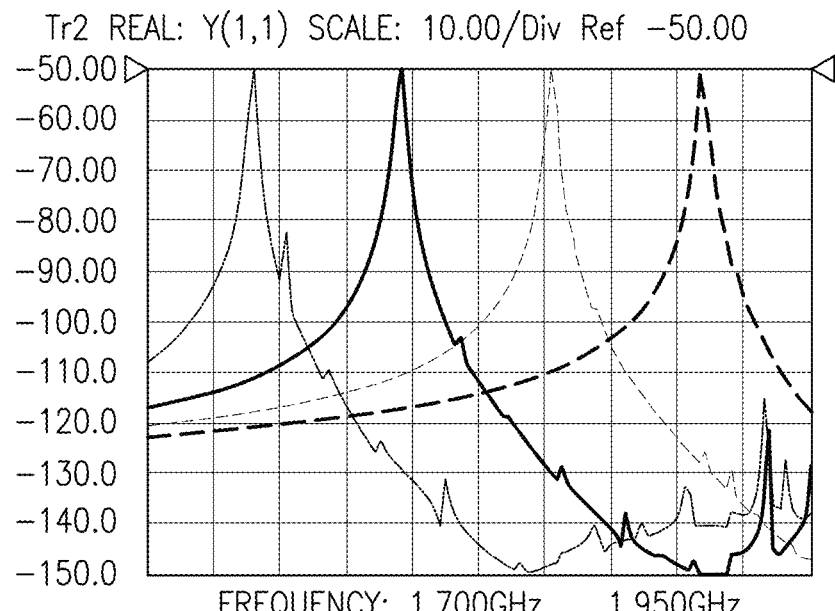
FIG.13B

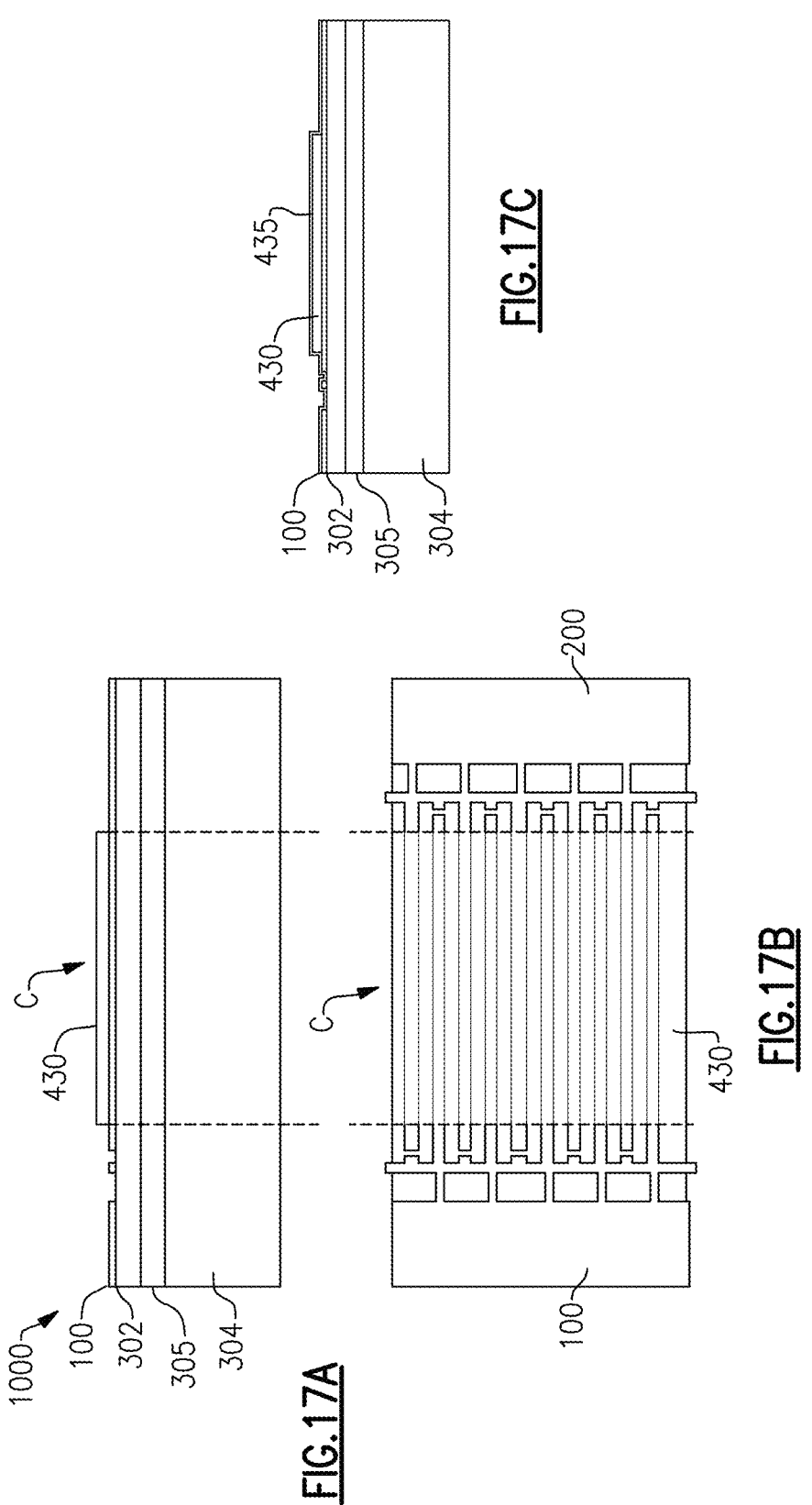

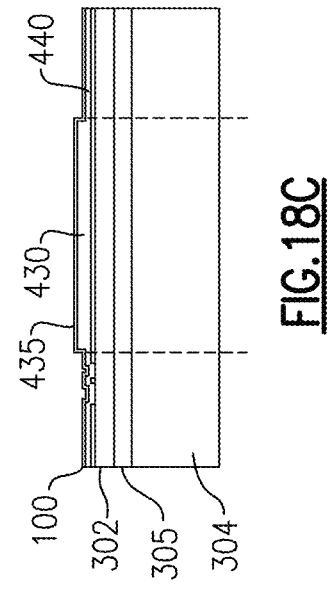
FIG.18C
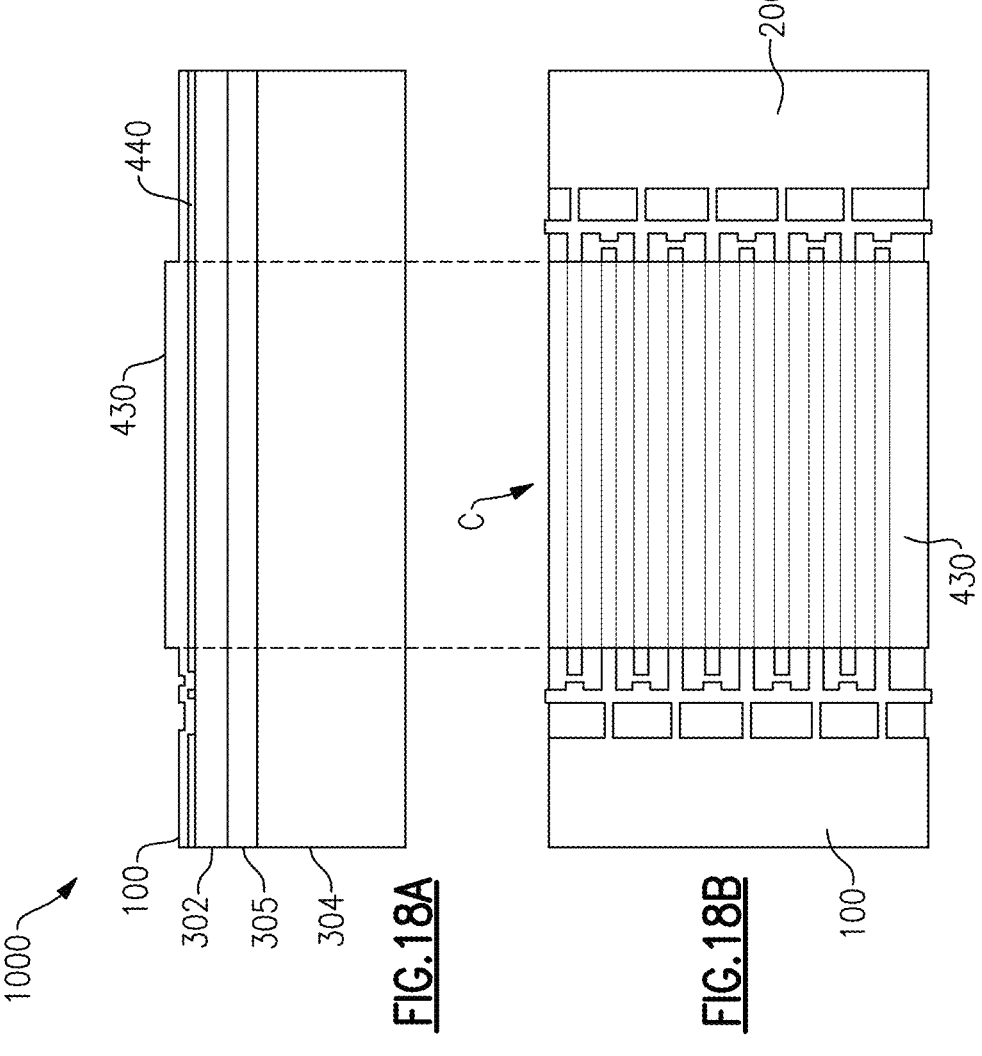
FIG.18A
FIG.18B

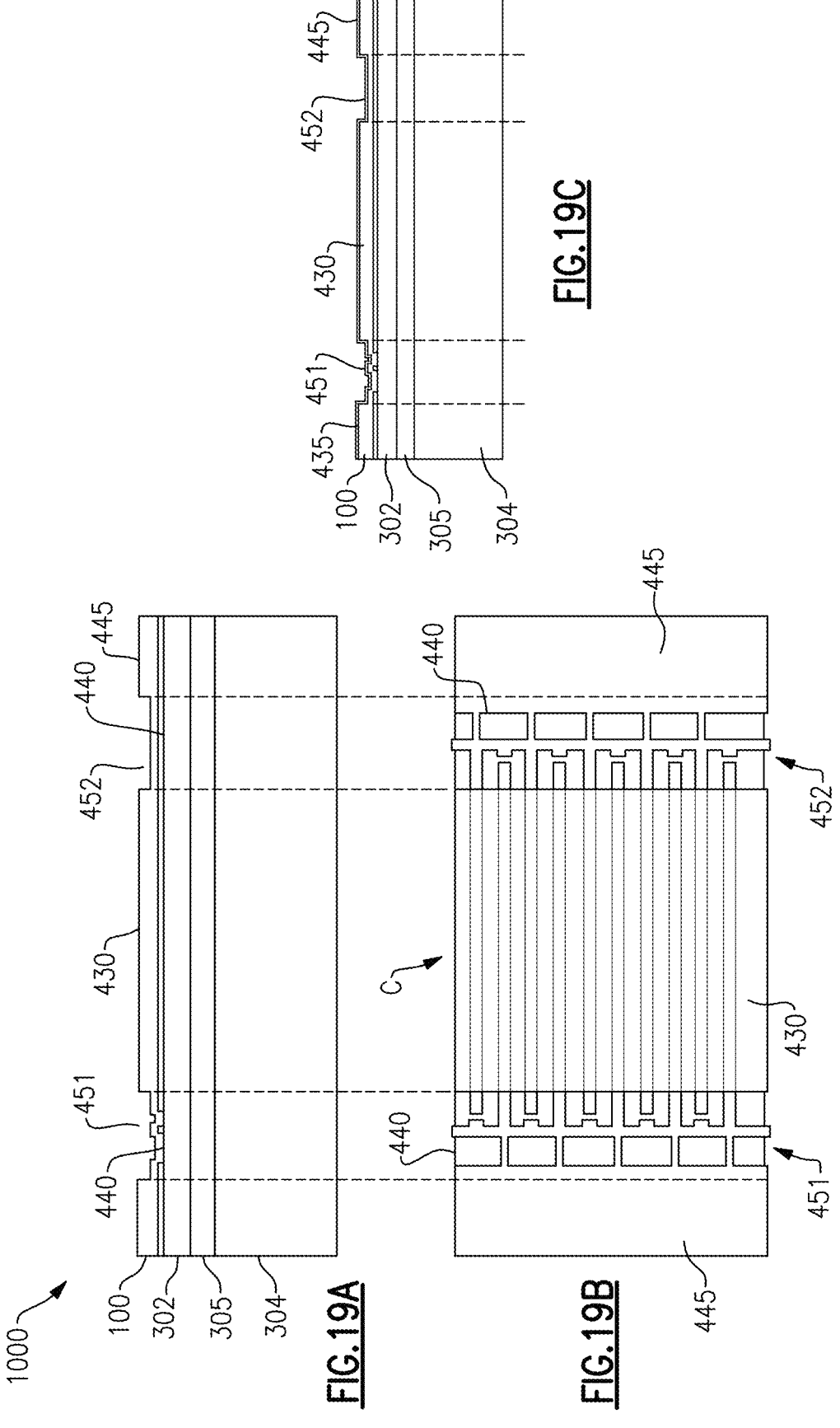

Tr3 Q: Y(1,1)  SCALE: 2.00k/Div  Ref  0.000

FREQUENCY: 1.750GHz ... 2.000GHz

NO DUMMY
DUMMY

ACOUSTIC WAVE DEVICE WITH INTERDIGITAL TRANSDUCER ELECTRODES HAVING TWO BUS BARS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices, and more particularly to acoustic wave devices with interdigital transducer electrodes and two bus bars. Specifically, the acoustic wave device may be an acoustic wave filter.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

SUMMARY

The innovations described in the claims each have several aspects, no single one of which is solely responsible for its desirable attributes. Without limiting the scope of the claims, some prominent features of this disclosure will now be briefly described. In general, one objective of the present invention is the improvement of the Q factor (quality factor) of acoustic wave devices.

In accordance with one aspect of the disclosure, an acoustic wave device is provided, which preferably is configured as an acoustic wave filter such as a surface acoustic wave (SAW) filter or a bulk acoustic wave (BAW) filter. In some embodiments, the acoustic wave device comprises a layer of piezoelectric material and two interdigital transducer electrodes disposed on an upper surface of the layer of piezoelectric material. Each interdigital transducer electrode may include a first bus bar and a second bus bar arranged in parallel to the first bus bar having a smaller width than the first bus bar. Each interdigital transducer, IDT, electrode may further comprise a plurality of electrode fingers extending from the second bus bar towards the respective other interdigital transducer electrode. The electrode fingers of the two interdigital transducer electrodes may be interleaved. The second bus bar of each interdigital transducer electrode may be connected with the first bus bar of the same interdigital transducer electrode via a plurality of bridges, each bridge extending collinearly with one of the electrode fingers of the same interdigital transducer electrode, each bridge having a width smaller than a smallest width of the electrode finger with which it is collinear.

The second bus bar may have a width smaller than the first bus bar. In this case, it may also be designated as a "mini bus bar".

Whenever here and in the following, a value range is given, for example between 0.1 L and 0.5 L, it shall be understood that this may include between about 0.1 L and about 0.5 L, as well as between exactly 0.1 L and 0.5 L, and the same for all other numerical values. The fact that for some ranges "about" may be added does not indicate that all other values are meant to be exact. The use of the letter "L" is equivalent to the use of the symbol "$\lambda$".

In some advantageous embodiments, the width of the bridge of each electrode finger is between 50% and 80% of the width of the central portion of that electrode finger.

In some advantageous embodiments, the width of the bridge of each electrode finger is between 60% and 75% of the width of the central portion of that electrode finger.

In some advantageous embodiments, the width of the bridge of each electrode finger is about 70% of the width of the central portion of that electrode finger.

In some advantageous embodiments, the electrode finger is composed mainly of a central portion and further comprises at least one flared portion having a greater width than the central portion.

In some advantageous embodiments, the at least one flared portion has a length of between 0.5 L and 2 L, L being the periodic distance between two electrode fingers of the same electrode.

In some advantageous embodiments, each electrode finger comprises a proximal flared portion, which is closer to the second bus bar from which that electrode finger extends than the central portion of that electrode finger.

In some advantageous embodiments, each electrode finger comprises an intermediate portion between the second bus bar and the proximal flared portion, the intermediate portion being of the same width as the central portion of that electrode finger.

In some advantageous embodiments, each electrode finger comprises a distal flared portion at its distal end facing the other interdigital transducer electrode.

In some advantageous embodiments, each second bus bar of each of the interdigital transducer electrode comprises a dummy electrode finger extending from the second bus bar towards a corresponding one of the flared portions at the distal ends of the electrode fingers of the other interdigital transducer electrode.

In some advantageous embodiments, a gap between each dummy electrode finger and the corresponding flared portion it faces is smaller than the gap between the first bus bar and the second bus bar.

In some advantageous embodiments, the width of each of the dummy electrode fingers is smaller than the width of the corresponding flared portion of the electrode finger it faces.

In some advantageous embodiments, the length of the dummy electrode finger is between 0.05 L and 0.25 L, L being the periodic distance between two electrode fingers of the same electrode.

In some advantageous embodiments, the length of the dummy electrode finger is between 0.10 L and 0.20 L.

In some advantageous embodiments, the length of each dummy electrode finger is between 0.05 and 0.25 times the length of the flared portion it faces.

In some advantageous embodiments, the length of each dummy electrode finger is between 0.1 and 0.2 times the length of the flared portion it faces.

In some advantageous embodiments, the gap between the dummy electrode finger of one electrode and the corresponding electrode finger of the other electrode is smaller than the length of the respective dummy electrode finger.

In some advantageous embodiments, the width of each dummy electrode finger is between 0.15 L and 0.25 L.

In some advantageous embodiments, the gap between each dummy electrode finger and the corresponding flared portion it faces is between 0.05 L and 0.15 L.

In some advantageous embodiments, the gap between each dummy electrode finger and the corresponding flared portion it faces is between 0.05 and 0.15 times the width of the adjacent flared portion.

In some advantageous embodiments, a gap between the first bus bar and the second bus bar is between 0.3 L and 1.0 L.

In some advantageous embodiments, the width of the second bus bar is between 0.05 L and 0.25 L.

In some advantageous embodiments, the width of the second bus bar is between 0.10 L and 0.15 L.

In some advantageous embodiments, a gap between the dummy electrode finger of one electrode and the electrode finger of the other electrode, and a gap between the first and the second bus bar have respective sizes within 10% of each other.

In some advantageous embodiments, the first bus bars, the second bus bars, and all of the electrode fingers have the same dimensions with respect to both IDTEs.

In some advantageous embodiments, a first silicon-comprising structure is arranged over a first area of the interdigital transducer electrodes where the electrode fingers of the two electrodes are interwoven.

In some advantageous embodiments, a second silicon-comprising structure is arranged over a second area of one or both of the interdigital transducer electrodes, the second area comprising at least the second bus bar, the dummy electrode fingers, and at least a part of the first bus bar.

In some advantageous embodiments, the second silicon-comprising structure completely covers the first bus bar.

In some advantageous embodiments, the second silicon-comprising structure has a smaller thickness than the first silicon-comprising structure.

In some advantageous embodiments, the second silicon-comprising structure has a width, in a direction parallel to the electrode fingers, of between 0.75 L and 1.0 L, and/or a depth between 0.007 L and 0.015 L.

In some advantageous embodiments, a third silicon-comprising structure is arranged over the parts of the first bus bar not covered by the second silicon-comprising structure.

In some advantageous embodiments, the third silicon-comprising structure has a larger thickness than the second silicon-comprising structure.

In some advantageous embodiments, the first silicon-comprising structure, the second silicon-comprising structure and/or the third silicon-comprising structure comprise, or consist of, silicon nitride.

In some advantageous embodiments, the first silicon-comprising structure, the second silicon-comprising structure and/or the third silicon-comprising structure are covered by a protective layer.

In some advantageous embodiments, at least one trench is formed in the piezoelectric layer, the trench being arranged in parallel to the first and second bus bars, the at least one trench causing the surface of the piezoelectric layer to be lower between the electrode fingers compared to areas without the at least one trench.

In some advantageous embodiments, two parallel trenches are formed, each trench being formed in a respective region of the distal ends of one of the interdigital transducers electrodes.

In some advantageous embodiments, the at least one trench has a depth of between 0.001 L and 0.01 L.

In some advantageous embodiments, the interdigital transducer electrodes are formed in at least a first and a second IDT electrode layers having different densities.

In some advantageous embodiments, the first IDT electrode layer contacts the piezoelectric layer and comprises molybdenum.

In some advantageous embodiments, the second IDT electrode layer is disposed on the other side of the first IDT electrode layer as the piezoelectric layer, and comprises aluminum, copper, magnesium, tungsten, titanium, platinum and/or ruthenium.

In some advantageous embodiments, an edge portion of the second bus bar on the opposite side of each dummy electrode finger is recessed with respect to the edge of the second bus bar.

In some advantageous embodiments, the recessed edge portion results from a clip-out area being left out of the second bus bar.

In some advantageous embodiments, the clip-out area has a triangular shape.

In some advantageous embodiments, the clip-out area has a generally oblong shape.

In some advantageous embodiments, the clip-out area has an oblong shape with rounded corners.

In some advantageous embodiments, the recessed edge portion results from a section of the second bus bar being deformed in the area of the at least one dummy electrode finger.

In accordance with another aspect of the disclosure, a radio frequency module comprising the acoustic wave device of the present invention is provided.

In accordance with still another aspect of the disclosure, a wireless communication device comprising the acoustic wave device of the present invention is provided, preferably also comprising the radio frequency module of the present invention.

BRIEF DESCRIPTION OF THE DRAWINGS

Embodiments of this disclosure will now be described, by way of non-limiting example, with reference to the accompanying drawings.

FIGS. 9A-9K are graphs illustrating the effect of the design of the second bus bar on the frequency response of the acoustic wave device according to embodiments.

FIGS. 11A-11E show a variant of the structure of the acoustic wave device of embodiments, with a trench formed in the piezoelectric layer.

FIGS. 12A-12C are graphs illustrating the effect of different configurations on the frequency response of the acoustic wave device according to embodiments.

FIGS. 13A-13C are graphs illustrating the effect of different ratios of thicknesses of the two IDT layers on the frequency response of the acoustic wave device according to embodiments.

FIG. 17A-17C illustrate another variant of the design of any of FIG. 1, FIG. 2A, FIG. 2B, and FIG. 11A-11E, wherein at least one silicon-comprising structure covers at least part of the IDT electrodes.

FIG. 18A-18C illustrate another variant of the design of FIG. 17A according to embodiments.

FIG. 19A-19C illustrate yet another variant of the design of FIG. 17A according to embodiments.

DETAILED DESCRIPTION

Figure 1:
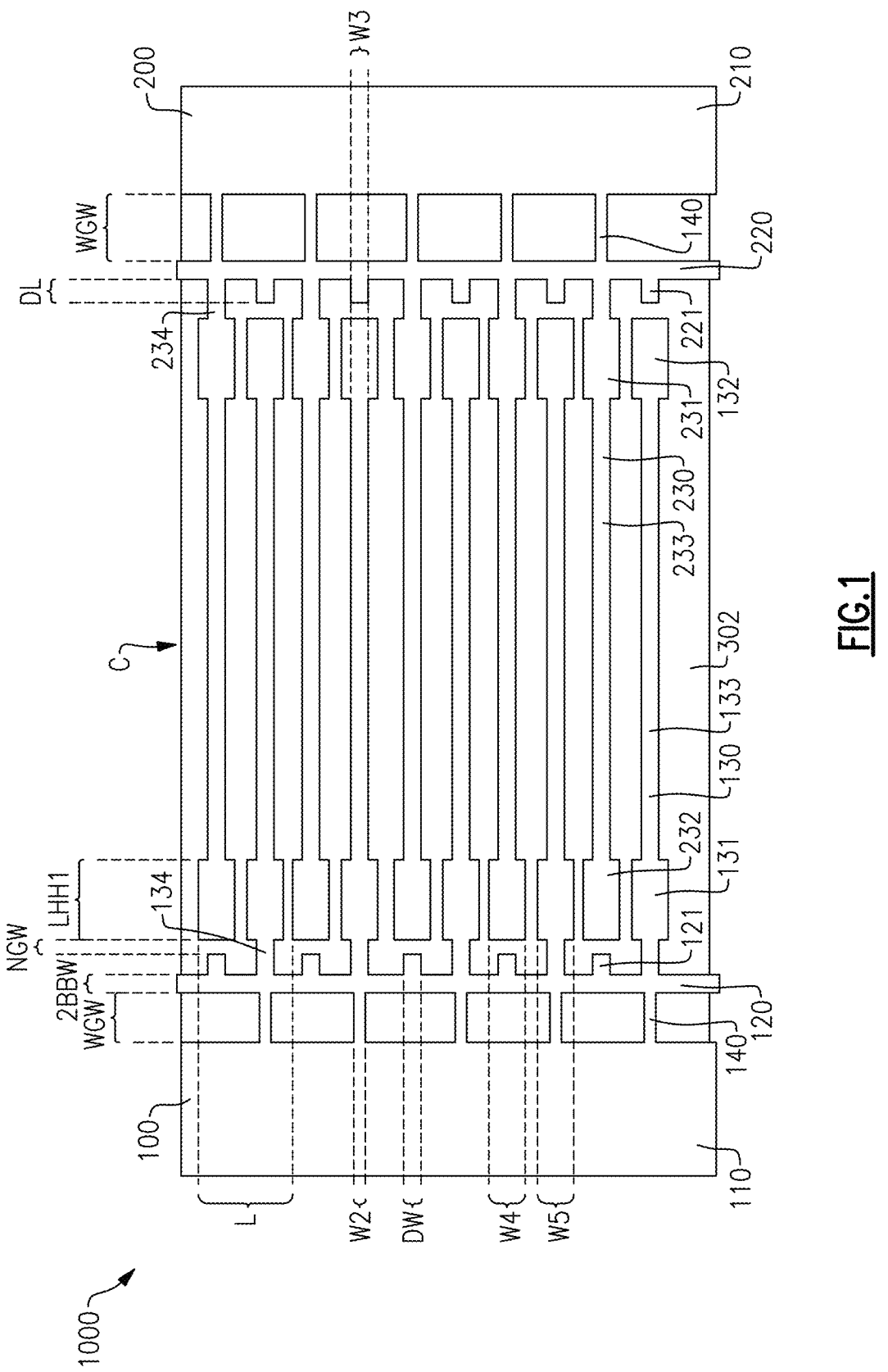
FIG. 1 illustrates a top plan view of an acoustic wave device according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) resonators or devices. The speed at which an acoustic wave will propagate within a SAW resonator is a function of a variety of factors, including the thicknesses of the various components and the density of the materials used to form the various components.

A plurality of resonators may be formed on a single wafer, including filter components of different types. For example, a single wafer may include one or more SAW filters, in addition to one or more SAW resonators. These components may have different design, but may share common manufacturing steps, and may therefore share common constituent layers. The geometrical details of the IDTs, in particular the lengths and widths of metallic structures or gaps there between, have been found to be highly relevant for the quality of the acoustic wave device. In the following, details of the findings of the inventor will be described.

FIG. 1 illustrates a top plan view of a surface acoustic wave (SAW) resonator or acoustic wave device 1000 including a first interdigital transducer electrode (IDT) 100 and a second IDT 200. The illustrated SAW resonator or acoustic wave device 1000 includes a piezoelectric layer 302. In some embodiments, the piezoelectric layer 302 may include a material such as lithium tantalate (LT for short, chemical symbol $LiTaO_3$) or lithium niobate (LN for short, chemical symbol $LiNbO_3$), although other suitable materials may also be used.

Figure 2A:
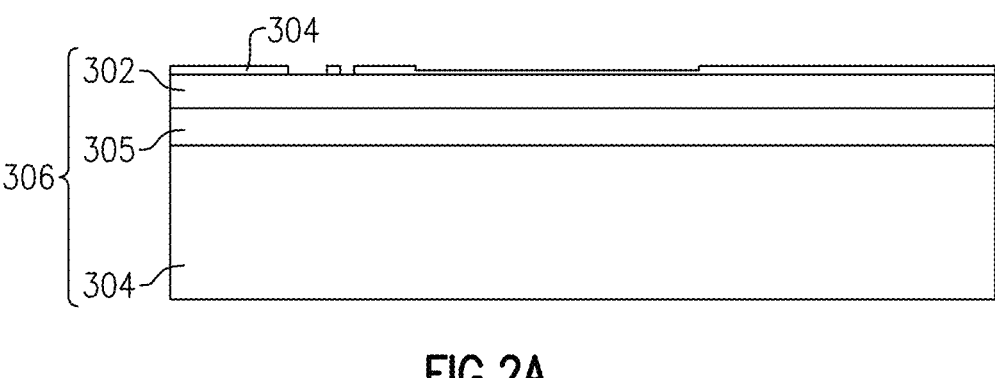
FIG. 2A and FIG. 2B show cross-sections illustrating two different designs for the acoustic wave device according to embodiments.

FIG. 2A illustrates a cross section of the acoustic wave device 100 of FIG. 1. The SAW resonator or acoustic wave device 1000 includes a multilayer piezoelectric substrate 306, including a support substrate 304 and an additional layer 305 (e.g., functional layer) in addition to the piezoelectric substrate 302, with the additional layer 305 interposed between the support substrate 304 and the piezoelectric layer 302. The support substrate 304 may include silicon (Si) in some embodiments, although other suitable materials with high acoustic impedance may also be used, including but not limited to sapphire, aluminum oxide ($Al_2O_3$), aluminum nitride (AlN), quartz or ceramic materials. Although the multilayer piezoelectric substrate 306 is illustrated as including three layers, in other implementations (e.g., where quartz is used as the support substrate 304), the multilayer piezoelectric substrate 306 can instead have two layers.

The additional layer 305 (e.g., functional layer) can be a low impedance layer that has a lower acoustic impedance than the support substrate 304. In some implementations, the additional layer 305 can include a silicon dioxide ($SiO_2$) layer. The additional layer 305 can increase adhesion between the support substrate 304 and the piezoelectric layer 302 of the multilayer piezoelectric substrate 306. Alternatively or additionally, the additional layer 305 can increase heat dissipation or temperature compensation in the SAW device 100 relative to a SAW device without the additional layer 305.

As an example of the structure of FIG. 2A, the additional layer 305 consists of silicon dioxide, $SiO_2$, and the support substrate 304 consists of crystalline silicon, sapphire, aluminum nitride, silicon nitride, or silicon carbide.

Figure 2B:
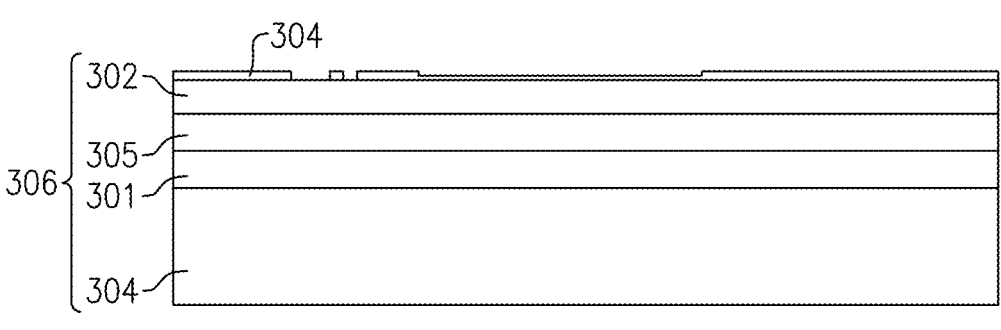

FIG. 2B illustrates an alternative design which may be combined with any of the other variants and embodiments herein without prejudice. In that design, an intermediate layer 301 is interposed between the additional layer 305 and the support substrate 304. As an example of this alternative design, the additional layer 305 consists of silicon dioxide, $SiO_2$, the intermediate layer 301 consists of poly-silicon or amorphous silicon, and the support substrate 304 consists of crystalline silicon. The additional layer 305 may alternatively consist of AlN, SiN, Poly-Si or amorphous Si. The additional layer 305 can improve the quality factor Q by reducing a parasitic surface conductivity, PSC, on the crystalline Si of the support substrate 304. In particular an additional layer 305 of Poly-Si or amorphous Si work as a trap-rich layer to prevent the PSC on the surface of the crystalline Si of the support substrate 304. The piezoelectric layer 302 may have a thickness of between 0.1 L and 1.0 L, the additional layer 305 of silicon dioxide may have a thickness of between 0.1 L and 1.0 L, the support substrate 304 (comprising, or consisting of, a high impedance layer such as silicon, aluminum nitride, silicon carbide, silicon nitride, or sapphire) may have a thickness of between 0.7 micrometers and 600 micrometers.

In the following, the IDT electrodes 100, 200 will be described in more detail. In principle they may be designed different from one another, although preferably they will be of the essentially (or exactly) same shape, albeit in a mirrored and shifted position. Therefore, in the following, for ease of understanding and reading, explanations and descriptions will be made primarily with respect to the first IDT electrode 100 of the IDT electrodes 100, 200. It shall be understood that whenever any feature of the first IDT electrode 100 is described, the second IDT electrode 200 may be provided with the same features. Thus, for example, a phrase like "The first IDT electrode 100 may comprise X" should be understood to mean "One or both of the first IDT electrode 100 and the second IDT electrode 200 may comprise X". Still, at some points, when ease of reading is not impacted, nonetheless both IDT electrodes will be explicitly mentioned.

The IDT electrodes 100, 200 can include any suitable IDT electrode material. In the illustrated embodiment, the IDT electrodes 100, 200 are multi-layer IDT electrodes that include separate IDT electrode layers that impact acoustic properties (e.g., IDT layer with more dense material, such as tungsten (W) or molybdenum (Mo)) and electrical properties (e.g., IDT layer with less dense material, such as Aluminum (Al)), respectively.

The first IDE electrode 100 includes a first bus bar 110 (or: "main bus bar"), and a second bus bar 120 arranged in parallel to the first bus bar 110. This design may therefore also be designated as a double bus bar design. The second bus bar 120 preferably has a smaller width than the first bus bar 110 and may therefore also be designated as a "mini bus bar". Similarly, the second IDE electrode 200 includes a main, or first bus bar 210, and a mini, or second bus bar 220 arranged in parallel to the first bus bar 210. The second bus bars 120, 220 are arranged between the first bus bars 110, 210. Each IDT electrode 100, 200 further comprises a plurality of respective electrode fingers 130, 230, which extend perpendicularly from the each second bus bar 120, 220, towards the respective other second bus bar 220, 120, the fingers 130, 230 of each IDT electrode 100, 200 being interleaved with the fingers 230, 130, of the respective other IDT electrode 200, 100.

The second bus bar 120, 220 of each interdigital transducer electrode 100, 200 is connected with the first bus bar 110, 210 of the same interdigital transducer electrode via a plurality of bridges 140, 240, each bridge 140, 240 extending collinearly with one of the electrode fingers 130, 230 of the same IDT electrode 100, 200. In other words, the electrode fingers 130, 230 may be said to extend from the first bus bars 110, 210, traversing the respective second bus bar 120, 220 of the same IDT electrode 100, 200, wherein the portion of the electrode fingers 130, 230 between first and second bus bar of the same IDT electrode 100, 200 is designated as a bridge 140, 240. The bridges 140, 240 are "bridges" in the sense that they bridge the gap between first and second bus bar (the "bus bar gap"), respectively.

The inventor has found that the Q factor of the acoustic wave device 1000 is improved when each bridge 140, 240 has a width smaller than a smallest width of the electrode finger 130, 230 with which it is collinear. In many preferred embodiments, all of the electrode fingers 130, 230 will have the same proportions and dimensions, and all of the bridges 140, 240 will have the same proportions and dimensions, so that in those embodiments the bridges 140, 240 have a width smaller than the smallest width of the electrode fingers 130, 230.

As is also shown in FIG. 1, the width of the electrode fingers 130, 230 may be non-uniform. In particular, each electrode finger 130, 230 has a general width W3 for a central portion 133, 233, and may further comprise two flared portions 131, 132, 231, 232 at each end of the central portion 133, 233: a proximal flared portion 131, 231 proximal to the respective second bus bar 120, 220, and a distal flared portion 132, 232 distal to the respective second bus bar 120, 220 (or: proximal to the second bus bar 220, 120 of the respective other IDT electrode 200, 100). The proximal flared portion 131, 231 is connected to the respective second bus bar 120, 220 with a short intermediate portion 134, 234 of the same general width W3 as the central portion 133, 233. The distal flared portions 132, 232 may also be designated as "hammerhead portions". The width W3 may be W3=0.235 L, for example.

The proximal flared portions 131, 231 and the distal flared portions 132, 232 are thus sections of the electrode fingers 130, 230 that have a width W4 (in a direction perpendicular to the lengthwise extension of the electrode fingers) larger than the width W3 of each finger in a central region C of the IDT formed by the two IDT electrodes 100, 200. In other words, a duty factor (DF) of the IDT is greater in the edge regions of the IDT compared to the duty factor of the IDT in the central region C of the IDT.

The length LHH1 of the proximal flared portions 131, 231 and of the distal flared portions 132, 232 is set, in the embodiment of FIG. 1 and FIG. 2A, as between 1/L and 2 L, preferably LHH1=1 L=1λ, wherein L=λ is the periodic distance between two electrode fingers 130, 230 of the same electrode 100, 200.

In general, the width of the electrode fingers 130, 230 compared to the width of the spacing between the electrode fingers 130, 230 sets the duty factor (DF). Specifically, the duty factor is defined as the fraction of the IDT width spanned by the width of the IDT fingers (in the direction of propagation of the main surface acoustic wave to be generated). Increasing the width of the IDT fingers, whilst maintaining the position of the center of each IDT finger, increases the duty factor.

Further, as illustrated in FIG. 1, acoustic wave devices 1000 as disclosed herein include dummy electrode fingers 121, 221 that protrude from the second bus bars 120, 220 and which are aligned with respective electrode fingers 130, 230 of the respective other IDT electrode 100, 200. Specifically, each distal flared portion 132, 232 faces an opposing dummy electrode finger 121, 221.

As has been described in the foregoing, the inventor has found that the Q factor of the acoustic wave device 1000 is improved when the width W2 of the bridges 140, 240 is smaller than the general (or: smallest) width W3 of the electrode fingers 130, 230. Preferably, the width W2 of the bridge 140, 240 of each electrode finger 130, 230 is between about (or exactly) 50% and about (or exactly) 80% of the width W3 of the central portion 133, 233 of that electrode finger 130, 230, more preferably between about (or exactly) 60% and about (or exactly) 75% and most preferably about (or exactly) 70%.

Figure 3A:
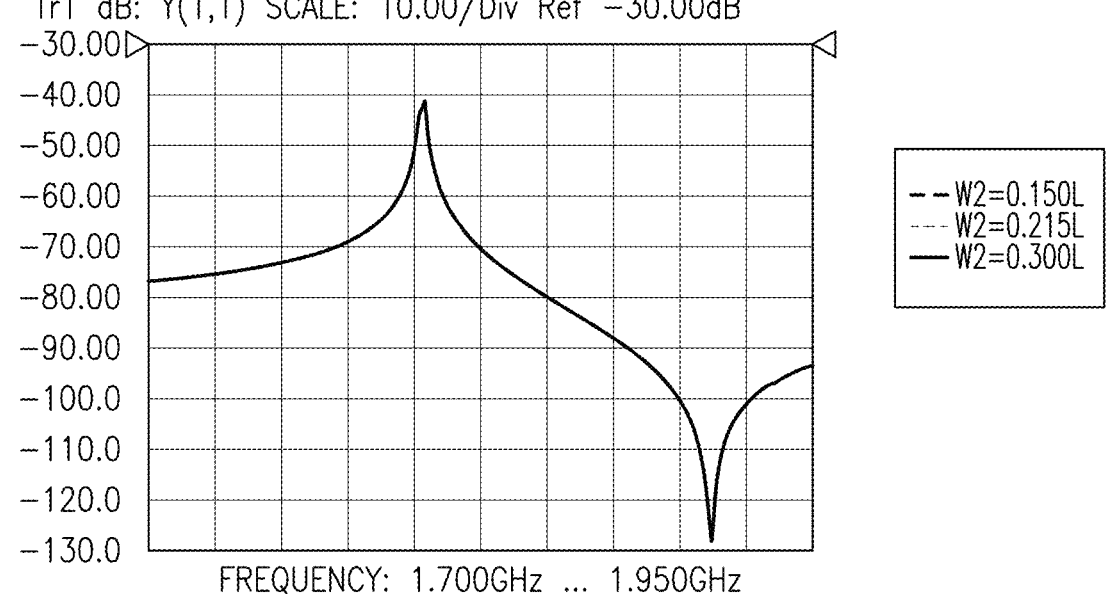
FIGS. 3A-3C are graphs of the effect of the width of the bridges on the frequency response of the acoustic wave device according to embodiments.
Figure 3B:
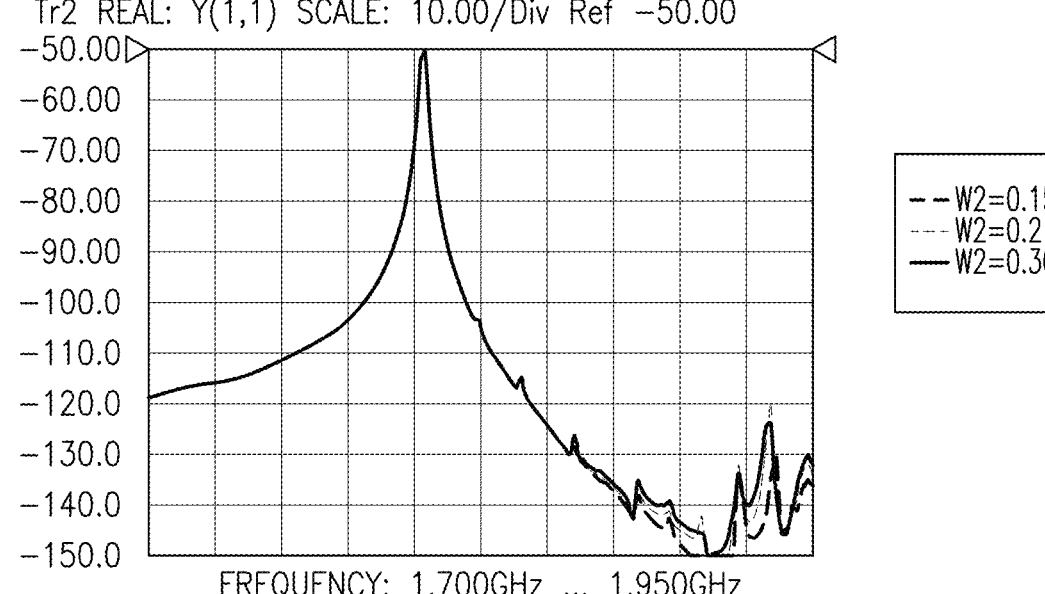
Figure 3C:
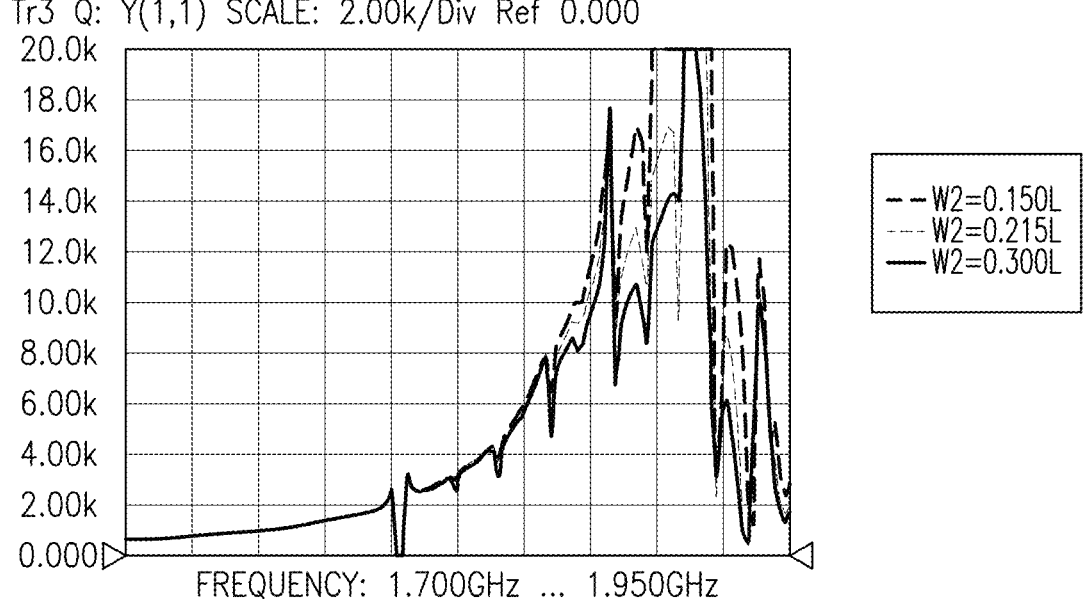

FIGS. 3A-3C are graphs of the effect of the width W2 of the bridges 140, 240 on the frequency response of the acoustic wave device 1000. The graphs indicate that, of the three, the acoustic wave device 1000 with the width W2=0.150 L (or W2=0.150λ) has the best performance.

All of FIGS. 3A-3C show on their horizontal axis a frequency range between 1.700 GHz and 1.950 GHz. FIG. 3A shows on its vertical axis the magnitude of the admittance. FIG. 3B shows on its vertical axis the real part of the admittance. FIG. 3C shows on its vertical axis the Q value.

It is to be understood that a resonator including the structure shown in FIGS. 1 and 2, as well as the other resonator structures illustrated herein would generally also include reflector electrodes (not shown). The resonator structure shown in FIGS. 1 and 2 may referred to as the reference structure (REF) herein.

In some preferred embodiments, the length DL of each dummy electrode finger 121, 221 is between 0.05 L and 0.25 L, L being the periodic distance between two electrode fingers of the same electrode, and more preferably between 0.15 L and 0.25 L, still more preferably between 0.15 L and 0.2 L, most preferably between 0.15 L and 0.175 L.

Figure 4A:
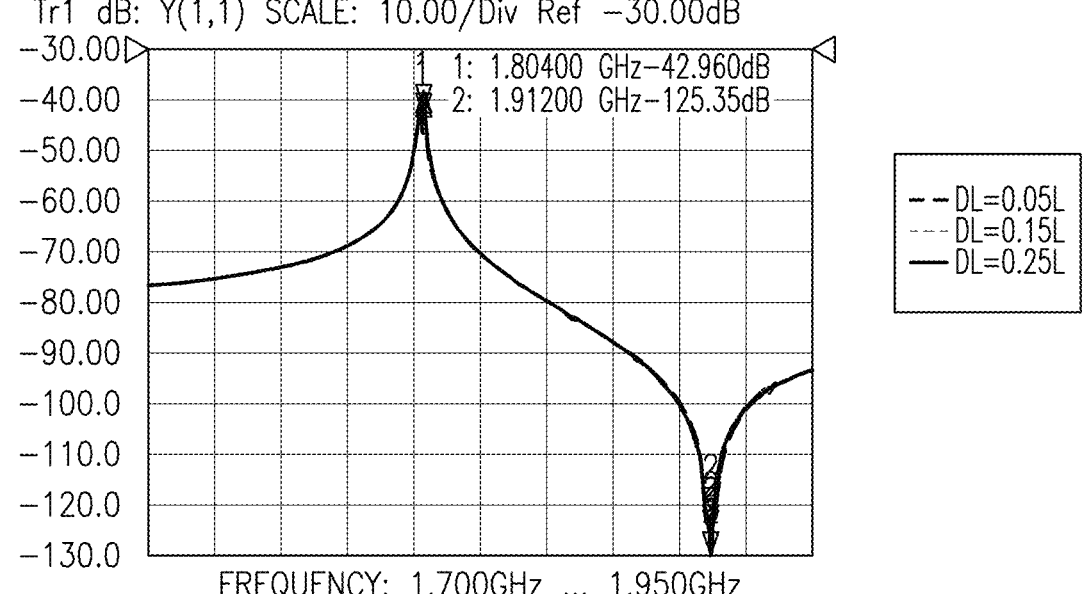
FIGS. 4A-4D are graphs illustrating the effect of the length of the dummy electrode fingers on the frequency response of the acoustic wave device according to embodiments.
Figure 4B:
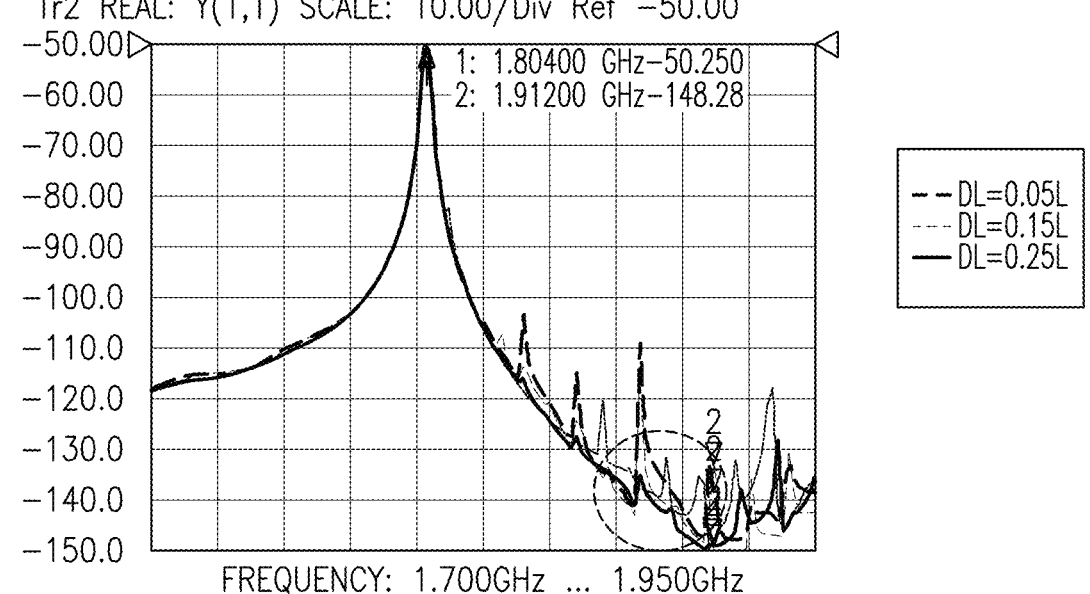
Figure 4C:
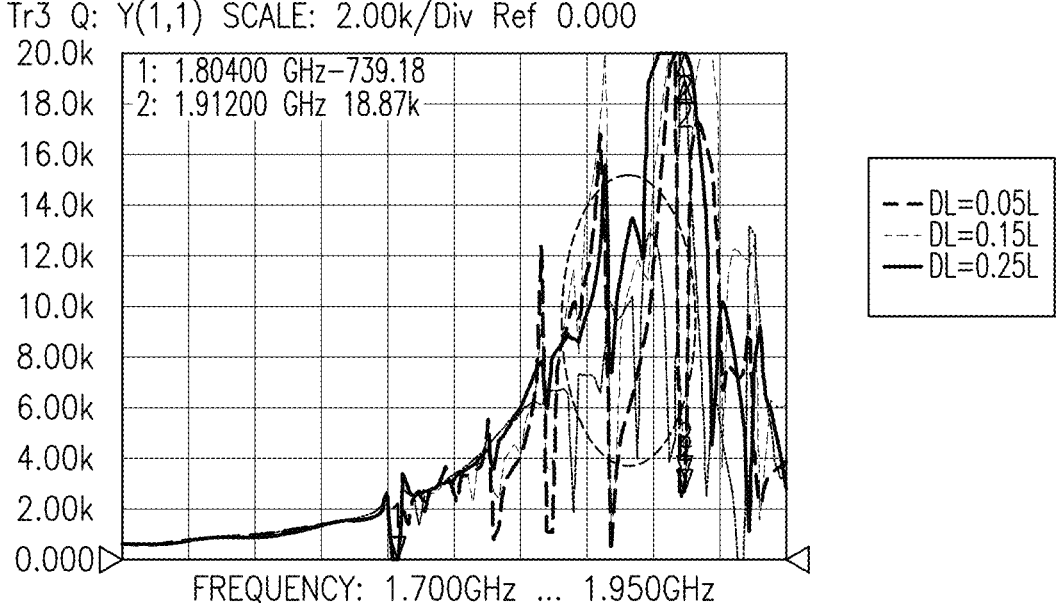
Figure 4D:
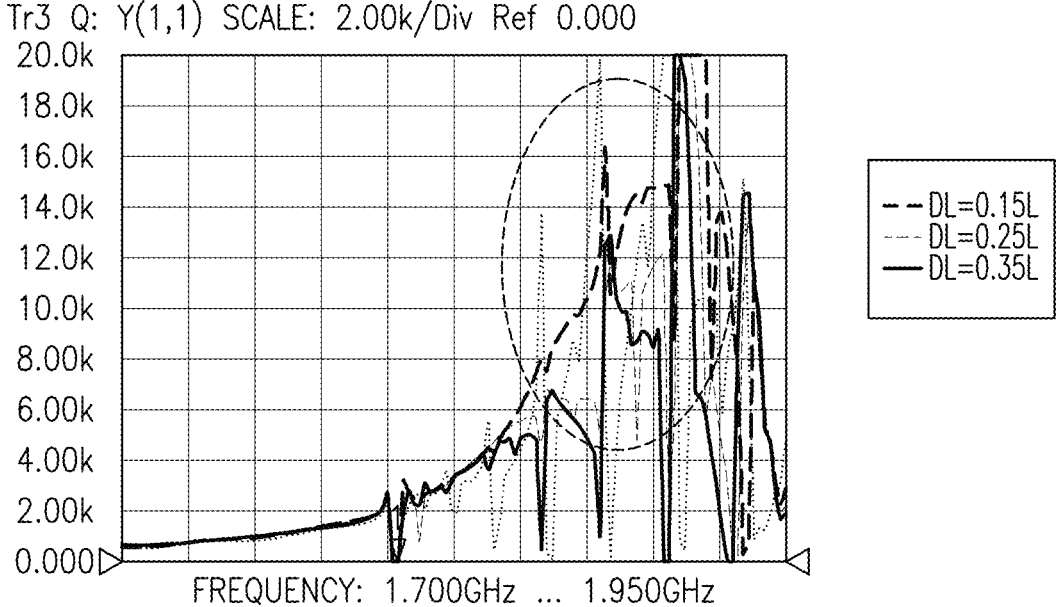

FIGS. 4A-4D are graphs illustrating the effect of the length DL ("dummy length") of the dummy electrode fingers 121, 221 on the frequency response of the acoustic wave device 1000. All of FIGS. 4A-4D show on their horizontal axis a frequency range between 1.700 GHz and 1.950 GHz. FIG. 4A shows on its vertical axis the magnitude of the admittance. FIG. 4B shows on its vertical axis the real part of the admittance. FIG. 4C and FIG. 4D show on their vertical axis the Q value.

The graphs indicate that, of the three options shown, the acoustic wave device 1000 with the length DL=0.15 L (or DL=0.15λ) has the best performance regarding the Q value. FIG. 4D shows how the Q value decreases with DL>0.25 L.

In some preferred embodiments, the width W6 of the dummy electrode fingers 121, 221 (the "dummy width") is between 0.15 L and 0.25 L, preferably about 0.2 L.

Figure 5A:
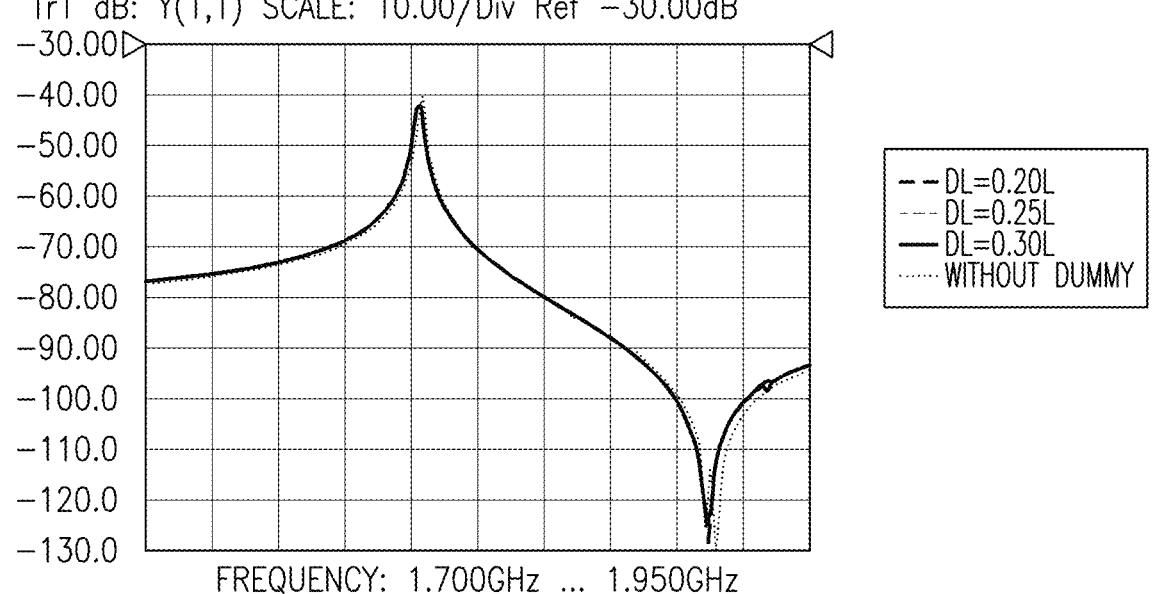
FIGS. 5A-5C are graphs illustrating the effect of the width of the dummy electrode fingers on the frequency response of the acoustic wave device according to embodiments.
Figure 5B:
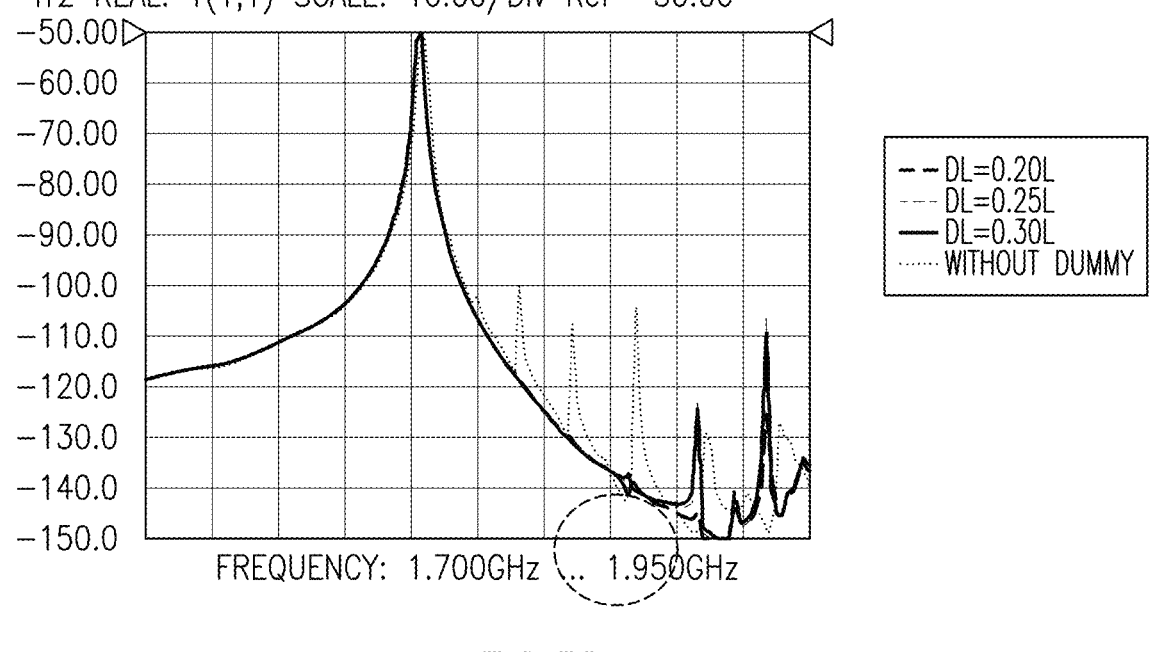
Figure 5C:
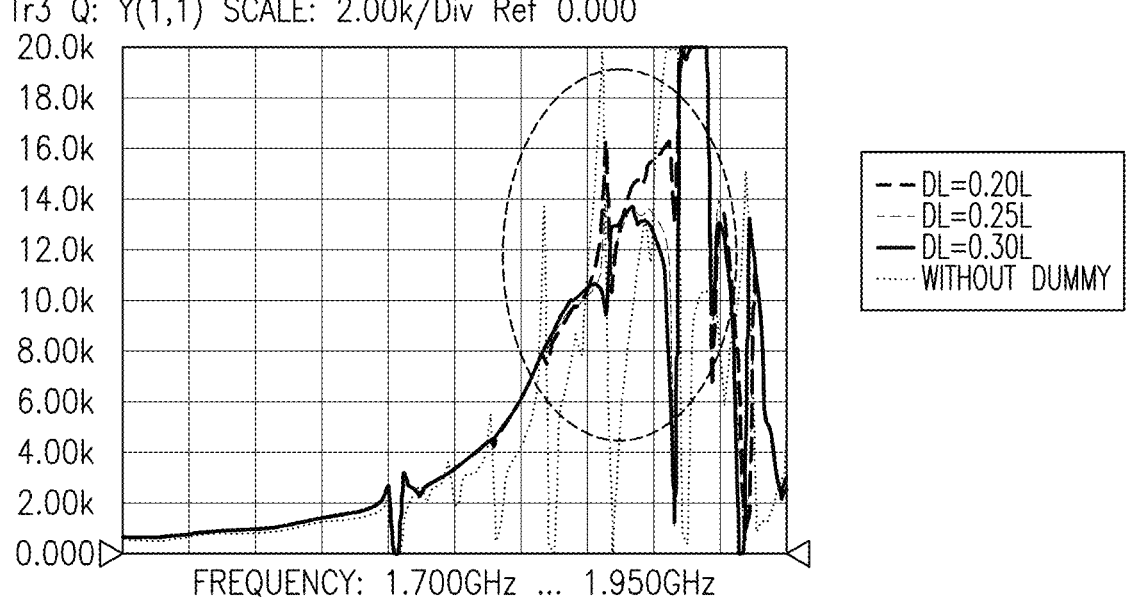

FIGS. 5A-5C are graphs illustrating the effect of the width W6 of the dummy electrode fingers 121, 221 ("dummy width") on the frequency response of the acoustic wave device 1000. All of FIGS. 5A-5C show on their horizontal axis a frequency range between 1.700 GHz and 1.950 GHz. FIG. 5A shows on its vertical axis the magnitude of the admittance. FIG. 5B shows on its vertical axis the real part of the admittance. FIG. 5C shows on its vertical axis the Q value.

The graphs indicate that, of the four variants shown, the acoustic wave device 1000 with the dummy width DW=0.20 L has the best performance regarding the Q value.

In some preferred embodiments, the width NGW of the gap between each dummy electrode finger 121, 221 and the corresponding flared portion 232, 132 it faces (the "narrow gap width") is between 0.05 L and 0.15 L, preferably between 0.1 L and 0.15 L.

Figure 6A:
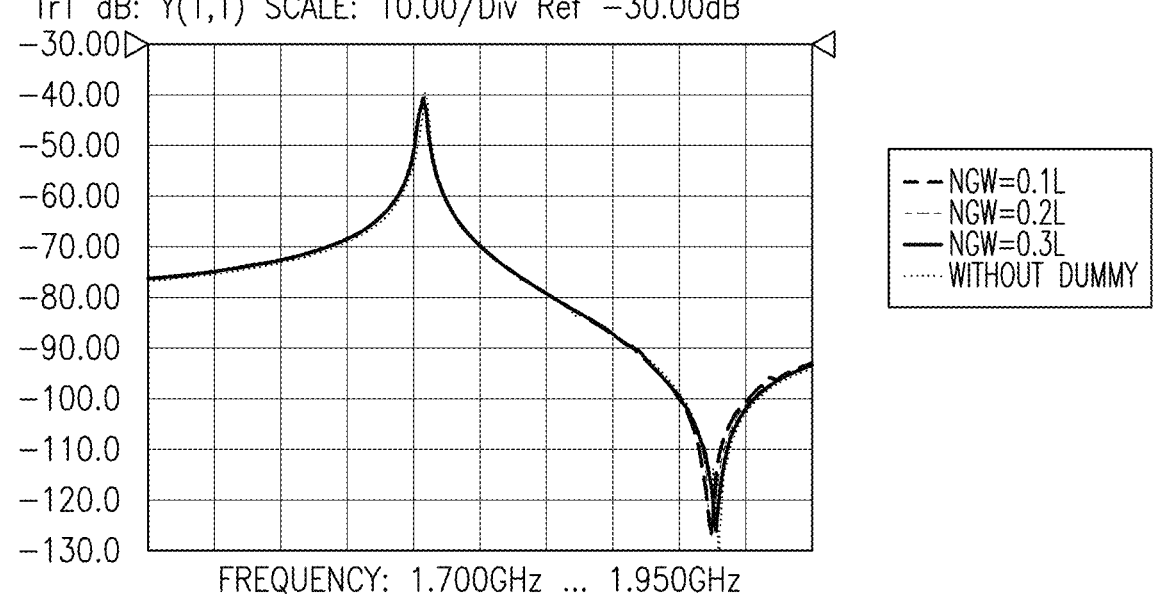
FIGS. 6A-6C are graphs illustrating the effect of the width of the gap between the dummy electrode fingers and the opposing electrode fingers on the frequency response of the acoustic wave device according to embodiments.
Figure 6B:
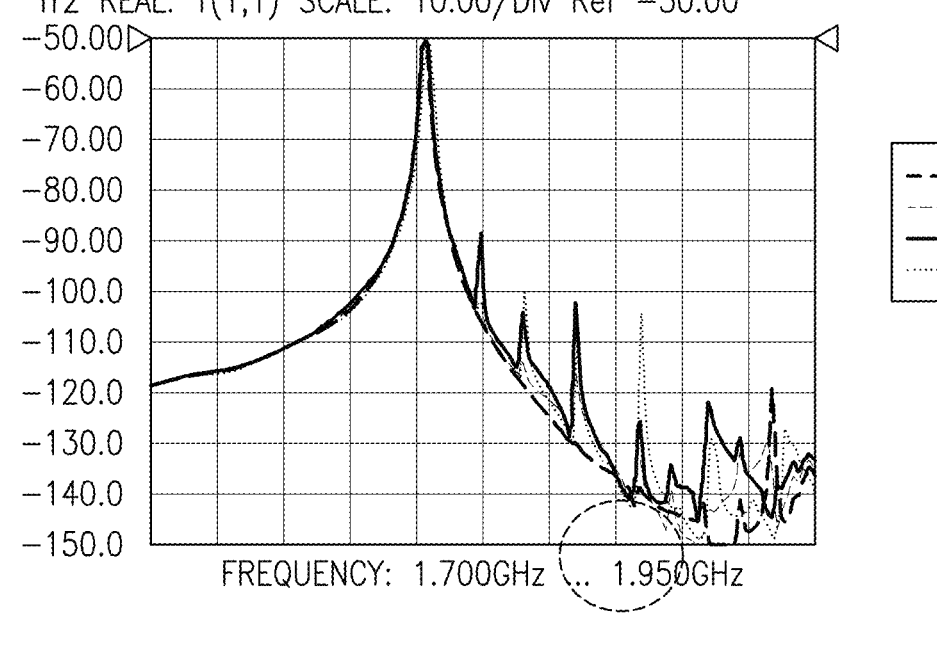
Figure 6C:
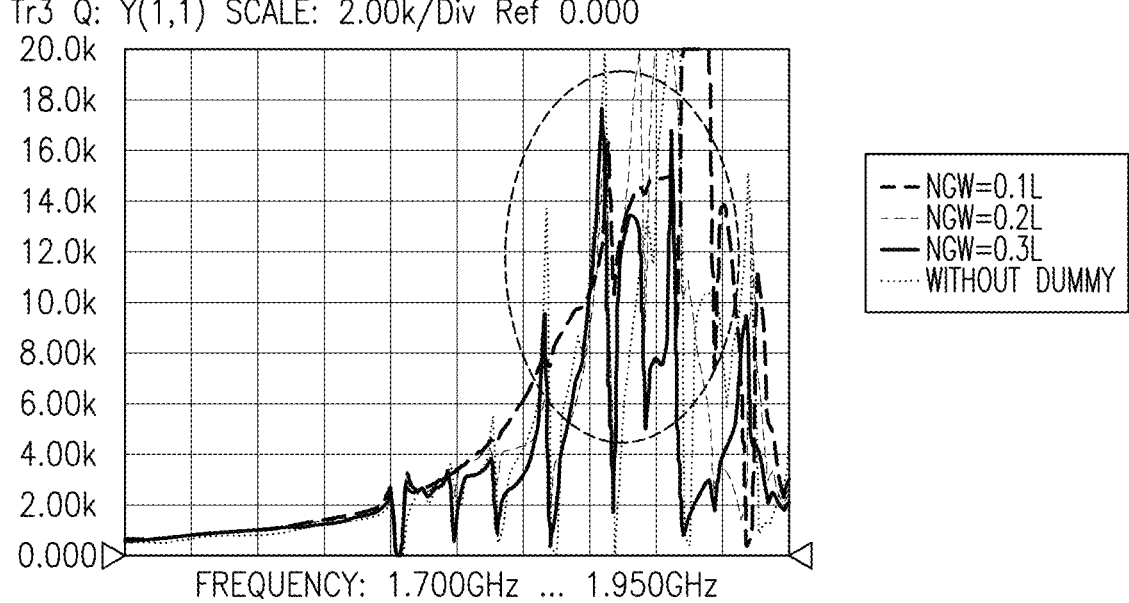

FIGS. 6A-6C are graphs illustrating the effect of the width NGW on the frequency response of the acoustic wave device 1000. All of FIGS. 6A-6C show on their horizontal axis a frequency range between 1.700 GHz and 1.950 GHz. FIG. 6A shows on its vertical axis the magnitude of the admittance. FIG. 6B shows on its vertical axis the real part of the admittance. FIG. 6C shows on its vertical axis the Q value.

The graphs indicate that, of the four options shown, the acoustic wave device 1000 with the width NGW=0.10 L (or NGW=0.10λ) and width dummy electrode fingers 121, 221 has the best performance.

In some preferred embodiments, a width WGW of a gap between the first bus bar 110, 210 and the second bus bar 120, 220 (the "wide gap width") is between 0.3 L and 1.0 L, L being the periodic distance between two electrode fingers 130, 230 of the same electrode 100, 200. More preferably, the width WGW is between 0.3 L and 0.5 L, with lower values being generally preferred as they mean a reduction in size of the acoustic wave device 1000.

Figure 7A:
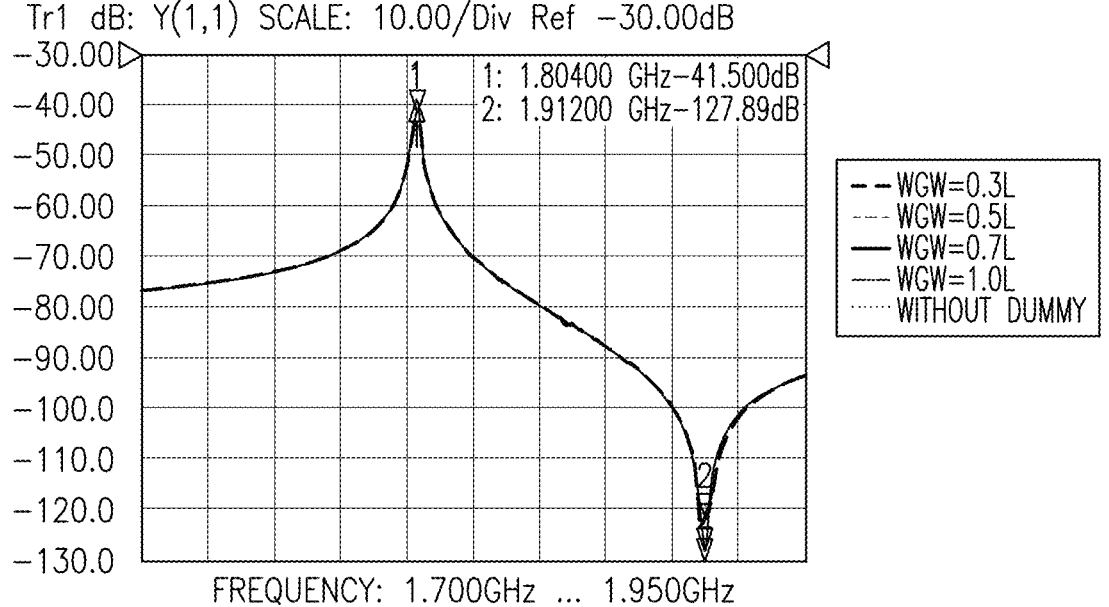
FIGS. 7A-7C are graphs illustrating the effect of the width of the gap between the first and the second bus bars on the frequency response of the acoustic wave device according to embodiments.
Figure 7B:
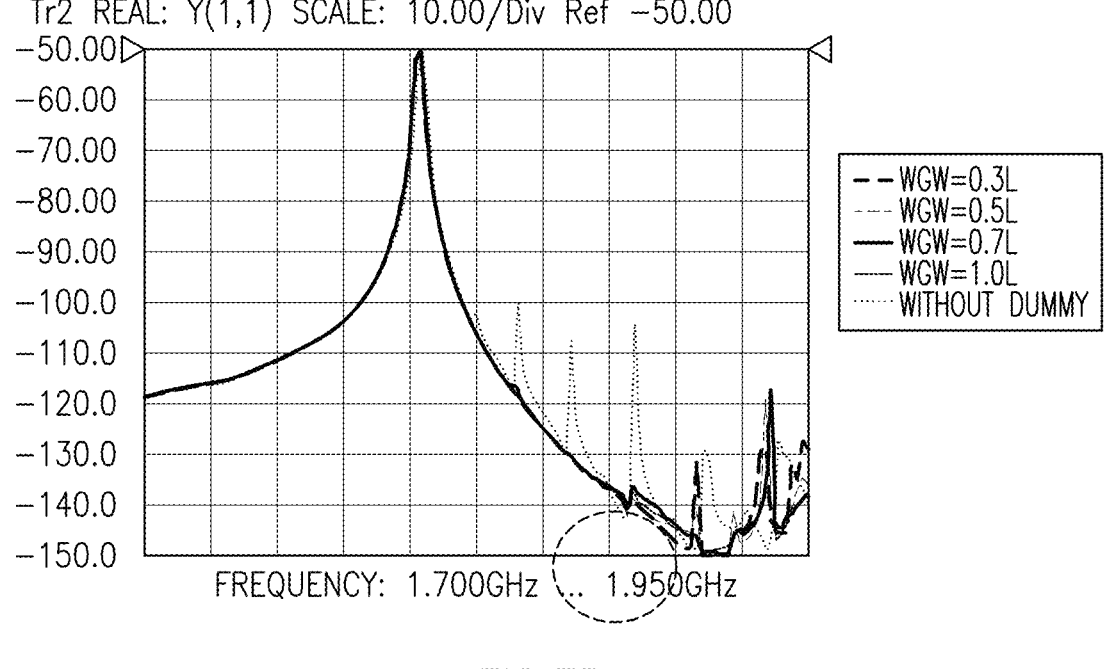
Figure 7C:
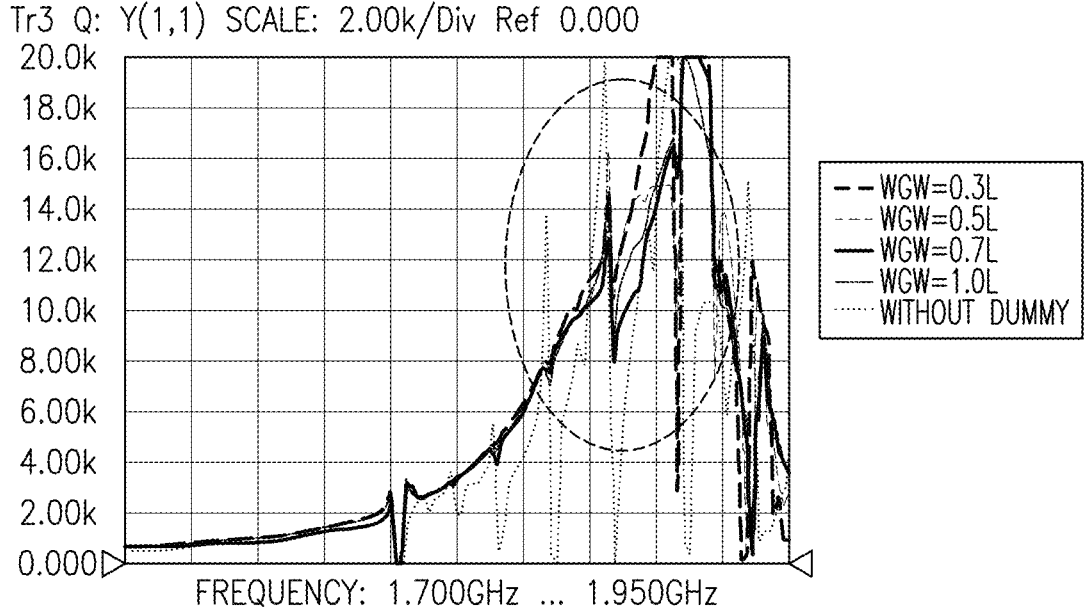

FIGS. 7A-7C are graphs illustrating the effect of the width WGW on the frequency response of the acoustic wave device 1000. All of FIGS. 7A-7C show on their horizontal axis a frequency range between 1.700 GHz and 1.950 GHz. FIG. 7 shows on its vertical axis the magnitude of the admittance. FIG. 7B shows on its vertical axis the real part of the admittance. FIG. 7C shows on its vertical axis the Q value.

The graphs indicate that, of the four options shown, all of the acoustic wave devices 1000 with the dummy electrode fingers 121, 122 have good performance regarding the Q value.

In some preferred embodiments, the width 2BBW of the second bus bar 120, 220 is between 0.05 L and 0.25 L, more preferably between 0.05 L and 0.15 L, still more preferably between 0.10 L and 0.15 L, and most preferably about 0.01 L.

Figure 8A:
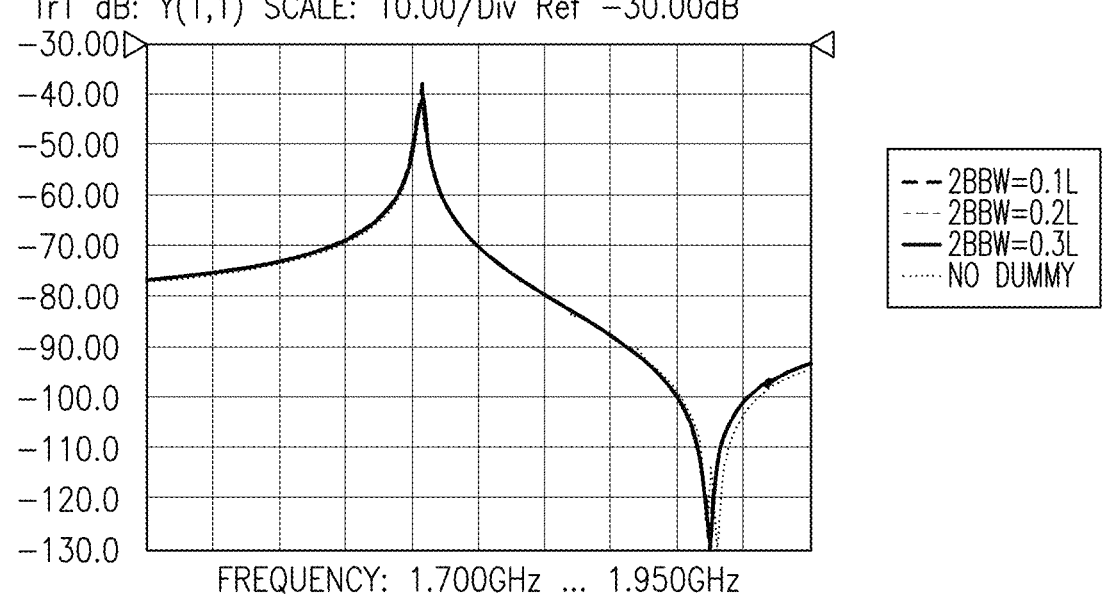
FIGS. 8A-8C are graphs illustrating the effect of the width of the second bus bar on the frequency response of the acoustic wave device according to embodiments.
Figure 8B:
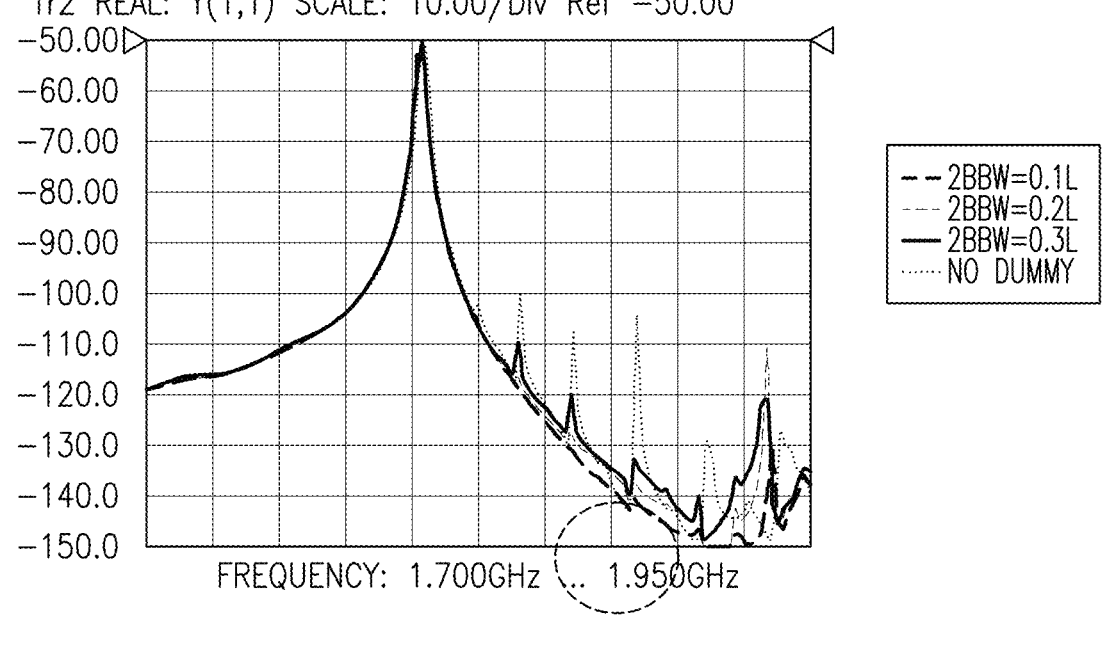
Figure 8C:
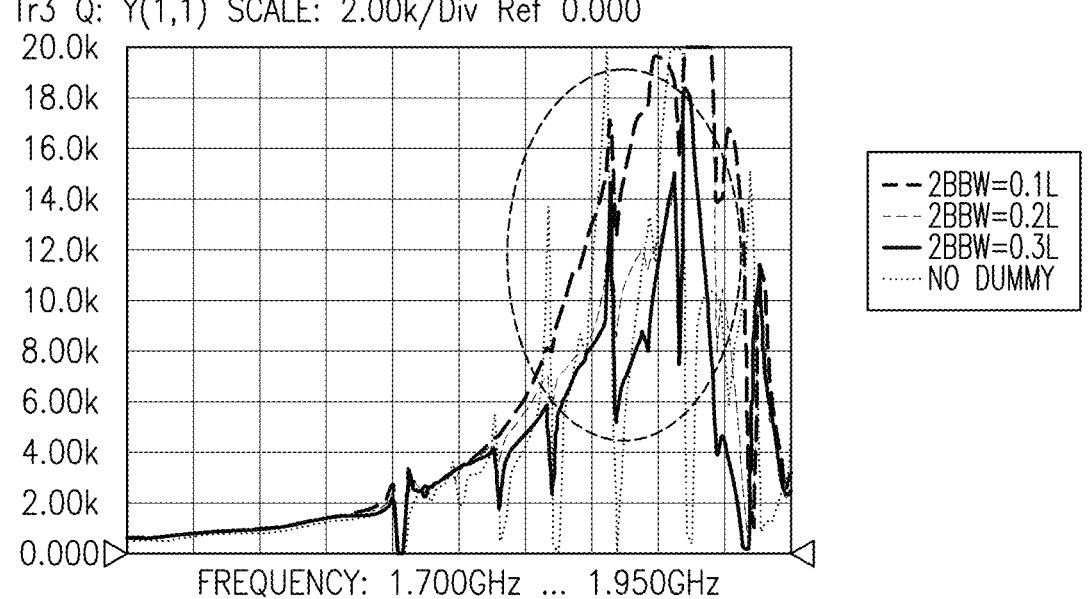

FIGS. 8A-8C are graphs illustrating the effect of the width 2BBW of the second bus bar 120, 220 on the frequency response of the acoustic wave device 1000. All of FIGS. 8A-8C show on their horizontal axis a frequency range between 1.700 GHz and 1.950 GHz. FIG. 8A shows on its vertical axis the magnitude of the admittance. FIG. 8B shows on its vertical axis the real part of the admittance. FIG. 8C shows on its vertical axis the Q value. The variant marked with "no dummy" is a variant without any dummy electrode fingers 121, 221.

The graphs in FIGS. 8A-8C indicate that, of the four options shown, the acoustic wave device 1000 with the thinnest second bus bar 120, 220, i.e. with 2BBW=0.1 L has the best performance.

The inventor has also found that a similar effect to the thinning of the second bus bar 120, 220 is achievable when the second bus bar 120, 220 has a thinner cross-section at its portions where the dummy electrode finger 121, 221 are based. In other words, in preferred embodiments, where an edge portion of the second bus bar 120, 220 on the opposite side of each dummy electrode finger 121, 221 is recessed with respect to the edge of the second bus bar 120, 220. In yet other words, it is advantageous when the back (facing the respective first bus bar 110, 210) of the second bus bar (120, 220) is trimmed.

FIGS. 9A-9K are graphs illustrating the effect of the design of the second bus bar 120, 220 on the frequency response of the acoustic wave device 1000.

Figure 9A:
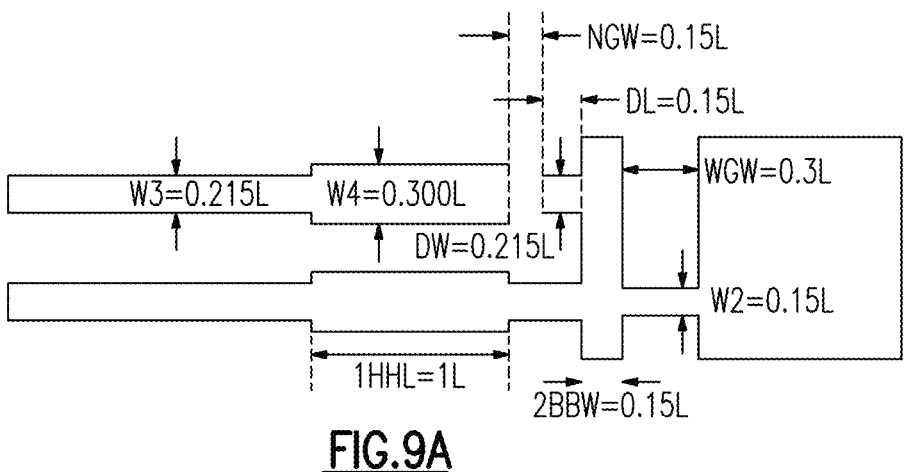

FIG. 9A shows the baseline structure for the comparisons in FIGS. 9D-9F, which is the one from FIG. 1A and FIG. 2A, with some specific values given explicitly in the following: the "narrow gap width" NGW=0.15 L, the "dummy length" DL=0.15 L, the widths of the flared portions 131, 132, 231, 232, W4=W5=0.300 L and their length 1HHL=1 L, the width W3 of the center portions 133, 233 of the electrode fingers 130, 230 W3=0.215 L, the "dummy width"

DW=0.215 L, the width W2 of the bridges 140, 240 W2=0.15 L, the "wide gap width" WGW=0.3 L, and the width 2BBW of the second bus bar 120, 2BBW=0.15 L.

Figure 9B:
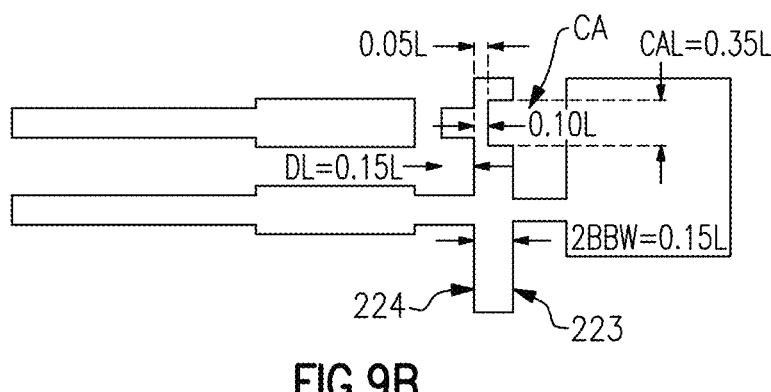

FIG. 9B shows essentially the same design as FIG. 9A, but with recessed edge portions in the second bus bar 220, which are in form of a rectangular clip-out area CA in an edge 223 of the second bus bar 220 which is opposite an edge 224 of the second bus bar 220 from which the dummy electrode fingers 221 project. The clip-out area CA causes the width 2BBW of the second bus bar 220 to be locally reduced from 2BBW=0.15 L down to 0.05 L. In the longitudinal direction of the second bus bar 220, the clip-out area CA may extend for 0.35 L and may be centered around a respective dummy electrode finger 221.

Generally speaking, the rectangular clip-out area CA may have a length CAL (along the longitudinal direction of the second bus bar 220) that is larger than the width DW of the dummy electrode fingers 221, in particular between 50% and 70% larger, preferably between 60% and 65% larger (here, with DW=0.215 L and CAL=0.35 L, about 63%). The rectangular clip-out CA area may also have a width CAW (in parallel with the extension of the electrode fingers 130, 230) that is smaller than the length DL of the dummy electrode fingers 221, in particular between 30% and 40% smaller, preferably between 35% and 40% smaller (here, with DL=0.15 L and CAW=0.1, about 33% smaller).

Figure 9C:
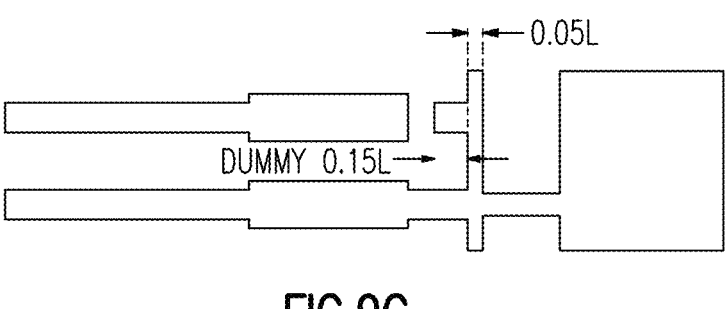

FIG. 9C shows, for comparison, a design without any recessed portions, but a smaller width 2BBW of the second bus bar 220 of 2BBW=0.05 L.

Figure 9D:
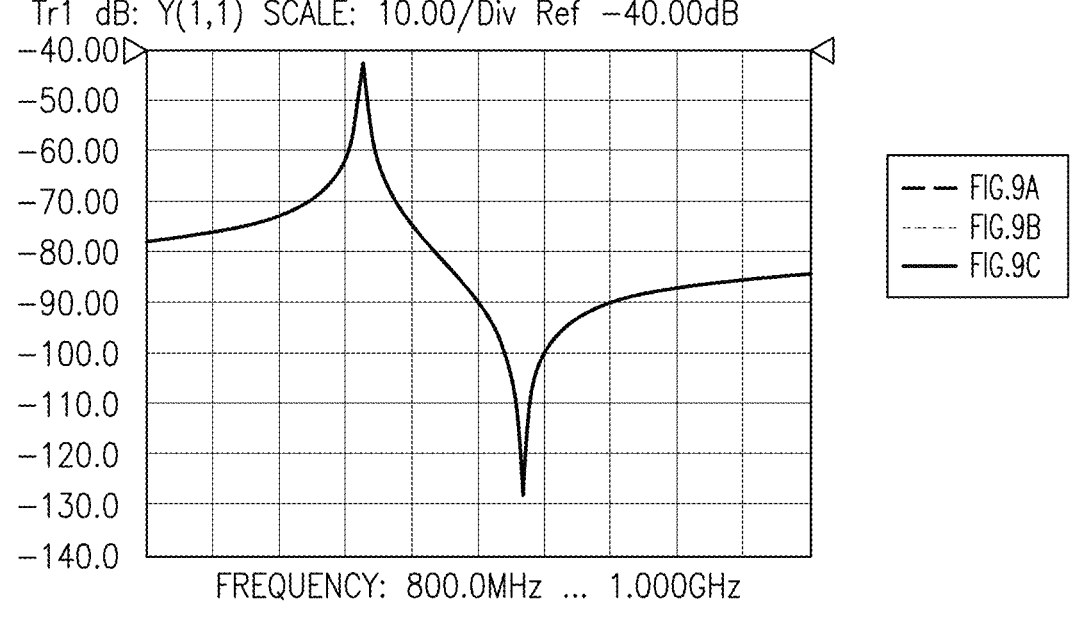
Figure 9E:
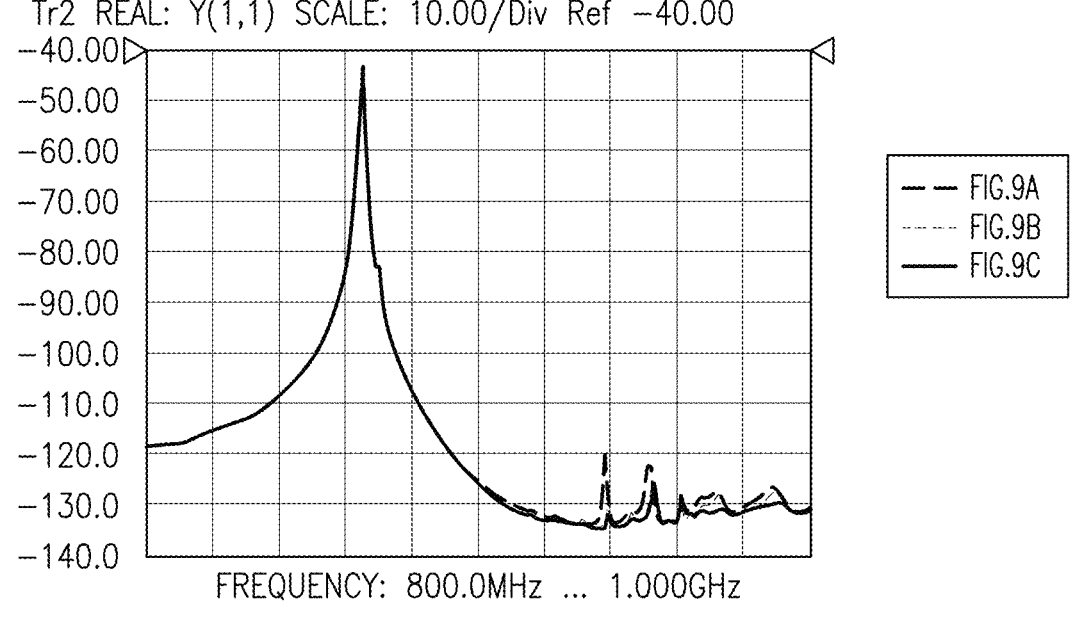
Figure 9F:
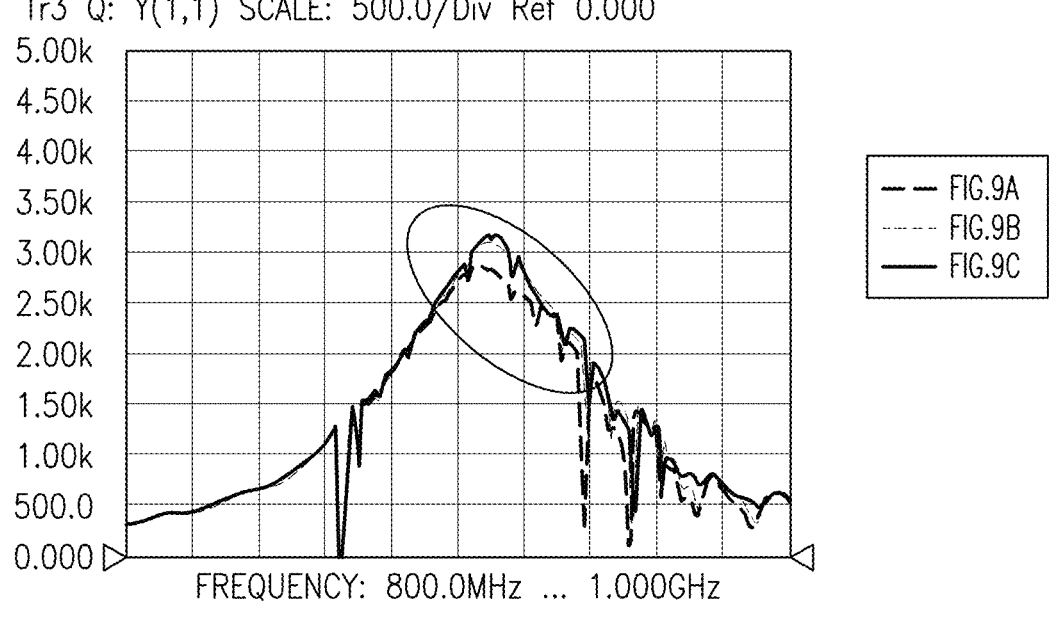

FIGS. 9D-9F are graphs illustrating the effect of the design of the second bus bar 120, 220 according to FIGS. 9A-9C on the frequency response of the acoustic wave device 1000. All of FIGS. 9D-9F show on their horizontal axis a frequency range between 1.700 GHz and 1.950 GHz. FIG. 9D shows on its vertical axis the magnitude of the admittance. FIG. 9E shows on its vertical axis the real part of the admittance. FIG. 9F shows on its vertical axis the Q value.

FIG. 9F clearly shows that, compared to the baseline structure of FIG. 9A, both the thinning of the second bus bar 220 (according to FIG. 9C, see also FIGS. 8A-8C) as well as the providing of the recessed portion (here in form of the rectangular clip-out area CA according to FIG. 9B) exhibit a marked improvement with respect to the Q value.

FIGS. 9G-9K show alternative designs of providing recessed portions of the second bus bar 220 with respect to its edge 223 facing the first bus bar 210. FIG. 9 shows the same rectangular cutout as FIG. 9B. FIG. 9H shows essentially the same structure, but with a clip-out area CA in form of a semicircle or of a rectangle with rounded-off interior corners. FIG. 9J shows essentially the same structure, but with a clip-out area CA in form of an isosceles triangle with its base on the edge 223 of the second bus bar 220.

FIG. 9K shows a different design, wherein the recessed portion RP is provided by locally bending the second bus bar 220 away from the first bus bar 210 in the area of the dummy electrode fingers 221. The length DL of the dummy electrode finger 221 may be correspondingly shortened such that the "narrow gap width", NGW, between the dummy electrode finger 221 and the electrode finger 130 of the other electrode 100 it faces remains the same, i.e. with the same proportions regarding the other widths and lengths that have been described and defined in the foregoing.

In some preferred embodiments, the piezoelectric layer 302 comprises, or preferably consists of, Lithium Tantalate, LT.

Figure 10A:
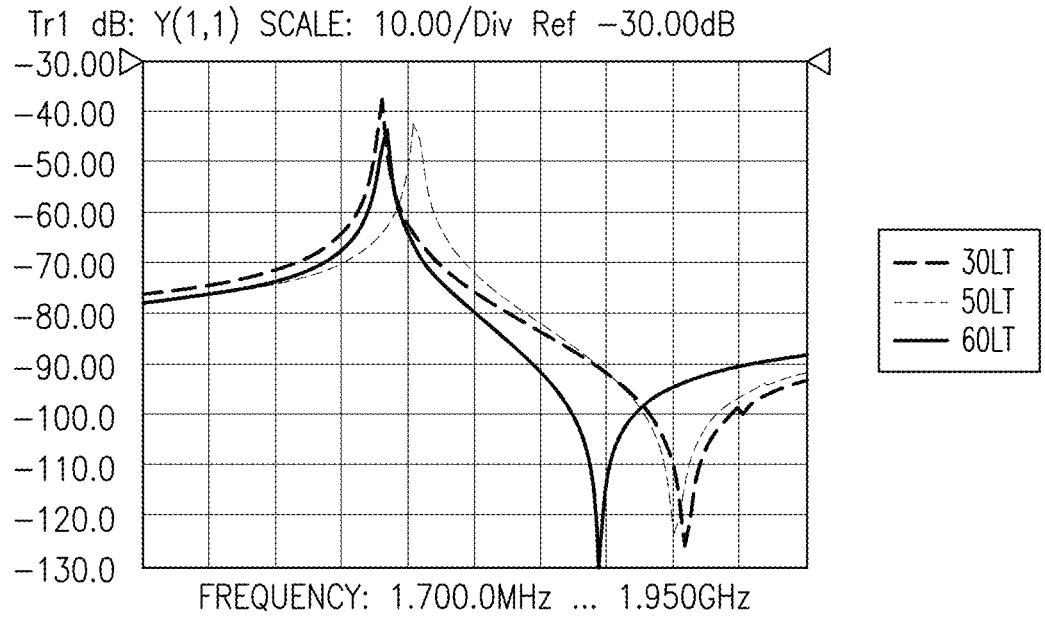
FIGS. 10A-10C are graphs illustrating the effect of different cut angles of the piezoelectric material of the piezoelectric layer on the frequency response of the acoustic wave device according to embodiments.
Figure 10B:
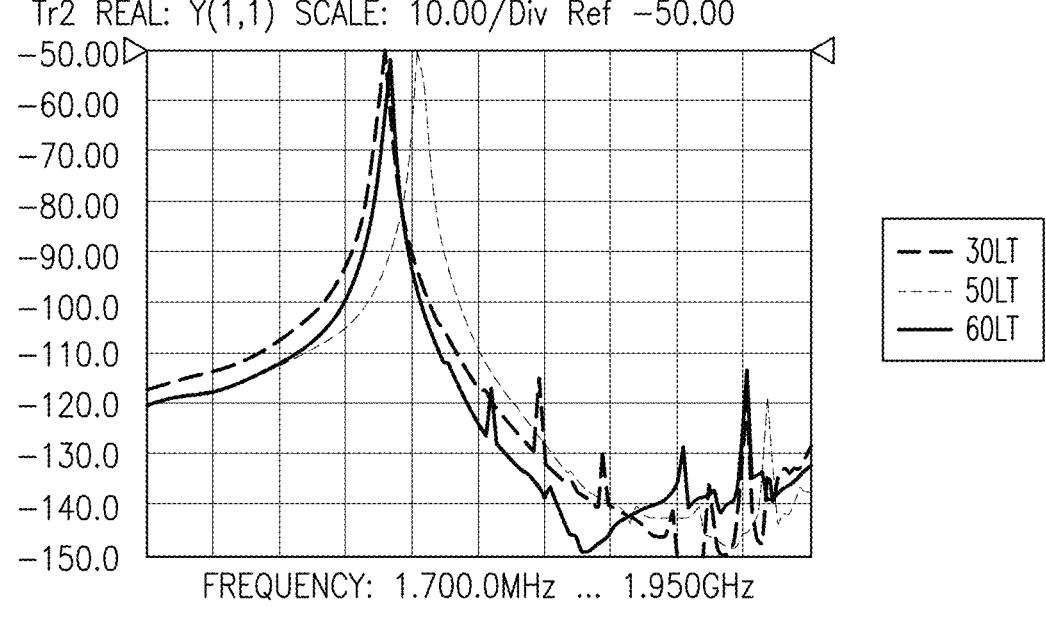
Figure 10C:
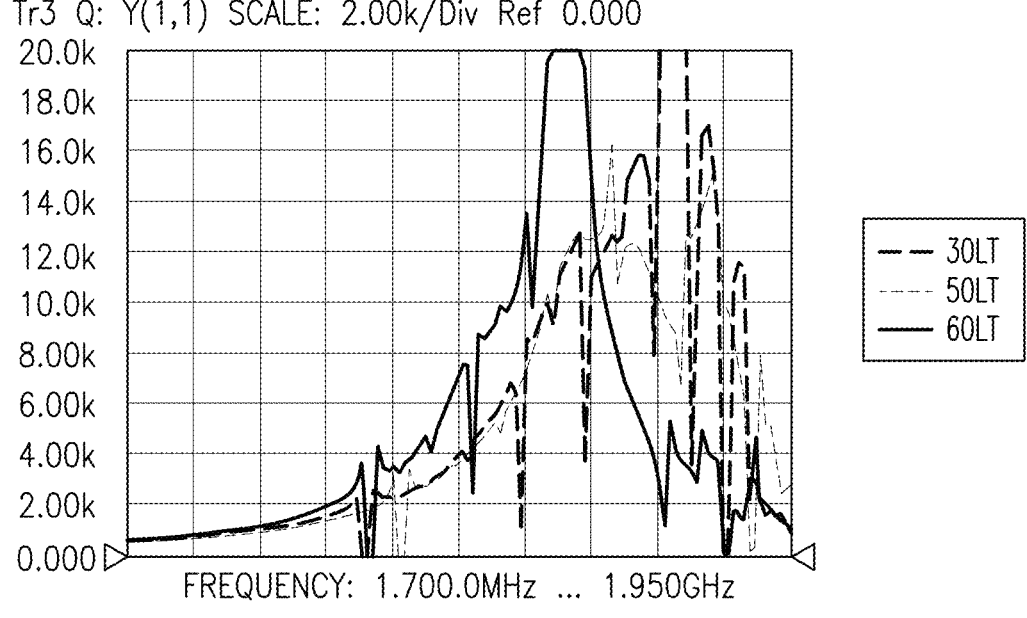

FIGS. 10A-10C are graphs illustrating the effect of different cut angles (or: cut directions) of the piezoelectric material of the piezoelectric layer on the frequency response of the acoustic wave device 1000. Here, the piezoelectric material is Lithium Tantalate, LiTaO$_3$. 30LT indicates the 30YX—LiTaO$_3$ cut angle, 50LT the 50YX—LiTaO$_3$ cut angle, and 60LT the 60YX—LiTaO$_3$ cut angle. All of FIGS. 10A-10C show on their horizontal axis a frequency range between 1.700 GHz and 1.950 GHz. FIG. 10A shows on its vertical axis the magnitude of the admittance. FIG. 10B shows on its vertical axis the real part of the admittance. FIG. 10C shows on its vertical axis the Q value.

Of the three options shown, the acoustic wave device 1000 with 30LT, i.e., with the 30YX—LiTaO$_3$ cut angle has the best performance regarding the squared coupling factor, K$^2$. Often, the selection of the cut angle requires striking a balance between optimizing K$^2$ and optimizing the temperature coefficient of frequency, TCF. Varying the cut angle thus provides design freedom to select an appropriate trade-off between K$^2$ and TCF.

Figure 11A:
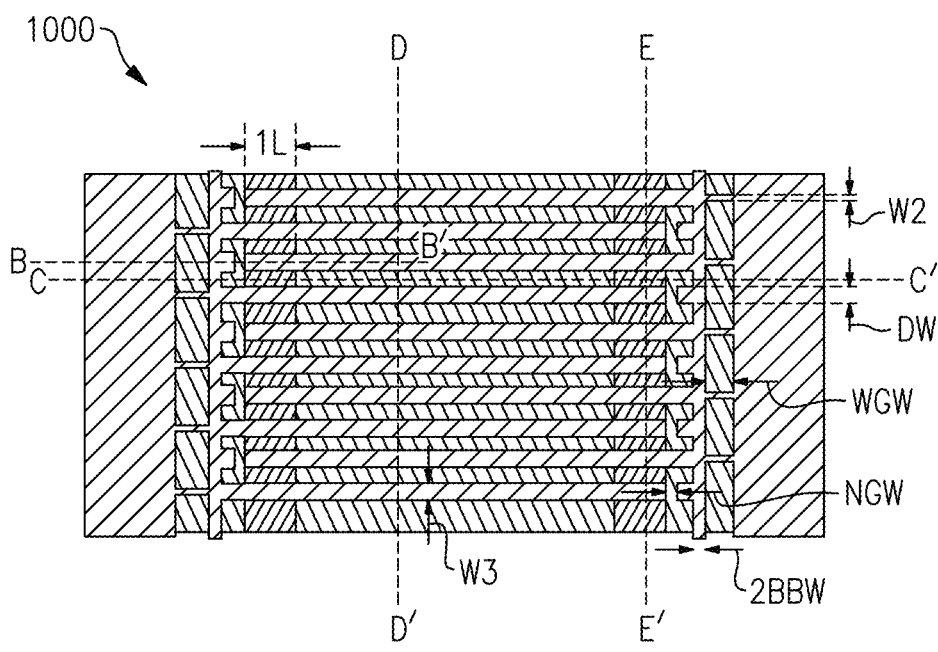
Figure 11B:
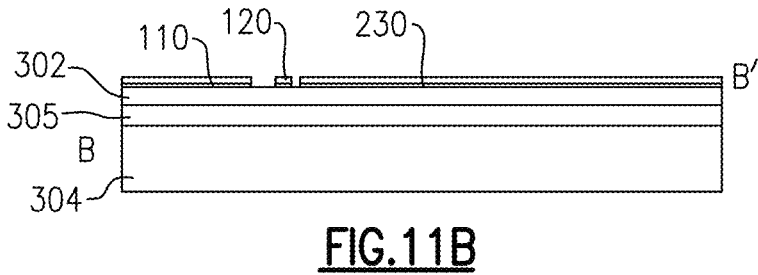
Figure 11C:
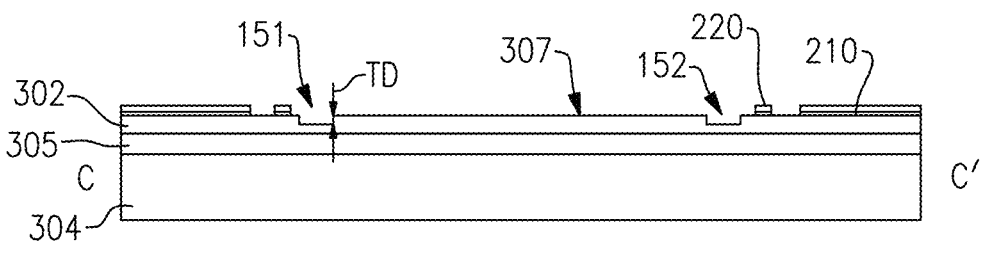

With respect to the following figures, advantageous embodiments will be described in which trenches are provided within the piezoelectric layer 302. FIG. 11A shows one possible basic configuration from this from the top, whereas FIGS. 11B-11E illustrate the configuration in different cross-sectional views. FIG. 11B shows a cross-section along the line B-B' in FIG. 11A. FIG. 11C shows a cross-section along the line C-C' in FIG. 11A. FIG. 11D shows a cross-section along the line D-D' in FIG. 11A. FIG. 11E shows a cross-section along the line E-E' in FIG. 11A.

As seem in FIG. 11A, in this configuration no flared portions are provided at any end of the electrode fingers 130, 230. However, they may be provided optionally as well. In this configuration, the "dummy length" DL=0.15 L, a width W2 of the bridges 140, 240 of W2=0.15 L, a "narrow gap width" NGW=0.10 L, a "wide gap width" WGW=0.5 L, and a width 2BBW of the second bus bar 120, 220 of 2BBW=0.15 L. Since this configuration has no flared portions, the width DW of the dummy electrode fingers 121, 221, DW=0.25 L, is the same as the width of the electrode fingers 130, 230, W3=0.25 L.

As is perhaps best seen when comparing FIG. 11B and FIG. 11C, the trenches 151, 152 are formed such that a surface 307 of the piezoelectric layer 302 facing the IDT electrodes 100, 200 is lowered within a trench 151, 152 as compared to outside of the trench 151, 152, with the exception of portions of the surface 307 which are covered by any part of the IDT electrodes 100, 200. Therefore, the trenches 151, 152 are visible in FIG. 11C which shows a cross-section between two electrode fingers 130, 230, and are not visible in FIG. 11B which show a cross-section coinciding with an electrode finger 230 (which is part of the IDT electrode 200).

The trenches 151, 152 are arranged in parallel to the first and second bus bars 110, 210, 120, 220 and are arranged in a respective region of the distal ends of the electrode fingers 130, 230. The trenches 151, 152 may have the same width as the length LHH1 that has been described with respect to the flared (or: "hammerhead") portions 131, 132, 231, 232. In the shown example, the width TW ("trench width") of the trenches 151, 152 is TW=1.0 L. In variants with both flared portions and trenches 151, 152, the trenches 151, 152 and flared portions may be provided with TW=LHH1.

The properties of the trenches 151, 152 are also easily seen in FIG. 11D and FIG. 11E which show cross-sections through the acoustic wave device 1000 in parallel to the longitudinal extent of the first and second bus bars 110, 210, 120, 220, in the case of FIG. 11D in the area of the center portions of the electrode fingers 130, 230 without any trenches, and in the case of FIG. 11E in the area of the distal ends of the electrode fingers 130 of the first IDT electrode 100, within a trench 152.

In particular FIG. 11E illustrates how the surface 307 is lowered by the trench depth TD of the trenches 151, 152 with respect to the remaining surface 307, for example under the electrode fingers 130, 230. The trench depth TD is preferably between 0.001 L and 0.01 L, for example about (or exactly) TD=0.005 L.

It should be noted that the designs comprising trenches 151, 152 can be easily and advantageously combined with the designs according to FIG. 9G-9K, which pertain to recessed portions, RP, or clip-out areas, CA, being provided in the second bus bars 120, 220.

FIGS. 12A-12C are graphs illustrating the effect of different configurations on the frequency response of the acoustic wave device 1000. All of FIGS. 12A-12C show on their horizontal axis a frequency range between 1.700 GHz and 1.950 GHz. FIG. 12A shows on its vertical axis the magnitude of the admittance. FIG. 12B shows on its vertical axis the real part of the admittance. FIG. 12C shows on its vertical axis the Q value.

The three variants shown in FIG. 12A-12C are: 1) a configuration with a Lithium Tantalate (LT) piezoelectric layer 302 without any trenches but with flared portions as shown in FIG. 1 ("hammerhead IDT"), with an W2=W3=0.235 L; 2) a configuration with trenches 151, 152 with a depth of TD=0.005 L and the configuration shown in FIG. 11A-11E ("LT trench (TD=0.005 L)"); and 3) a configuration a configuration with trenches 151, 152 with a depth of TD=0.005 L and the configuration shown in FIG. 11A-11E, except without dummy electrodes ("LT trench (TD=0.005 L) w/o dummy"). Of the three variants, the variant 2), i.e., with trenches 151, 152, and with dummy electrode fingers 121, 221, exhibits the best Q value performance. The inventor has found out that providing the trenches 151, 152 allows ceteris paribus to use wider IDT electrodes 100, 200 (i.e., W3=0.25 L instead of, for example, W3=0.235 L), which leads to an increase of the static capacitance so that in total the size of the acoustic wave device 1000 may be advantageously reduced.

FIG. 11D and FIG. 11E also illustrate that the IDT electrodes 100, 200 may be formed by/in more than one layer, in this case by two layer: a first IDT layer 308, immediately adjacent to the piezoelectric layer 302, and a second IDT layer 309, arranged on top of the first IDT layer 308 so as to sandwich the first IDT layer 308 between the piezoelectric layer 302 and the second IDT layer 309.

In some advantageous embodiments, the thickness 1ILT of the first IDT layer 308 is smaller than the thickness 2ILT of the second IDT layer 309, whereas in other embodiments 1ILT=2ILT.

Figure 13C:
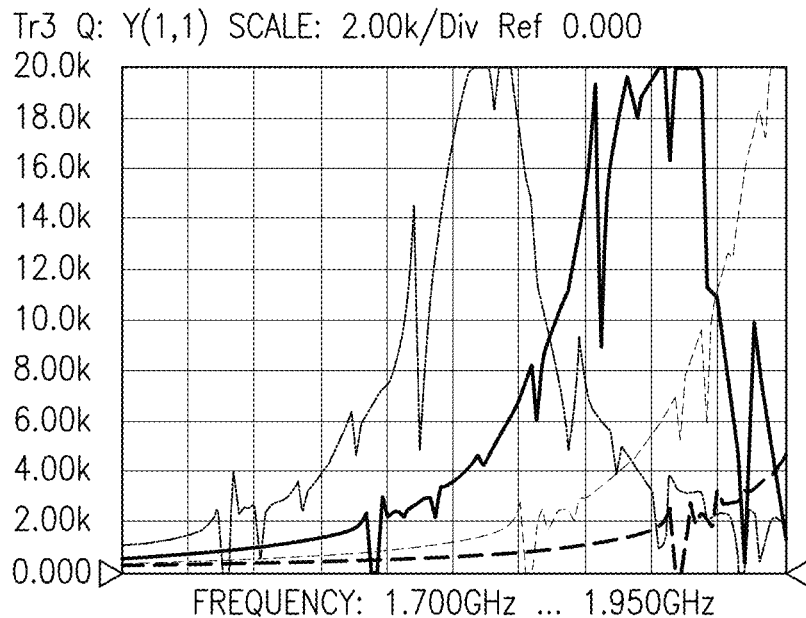

FIGS. 13A-13C are graphs illustrating the effect of different ratios of thicknesses of the two IDT layers 308, 309 on the frequency response of the acoustic wave device 1000. All of FIGS. 13A-13C show on their horizontal axis a frequency range between 1.700 GHz and 1.950 GHz. FIG. 13A shows on its vertical axis the magnitude of the admittance. FIG. 13B shows on its vertical axis the real part of the admittance. FIG. 13C shows on its vertical axis the Q value.

In all of the four variants shown in FIGS. 13A-13C, the first IDT layer 308 consists of Molybdenum (Mo), and the second IDT layer 309 consists of Aluminum (Al). Thus, the thickness ILT is a thickness of Molybdenum, and the thickness 2ILT is a thickness of Aluminum. The four variants exhibit similar Q value performance. A higher thickness 1ILT of Molybdenum is preferred since it allows a size reduction of the acoustic wave device 1000. If nothing else is indicated explicitly, in the embodiments discussed herein the thickness 1ILT of Molybdenum is 0.023 L, and the thickness 2ILT of Aluminum is 0.066 L, the thickness of the piezoelectric layer 302 (especially Lithium Tantalate, preferably Y-42° Lithium Tantalate) is 0.16 L, and the thickness of the additional layer 305 (especially Silicon Oxide) is 0.16 L.

Figure 14A:
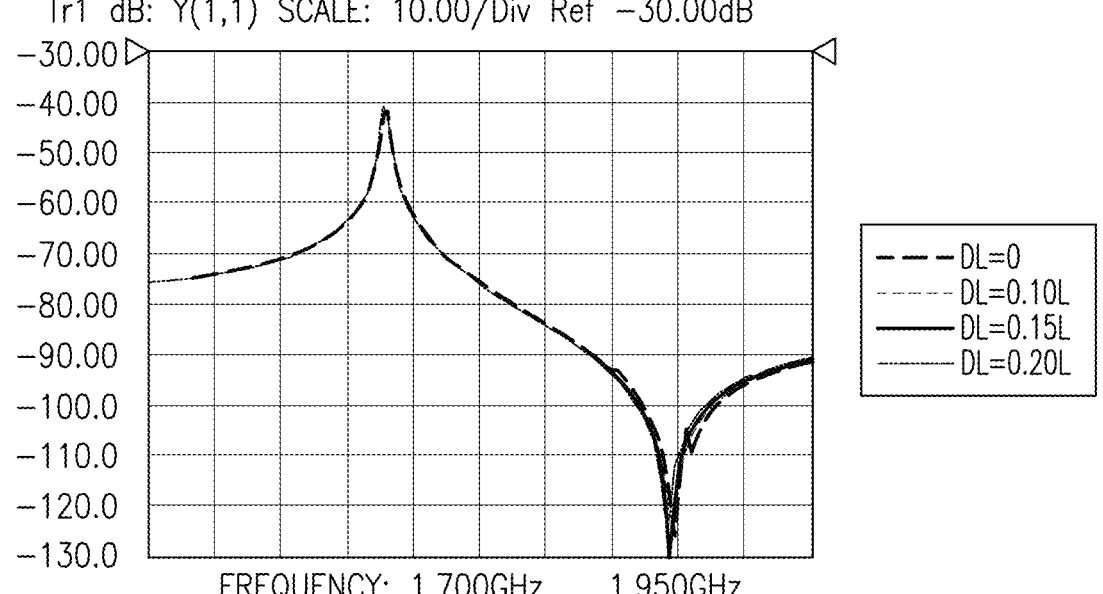
FIGS. 14A-14C are graphs illustrating the effect of the length of the dummy electrode fingers on the frequency response of the acoustic wave device according to embodiments.
Figure 14B:
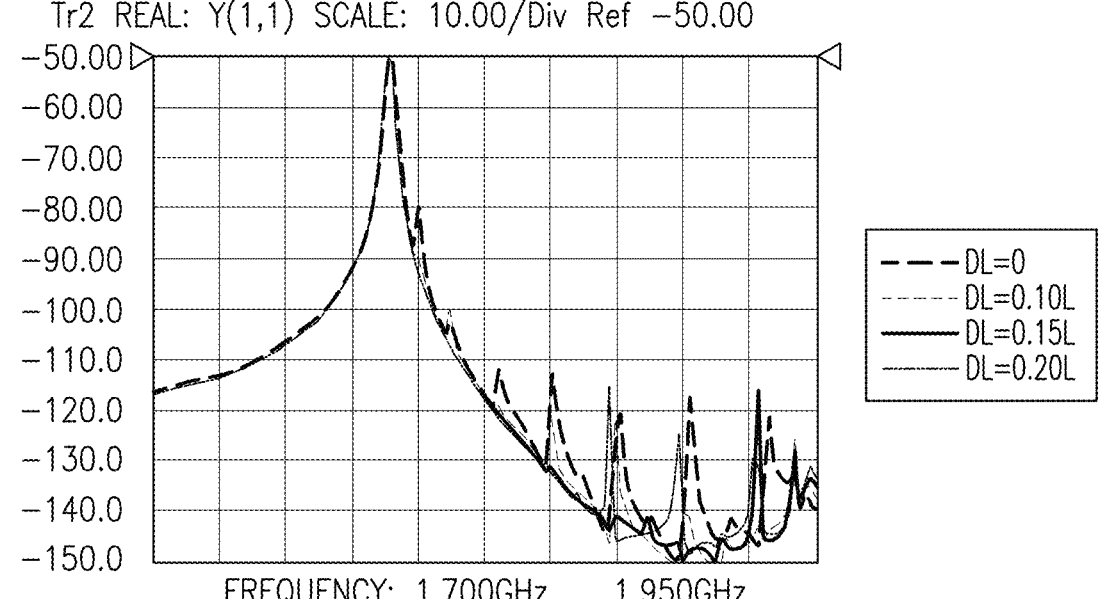
Figure 14C:
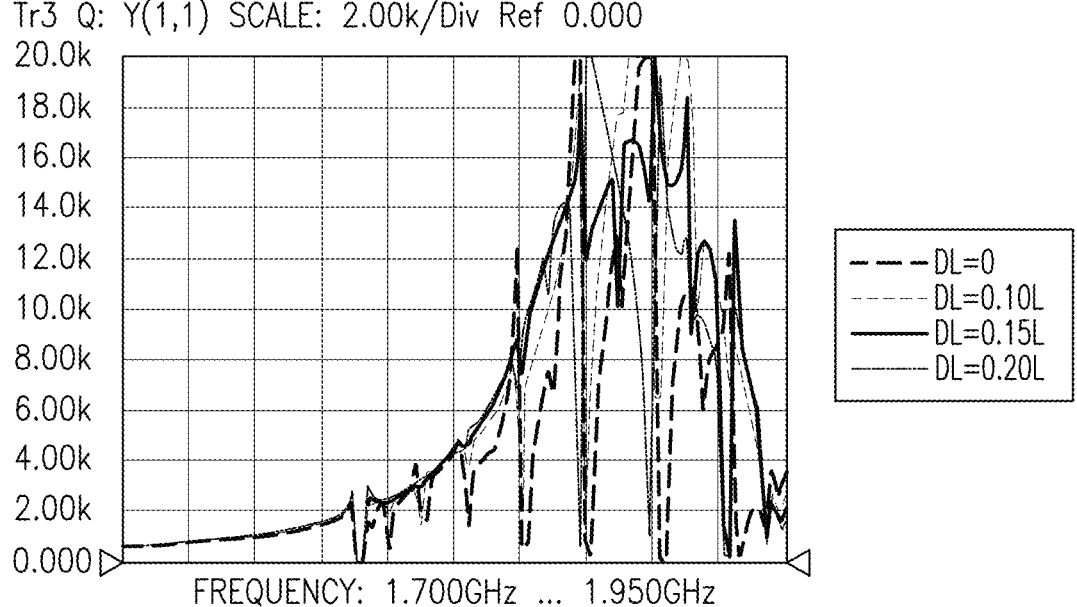

FIGS. 14A-14C are graphs illustrating the effect of the length DL of the dummy electrode fingers 121, 221 on the frequency response of the acoustic wave device 1000 having the trench structures as shown in FIGS. 11A-11E. All of FIGS. 14A-14C show on their horizontal axis a frequency range between 1.700 GHz and 1.950 GHz. FIG. 14A shows on its vertical axis the magnitude of the admittance. FIG. 14B shows on its vertical axis the real part of the admittance. FIG. 14C shows on its vertical axis the Q value.

All variants with non-vanishing length DL of the dummy electrode fingers 121, 122 (i.e., DL>0) show excellent behavior, with the variant of DL=0.15 L exhibiting the best performance regarding the Q value.

Figure 15A:
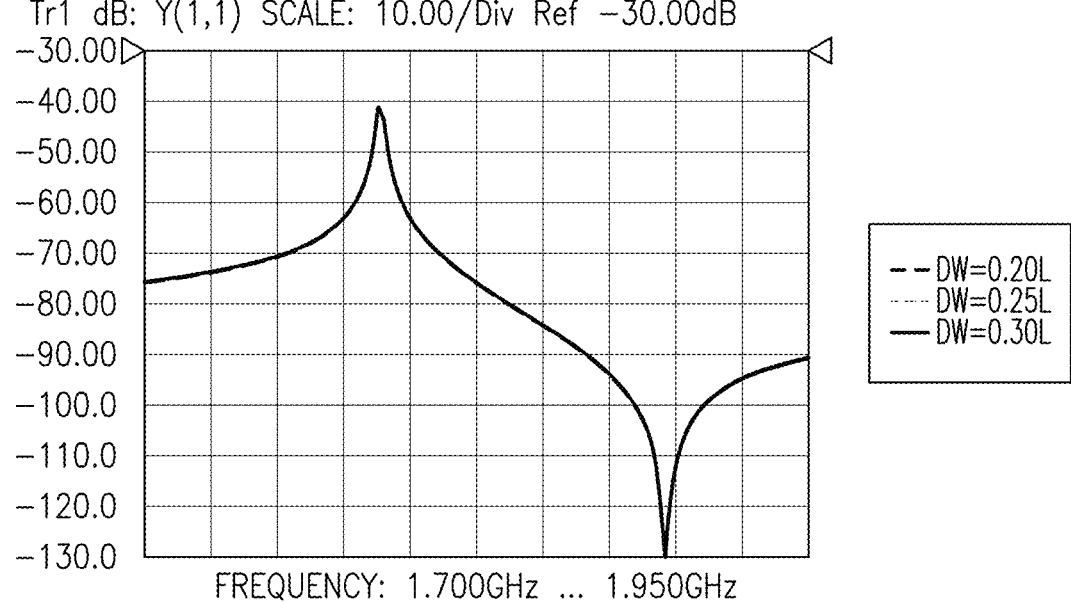
FIGS. 15A-15C are graphs illustrating the effect of the width of the dummy electrode fingers (with the width of the electrode fingers being unchanged) on the frequency response of the acoustic wave device according to embodiments.
Figure 15B:
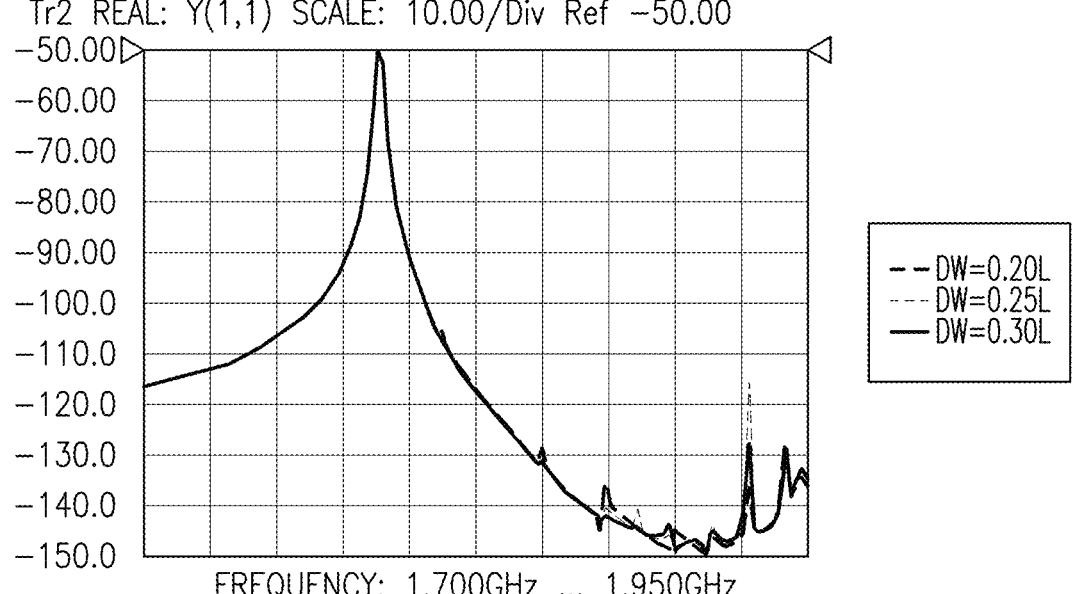
Figure 15C:
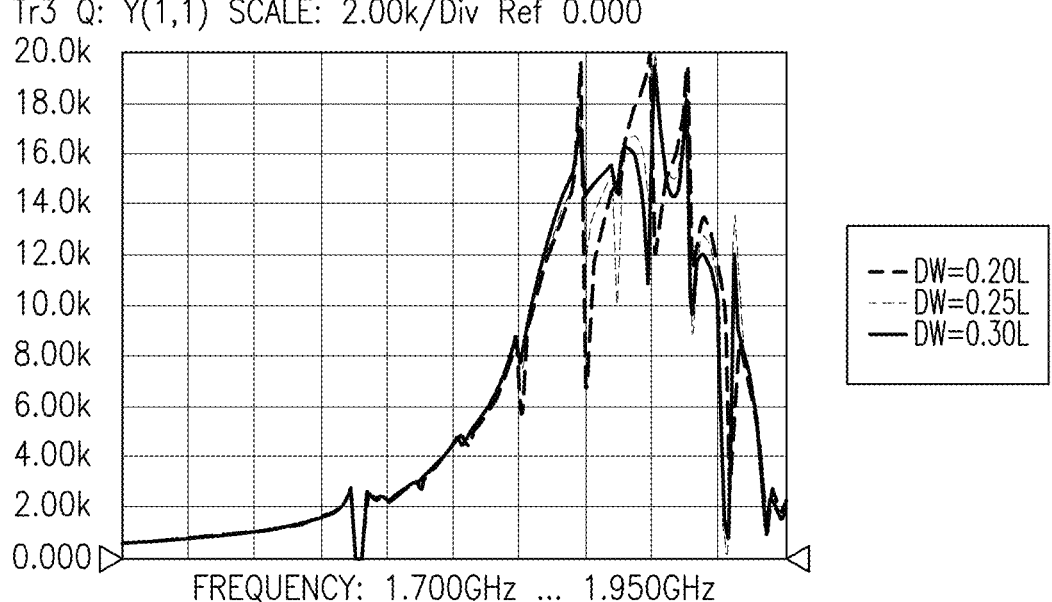

FIGS. 15A-15C are graphs illustrating the effect of the width DW of the dummy electrode fingers 121, 221 (with the width W3 of the electrode fingers 130, 230 being unchanged) on the frequency response of the acoustic wave device 1000 having the trench structures as shown in FIGS. 11A-11E. All of FIGS. 15A-15C show on their horizontal axis a frequency range between 1.700 GHz and 1.950 GHz. FIG. 15A shows on its vertical axis the magnitude of the admittance. FIG. 15B shows on its vertical axis the real part of the admittance. FIG. 15C shows on its vertical axis the Q value.

As is evident from FIGS. 15A-15C, all variants exhibit good performance regarding the Q value, which is comparatively robust against changes in the "dummy width" DW.

Figure 16A:
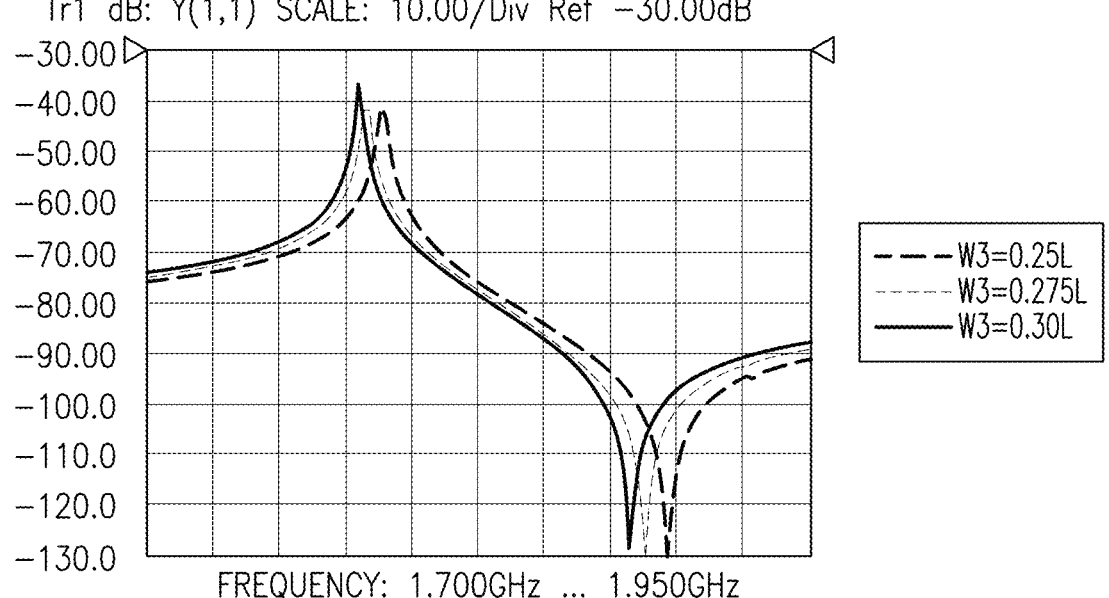
FIGS. 16A-16C are graphs illustrating the effect of the width of the electrode fingers (with the width of the dummy electrode fingers being unchanged) on the frequency response of the acoustic wave device according to embodiments having the trench structures as shown in FIGS. 11A-11E.
Figure 16B:
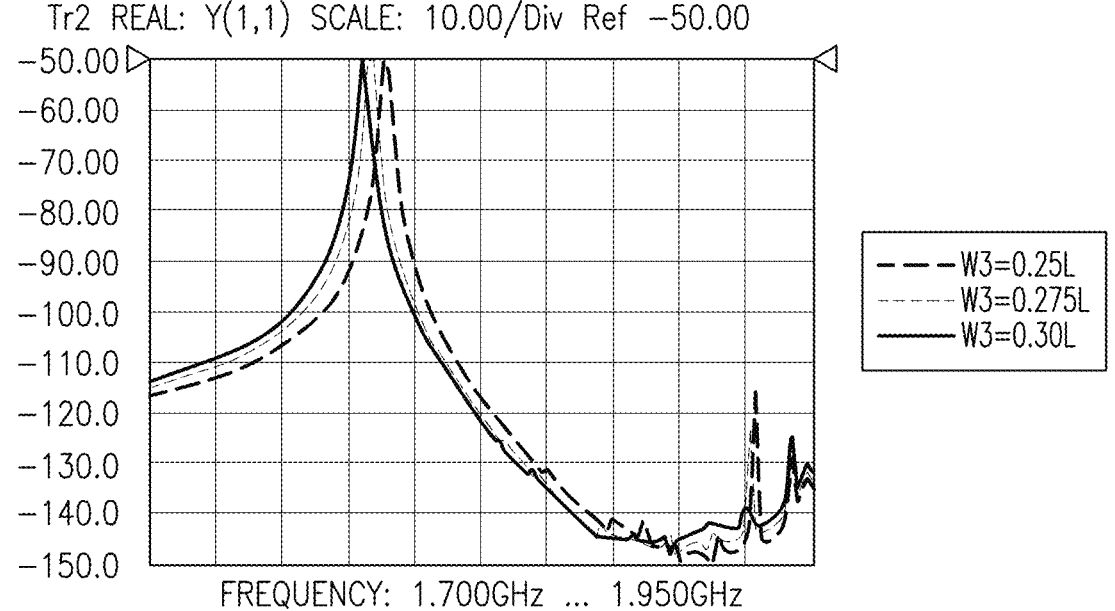
Figure 16C:
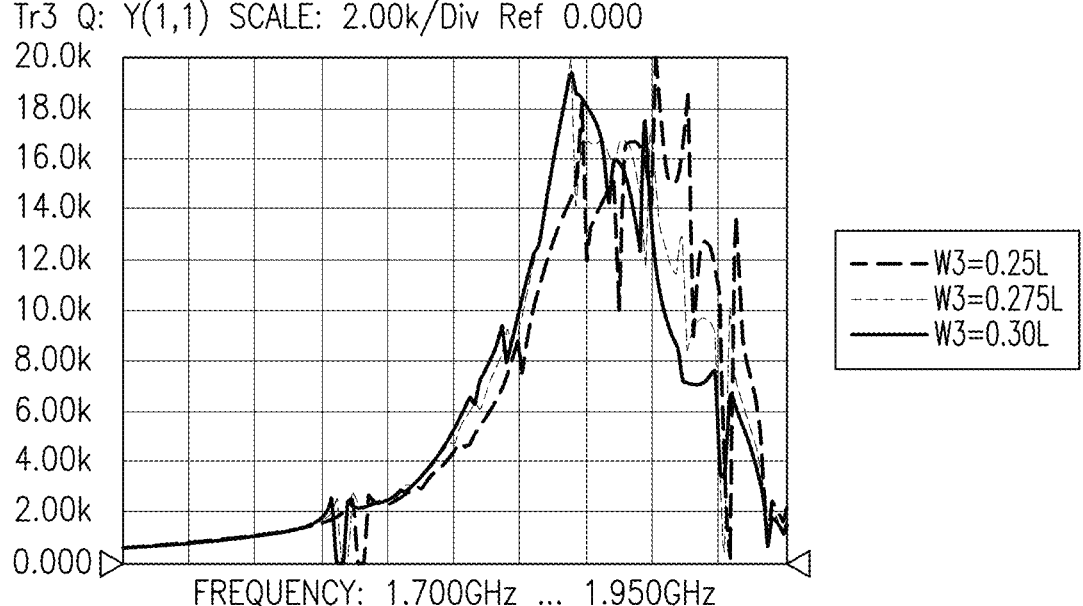

FIGS. 16A-16C are graphs illustrating the effect of the width W3 of the electrode fingers 130, 230 (with the width DL of the dummy electrode fingers 121, 221 being unchanged) on the frequency response of the acoustic wave device 1000 having the trench structures as shown in FIGS. 11A-11E. All of FIGS. 16A-16C show on their horizontal axis a frequency range between 1.700 GHz and 1.950 GHz. FIG. 16A shows on its vertical axis the magnitude of the admittance. FIG. 16B shows on its vertical axis the real part of the admittance. FIG. 16C shows on its vertical axis the Q value.

As is evident from FIGS. 16A-16C, all variants exhibit good performance regarding the Q value, which is comparatively robust against changes in the width W3 of the electrode fingers 130, 230. Comparatively wider electrode fingers 130, 230 have the advantage of an increased static capacitance, so that ceteris paribus the acoustic wave device 100 can be manufactured with a smaller size. Thus, larger width W3 such as W3=0.30 L are preferred.

FIG. 17A, FIG. 17B and FIG. 17C illustrate another variant of the design of any of FIG. 1, FIG. 2A, FIG. 2B, of FIG. 11A-11E. In this variant, a first silicon-comprising structure 430 (for example, comprising or consisting of Silicon Nitrate) is arranged over a first area of the interdigital transducer electrodes where the electrode fingers of the two electrodes are interwoven. In other words, the first silicon-comprising structure 430 covers the center area C, but does in this design not extend into the areas where the flared portions 131, 132, 231, 232 are located. FIG. 17C shows a variant where, in addition to the configuration of FIG. 17A and FIG. 17B, a protection layer 435 is provided over the topmost surfaces of the acoustic wave device 1000, i.e., covering the IDT electrodes 100, 200, and the open areas of the additional layer 305 (here consisting of Silicon Oxide, $SiO_2$). Preferably, the protection layer 435 comprises, or consists of, $SiO_2$, SiN or SiON, with a thickness of preferably between 5 nanometers and 30 nanometers.

FIG. 18A, FIG. 18B and FIG. 18C illustrate another variant of the design of FIG. 17A, wherein in addition to the first silicon-comprising structure 430, a second silicon-comprising structure 440 is provided, which covers the remaining top surfaces of the acoustic wave device 1000, i.e. those areas which are not covered by the first silicon-comprising structure 430. These areas include the first and second bus bars, 110, 210, 120, 220, the bridges 140, 240, the dummy electrode fingers 121, 221, and the distal ends of the respective opposing electrode 200, 100, as perhaps best visible in the top view of FIG. 18B. Advantageously, the thickness of the second silicon-comprising structure 440 is smaller than the thickness of the first silicon-comprising structure 430. FIG. 18C again shows essentially the same cross-section as FIG. 18A but adds, just as FIG. 17C, a variant in which a protection layer 435 is provided over the topmost surfaces of the acoustic wave device 1000, now formed by the first silicon-comprising structure 430 and the second silicon-comprising structure 440 exclusively. Preferably, the first silicon-comprising structure 430 and the second silicon-comprising structure 440 are made from the same material, more preferably from Silicon Nitrate.

FIG. 19A, FIG. 19B and FIG. 19C illustrate another variant of the design of FIG. 17A, wherein in addition to the first silicon-comprising structure 430, a second silicon-comprising structure 440 is provided, which covers the top surfaces of the second bus bars 120, 220, of the bridges 140, 240, of the dummy electrode fingers 121, 221, and of the distal ends of the respective opposing electrode 200, 100, as perhaps best visible in the top view of FIG. 19B. Furthermore, the acoustic wave device 1000 of FIG. 19A and FIG. 19B comprises a third silicon-comprising structure 445 which covers the remaining surface of the first bus bars 110, 210, i.e. the area not yet covered by the second silicon-comprising structure 440.

Preferably, the first silicon-comprising structure 430 and the third silicon-comprising structure 445 are provided with a larger thickness (advantageously the same between the two) than the thickness of the second silicon-comprising structure 440. In this way, trenches 451, 452 are provided in the silicon-comprising structures 430, 445, 440, as is best visible in the cross-section of FIG. 19A. FIG. 19C again shows essentially the same cross-section as FIG. 19A but adds, just as FIG. 17C and FIG. 18C, a variant in which a protection layer 435 is provided over the topmost surfaces of the acoustic wave device 1000, now formed by the first silicon-comprising structure 430, the second silicon-comprising structure 440 and the third silicon-comprising structure 445 exclusively. Preferably, the first silicon-comprising structure 430, the second silicon-comprising structure 440 and the third silicon-comprising structure 445 are made from the same material, more preferably from Silicon Nitrate.

Between the variants of FIGS. 17A-17C, FIGS. 18A-18C and FIGS. 19A-19C, the variants of FIGS. 19A-19C are preferred. The trenches 451, 452 allow using wider duty factors (or, in other words, smaller widths W3) of the electrode fingers 130, 230 in the center region C of the acoustic wave device, which in turn contributes to reducing the IDT electrode sizes for the same impedance.

Figure 20A:
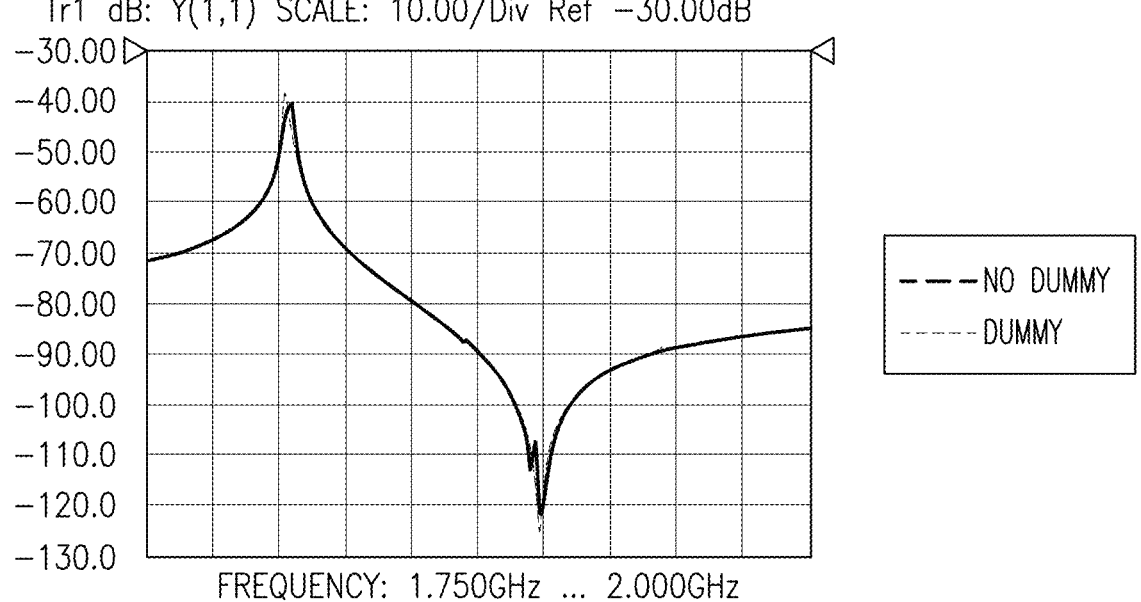
FIGS. 20A-20C are graphs illustrating the effect of the dummy electrode fingers 121, 221 on the frequency response of the acoustic wave device according to embodiments having the silicon-comprising structure as shown in FIGS. 17A and 17B.
Figure 20B:
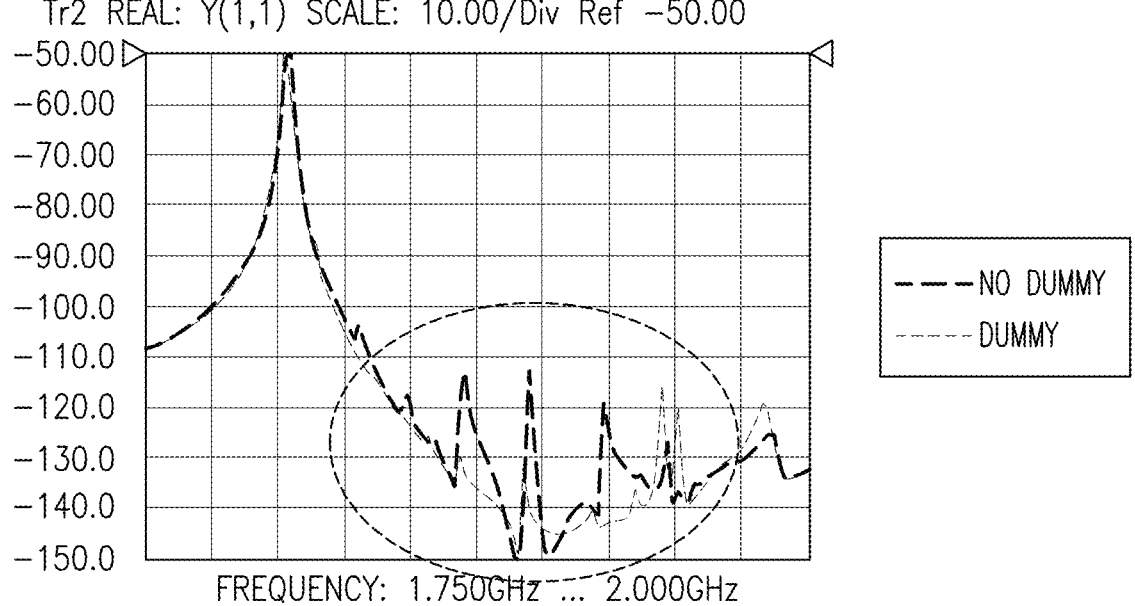
Figure 20C:
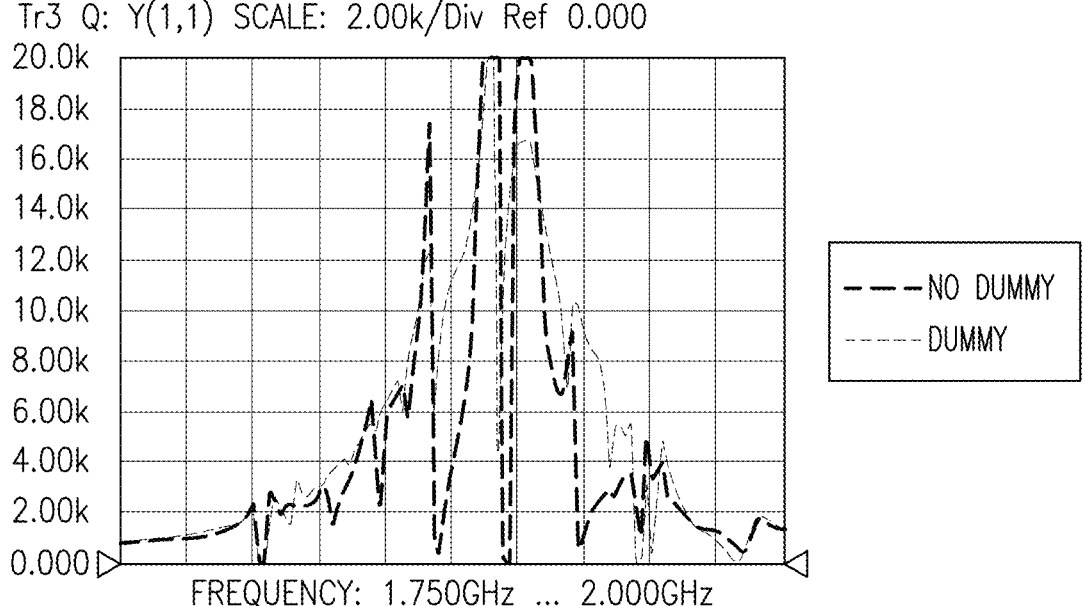

FIGS. 20A-20C are graphs illustrating the effect of the dummy electrode fingers 121, 221 on the frequency response of the acoustic wave device 1000 having the first silicon-comprising structure 430 as shown in FIGS. 17A and 17B, without the protection layer 345. All of FIGS. 20A-20C show on their horizontal axis a frequency range between 1.700 GHz and 1.950 GHz. FIG. 20A shows on its vertical axis the magnitude of the admittance. FIG. 20B shows on its vertical axis the real part of the admittance. FIG. 20C shows on its vertical axis the Q value.

The first option shows the variant without dummies, i.e. the same structure as shown in FIGS. 17A and 17B, without the protection layer 345, with the values as described in the foregoing with respect to FIG. 1, except that there are no dummy electrode fingers and the width 2BBW of the second bus bars 120, 220 is 2BBW=0.30 L. The second option shows the variant of FIGS. 17A and 17B. It is evident that the latter exhibits improved performance with respect to the Q value.

Figure 21A:
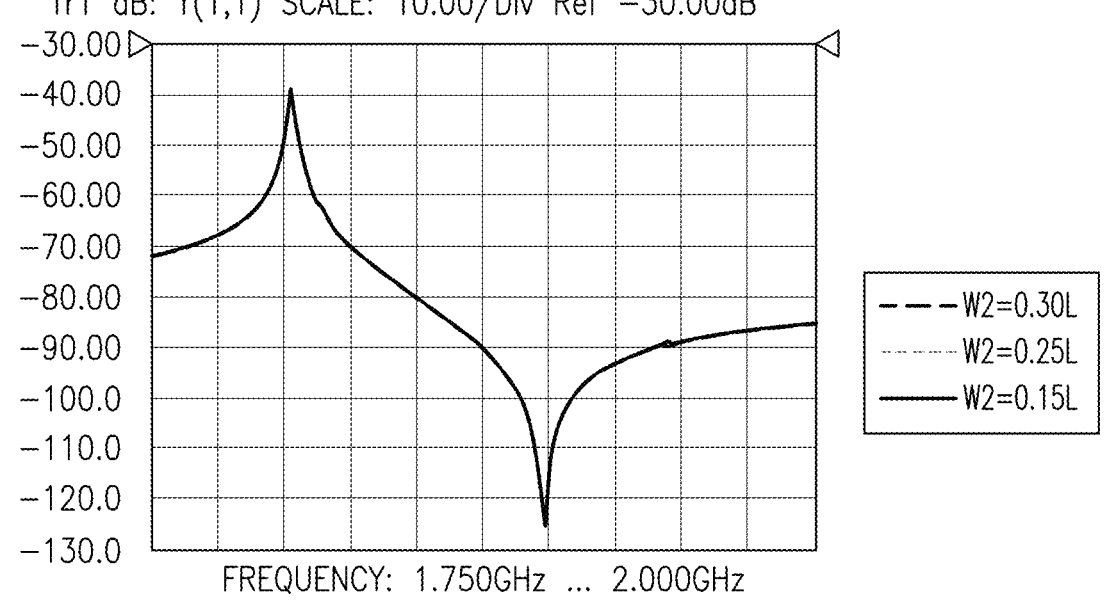
FIGS. 21A-21C are graphs illustrating the effect of the width of the bridges on the frequency response of the acoustic wave device according to embodiments having the silicon-comprising structure 430 as shown in FIGS. 17A and 17B.
Figure 21B:
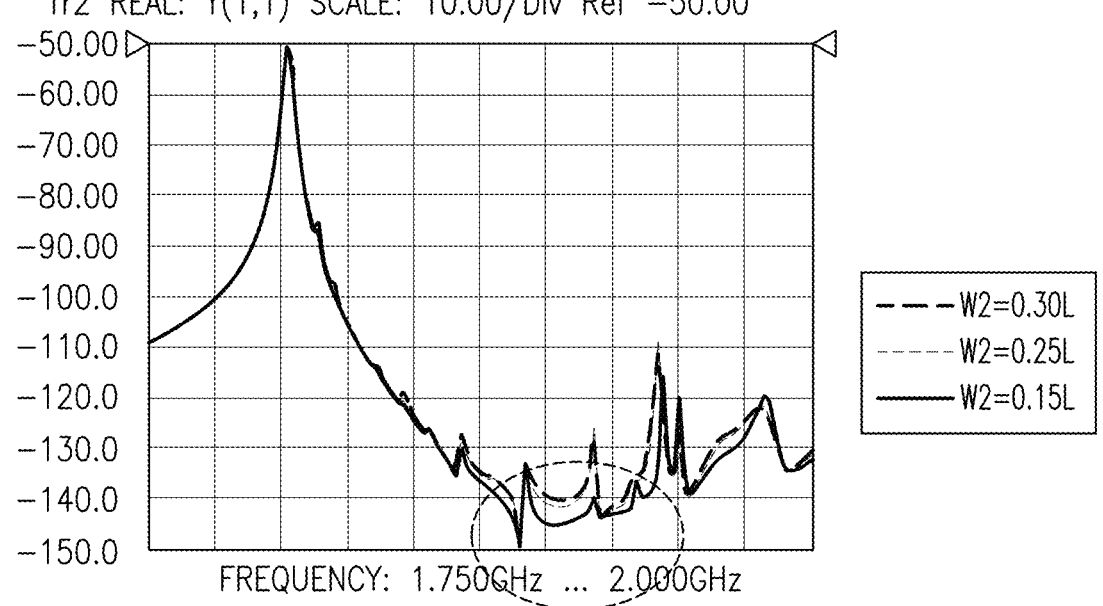
Figure 21C:
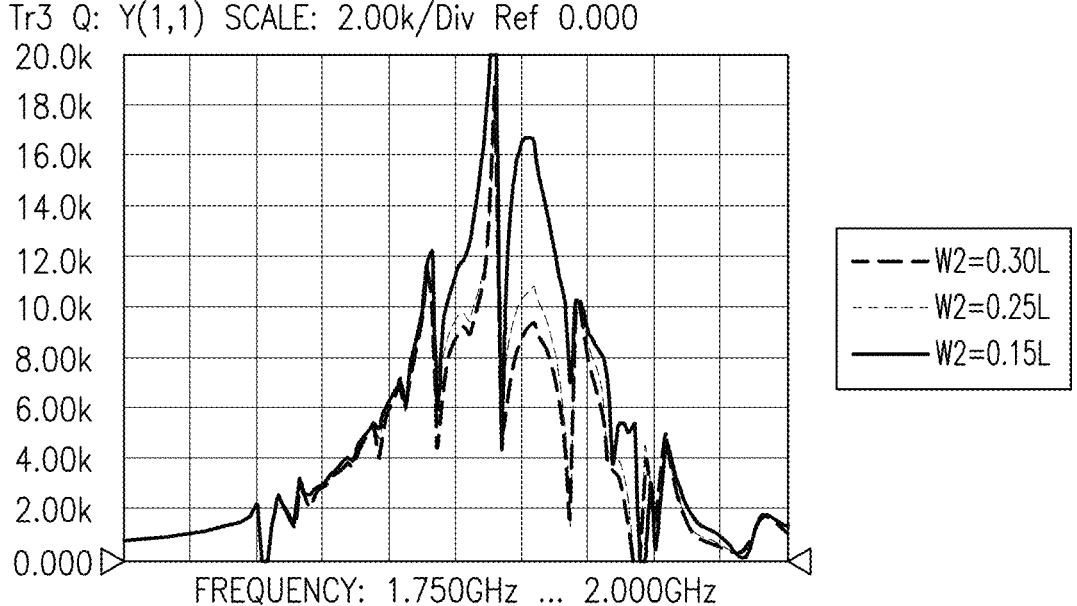

FIGS. 21A-21C are graphs illustrating the effect of the width W2 of the bridges 140, 240 on the frequency response of the acoustic wave device 1000 having the first silicon-comprising structure 430 as shown in FIGS. 17A and 17B, without the protection layer 345. All of FIGS. 21A-21C show on their horizontal axis a frequency range between 1.700 GHz and 1.950 GHz. FIG. 21A shows on its vertical axis the magnitude of the admittance. FIG. 21B shows on its vertical axis the real part of the admittance. FIG. 21C shows on its vertical axis the Q value. In each case, the width W3 of the electrode fingers 130, 230 remains fixed at W3=0.30 L.

Of the shown variants, the ones with thinner widths W2, i.e. with smaller duty factors in the area of the bridges 140, 240, exhibit the best performance regarding the Q value.

Figure 22A:
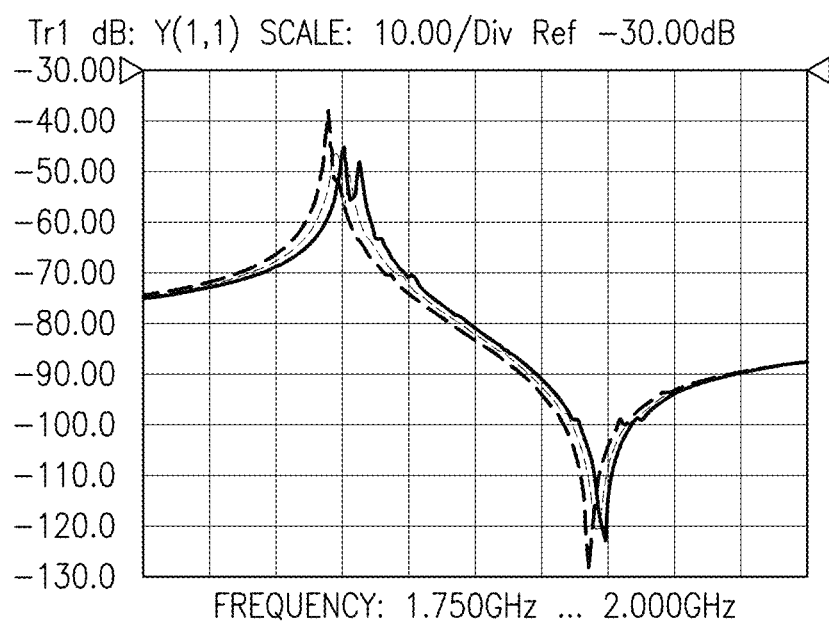
FIGS. 22A-22C are graphs illustrating the effect of the depth of the trenches on the frequency response of the acoustic wave device according to embodiments having the silicon-comprising structures as shown in FIGS. 19A and 19B.
Figure 22B:
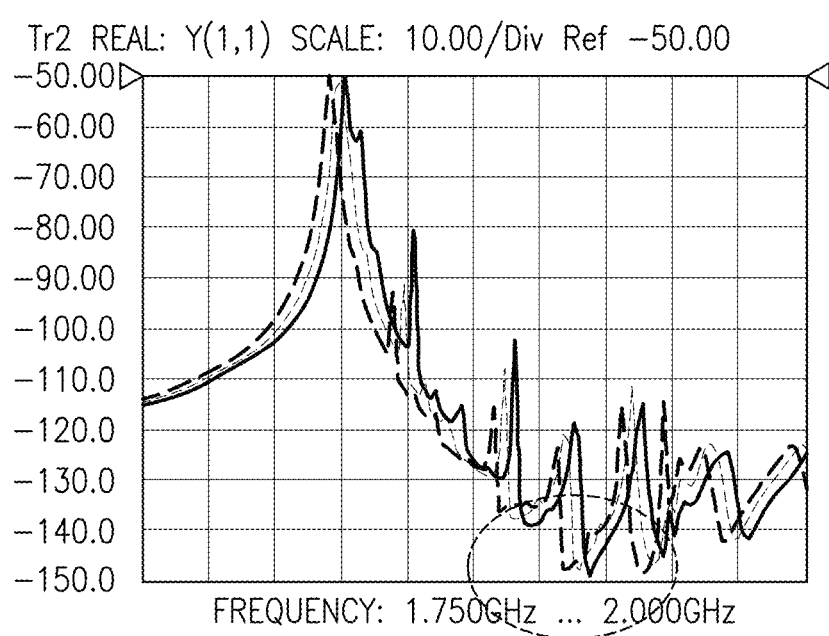
Figure 22C:
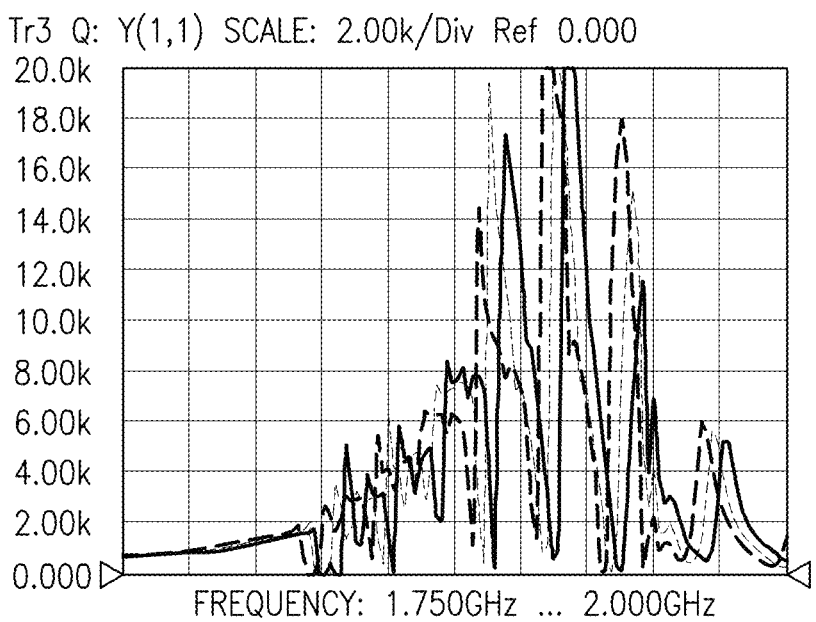

FIGS. 22A-22C are graphs illustrating the effect of the depth STD of the trenches 451, 452 on the frequency response of the acoustic wave device 1000 having the first, second and third silicon-comprising structures 430, 440, 445 as shown in FIGS. 19A and 19B. All of FIGS. 22A-22C show on their horizontal axis a frequency range between 1.700 GHz and 1.950 GHz. FIG. 22A shows on its vertical axis the magnitude of the admittance. FIG. 22B shows on its vertical axis the real part of the admittance. FIG. 21C shows on its vertical axis the Q value. In each case, the width STW of the trenches 451, 452 remains fixed at 0.75 L.

Of the shown variants, the variant with the shallowest trenches 451, 452, with a depth of only STD=0.011 L, exhibits the best performance regarding the Q value.

Figure 23A:
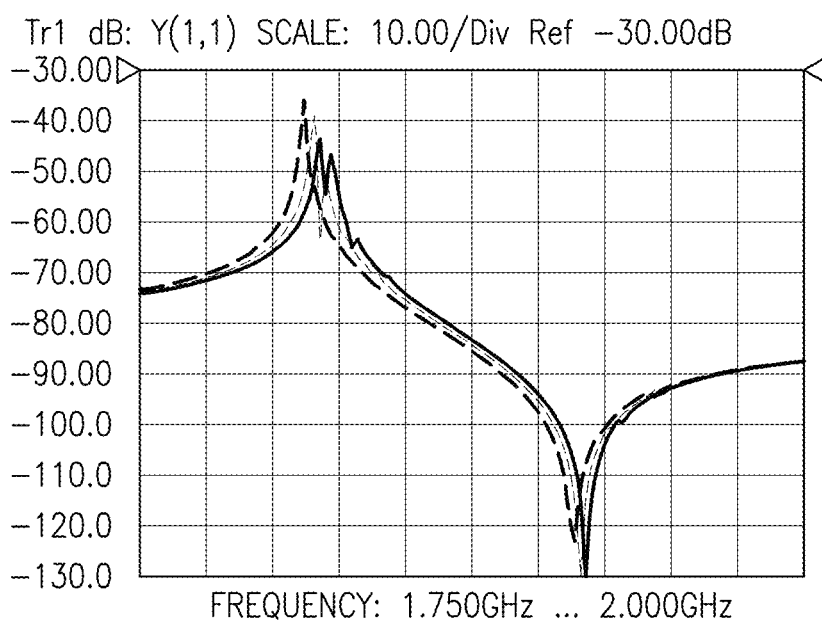
FIGS. 23A-23C are graphs further illustrating the effect of the depth of the trenches on the frequency response of the acoustic wave device according to embodiments having the silicon-comprising structures as shown in FIGS. 19A and 19B.
Figure 23B:
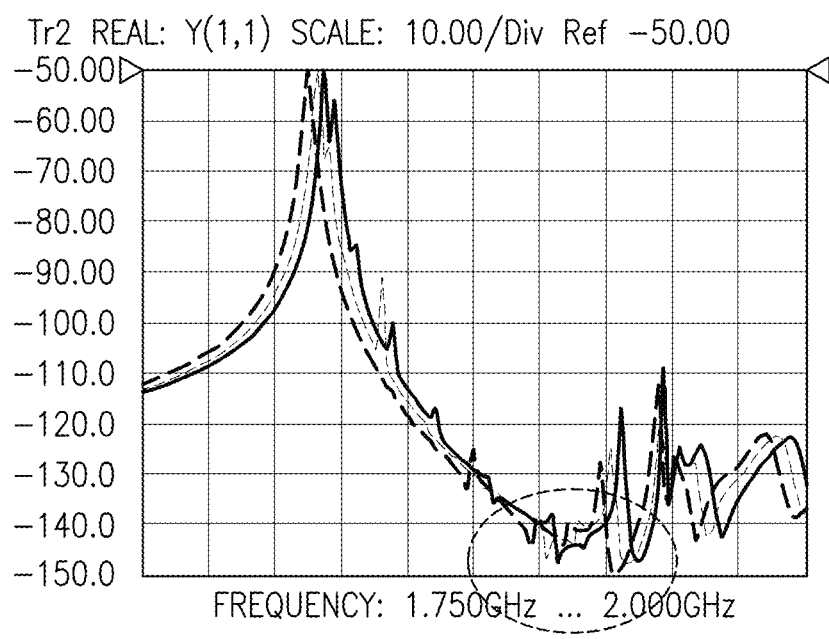
Figure 23C:
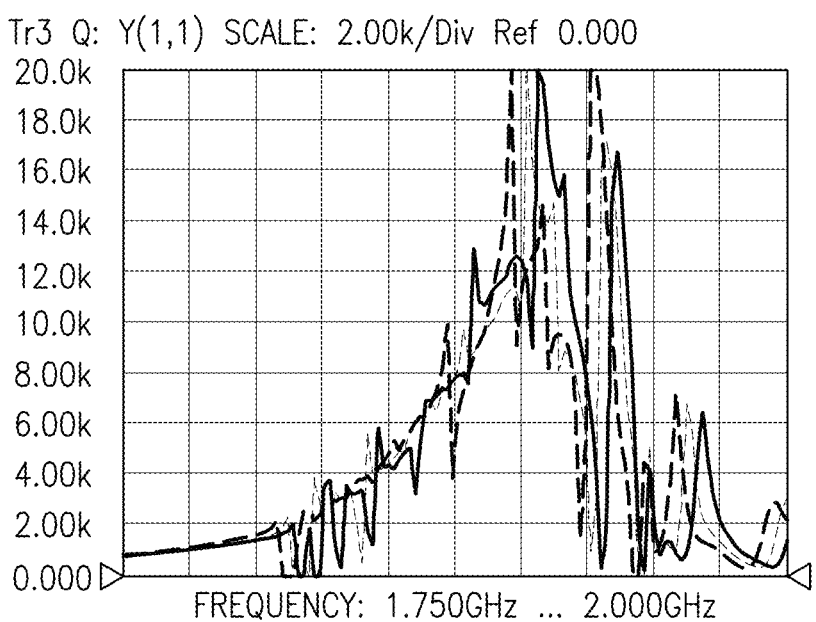

FIGS. 23A-23C are graphs illustrating the same effect as FIGS. 22A-22C, only with a width STW of the trenches 451, 452 fixed at STW=1 L, and with lower values for the depth of the trenches 451, 452 of STD=0.007 L, STD=0.009 L and STD=0.011 L. Of these, again the variant with the lowest depth, STD=0.007 L exhibits the best Q value performance, even better than the variants of FIGS. 22A-22C (with the width STW of the trenches 451, 452 of STW=0.75 L). Thus, a trench depth of STD=0.007 L and a trench width of STW=1 L is preferred.

Figure 24A:
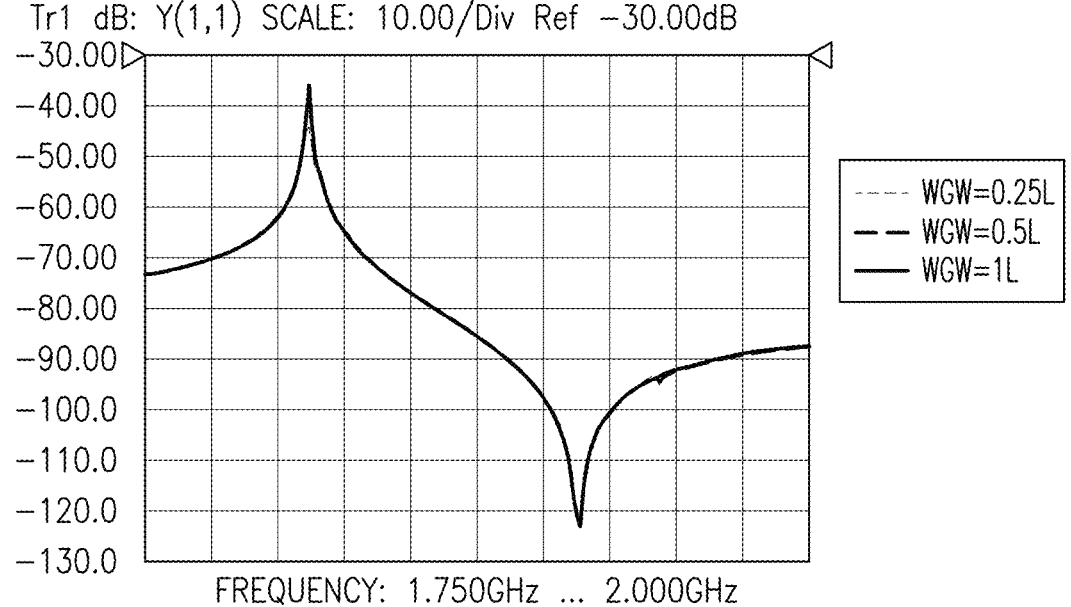
FIGS. 24A-24C are graphs illustrating the effect of the width of the gap between the first and second bus on the frequency response of the acoustic wave device according to embodiments having the silicon-comprising structure as shown in FIGS. 17A and 17B.
Figure 24B:
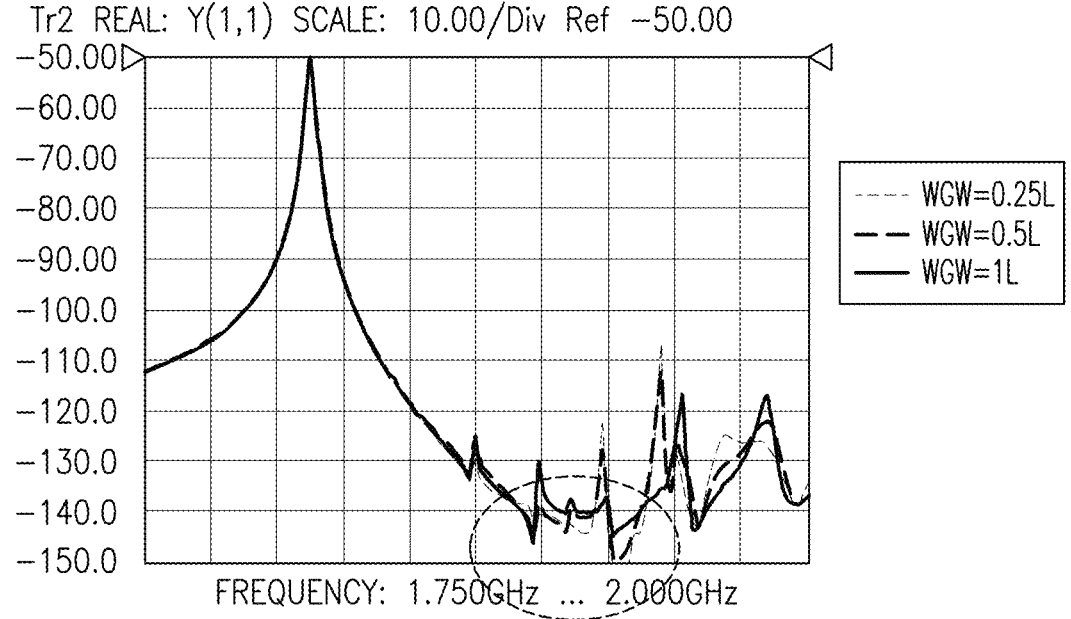
Figure 24C:
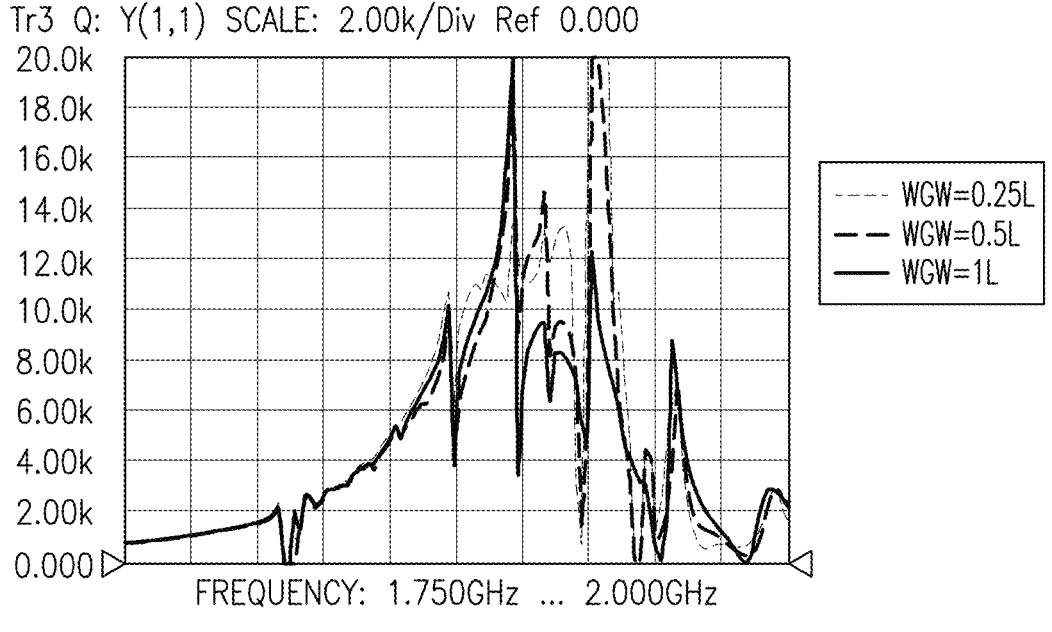

FIGS. 24A-24C are graphs illustrating the effect of the "wide gap width" WGW between the first and second bus bars 110, 120, 210, 220 on the frequency response of the acoustic wave device 1000 having the first silicon-comprising structure 430 as shown in FIGS. 17A and 17B, without the protection layer 345. All of FIGS. 24A-24C show on their horizontal axis a frequency range between 1.700 GHz and 1.950 GHz. FIG. 24A shows on its vertical axis the magnitude of the admittance. FIG. 24B shows on its vertical axis the real part of the admittance. FIG. 24C shows on its vertical axis the Q value.

FIG. 24C indicates that the variant with the smallest "wide gap width", WGW=0.25 L, exhibits the best performance regarding the Q value in this configuration.

Figure 25A:
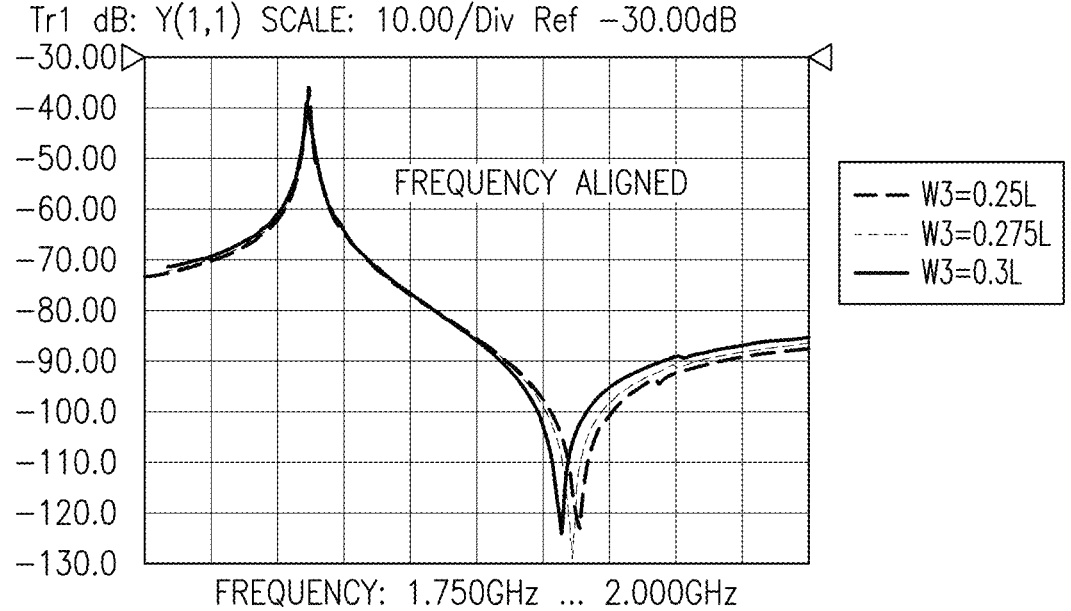
FIGS. 25A-25C are graphs illustrating the effect of the width of the electrode fingers (or, in other words, of the duty factor of the central area C of the acoustic wave device) on the frequency response of the acoustic wave device according to embodiments having the silicon-comprising structure as shown in FIGS. 17A and 17B.
Figure 25B:
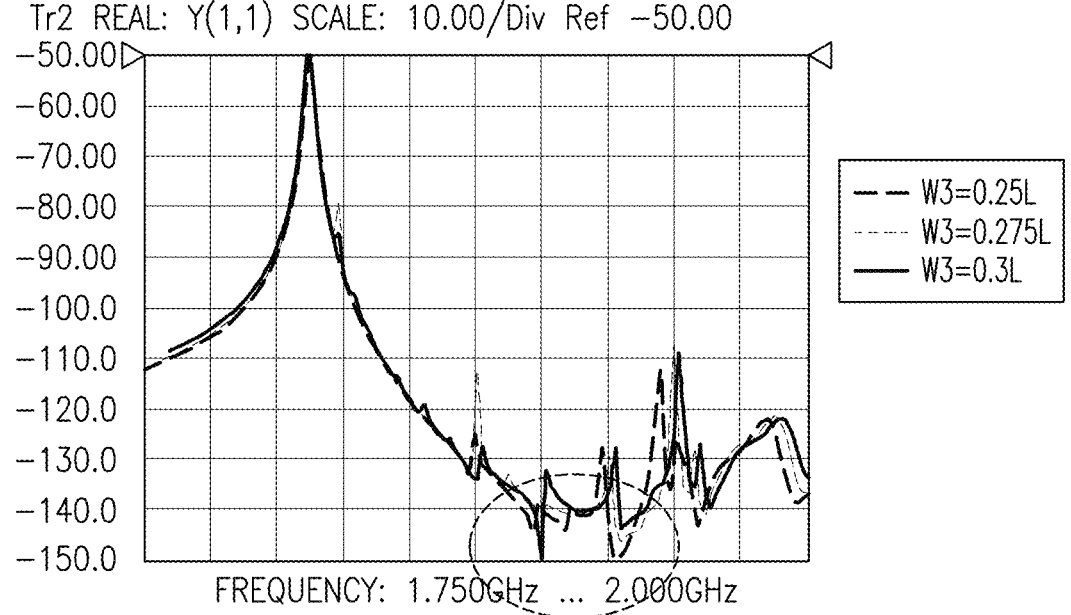
Figure 25C:
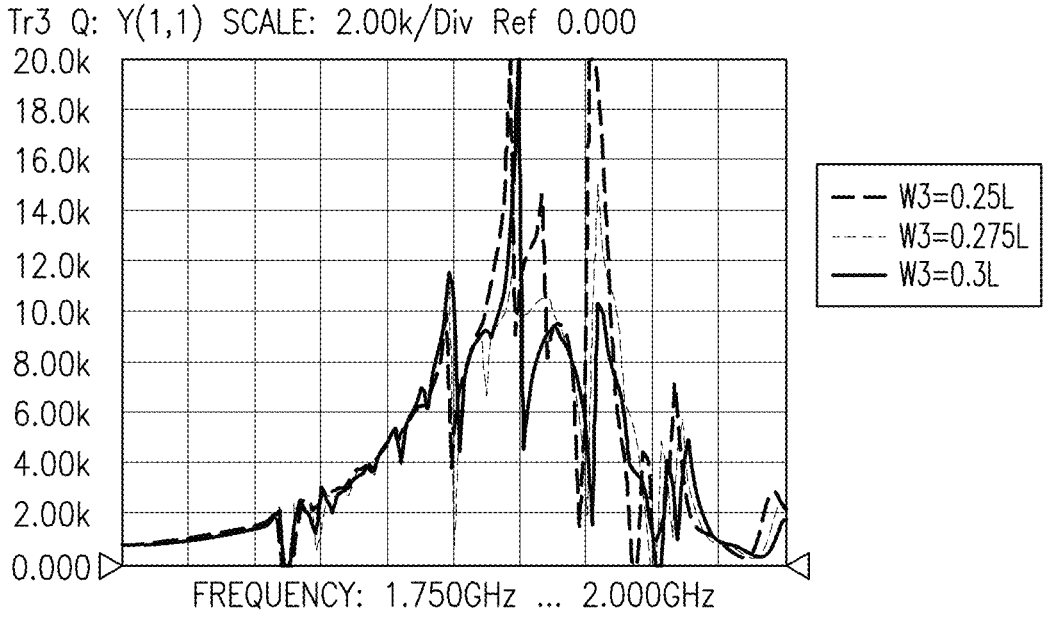

FIGS. 25A-25C are graphs illustrating the effect of the width W3 of the electrode fingers 130, 230 (or, in other words, of the duty factor of the central area C of the acoustic wave device 1000) on the frequency response of the acoustic wave device 1000 having the first silicon-comprising structure 430 as shown in FIGS. 17A and 17B. All of FIGS. 25A-25C show on their horizontal axis a frequency range between 1.700 GHz and 1.950 GHz. FIG. 25A shows on its vertical axis the magnitude of the admittance. FIG. 25B shows on its vertical axis the real part of the admittance. FIG. 25C shows on its vertical axis the Q value.

FIG. 25C indicates that also a smaller duty factor, i.e. a smaller width W3 of the electrode fingers 130, 230 of W3=0.25 L yields satisfactory results, meaning that the acoustic wave device 1000 can ceteris paribus be reduced in size which is nearly always advantageous.

Figure 26A:
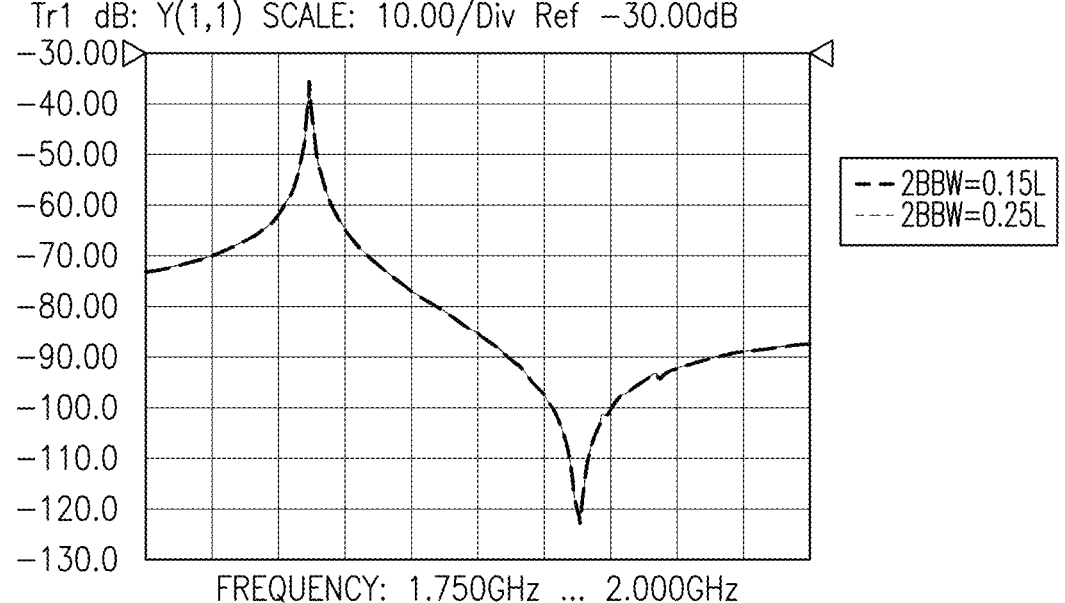
FIGS. 26A-26C are graphs illustrating the effect of the width of the first bus bars on the frequency response of the acoustic wave device according to embodiments having the silicon-comprising structure as shown in FIGS. 17A and 17B.
Figure 26B:
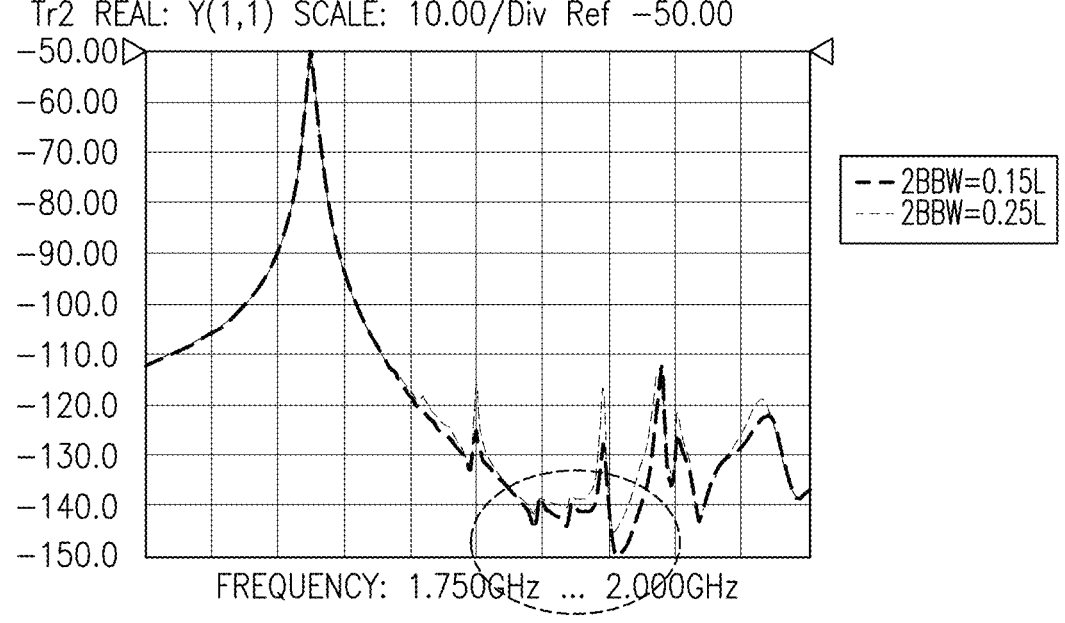
Figure 26C:
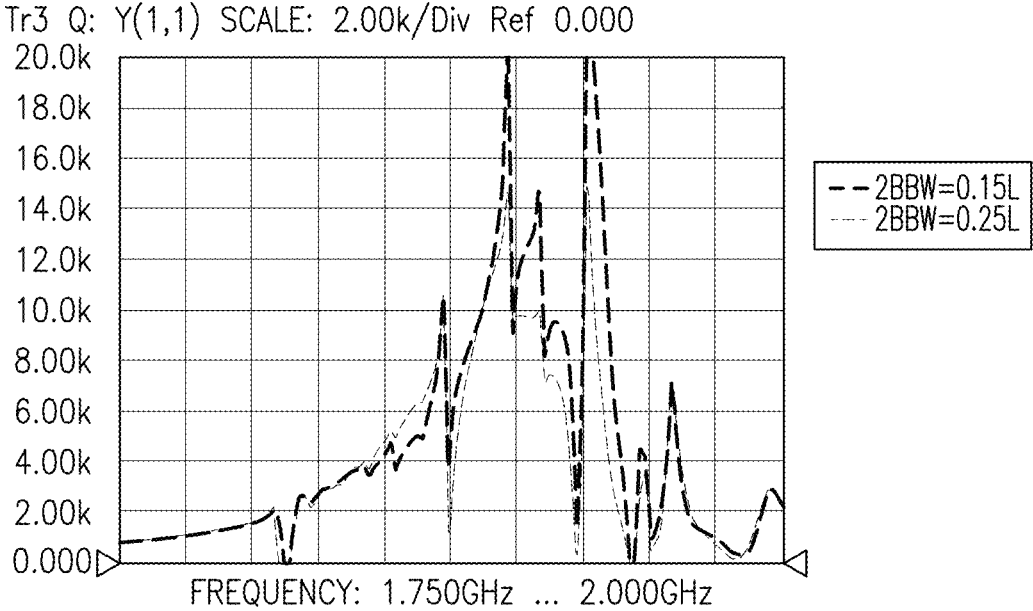

FIGS. 26A-26C are graphs illustrating the effect of the width 1BBW of the first bus bars 110, 210 on the frequency response of the acoustic wave device 1000 having the first silicon-comprising structure 430 as shown in FIGS. 17A and 17B. All of FIGS. 26A-26C show on their horizontal axis a frequency range between 1.700 GHz and 1.950 GHz. FIG. 26A shows on its vertical axis the magnitude of the admittance. FIG. 26B shows on its vertical axis the real part of the admittance. FIG. 26C shows on its vertical axis the Q value.

FIG. 25C indicates that the smaller first bus bar width 1BBW=0.15 L is preferred over the larger 1BBW=0.25 L.

Figure 27A:
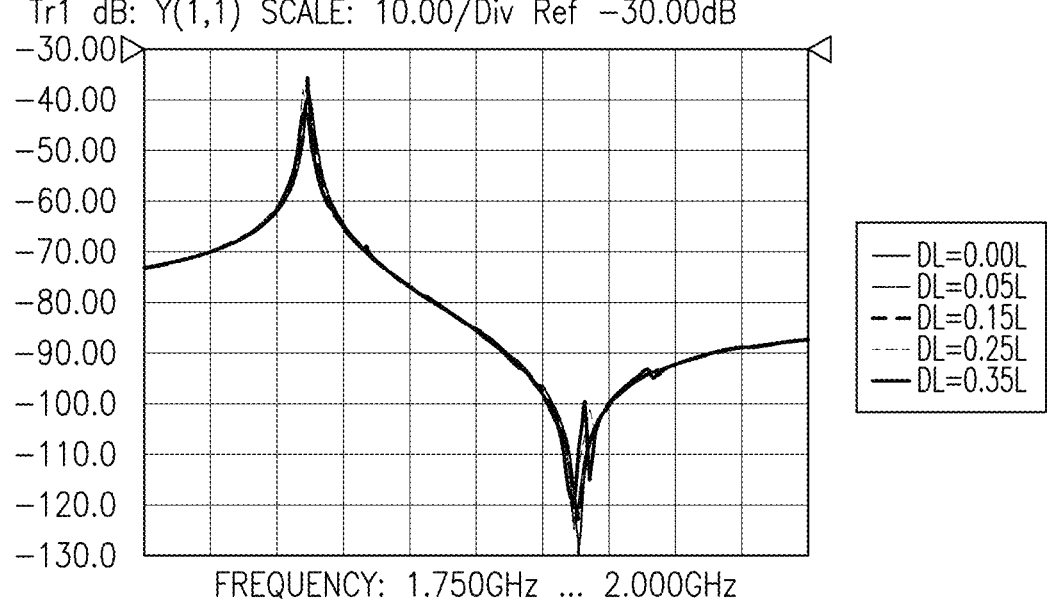
FIGS. 27A-27C are graphs illustrating the effect of the length of the dummy electrode fingers on the frequency response of the acoustic wave device according to embodiments having the silicon-comprising structure as shown in FIGS. 17A and 17B.
Figure 27B:
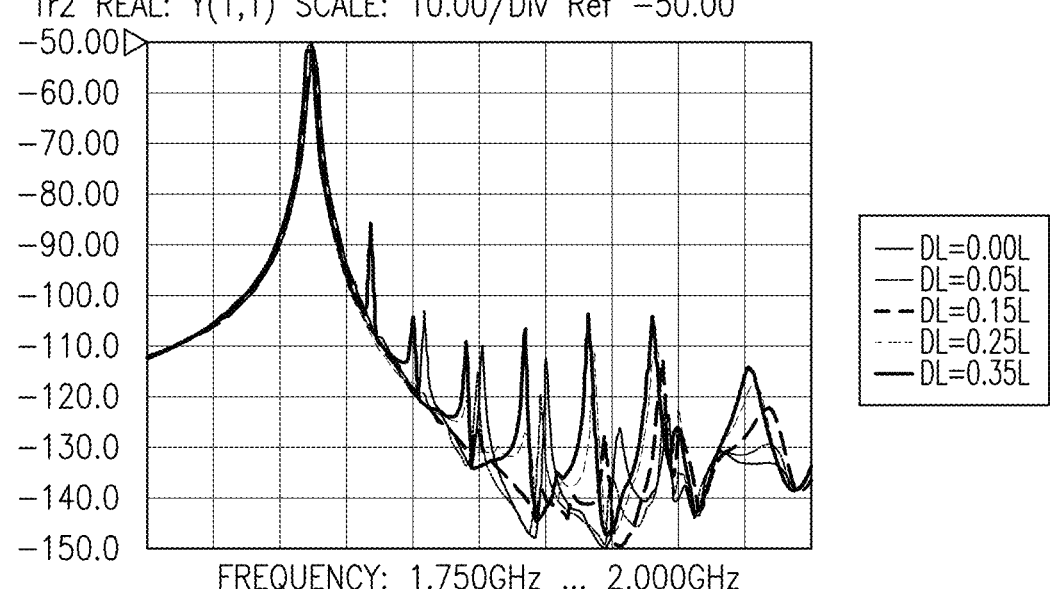
Figure 27C:
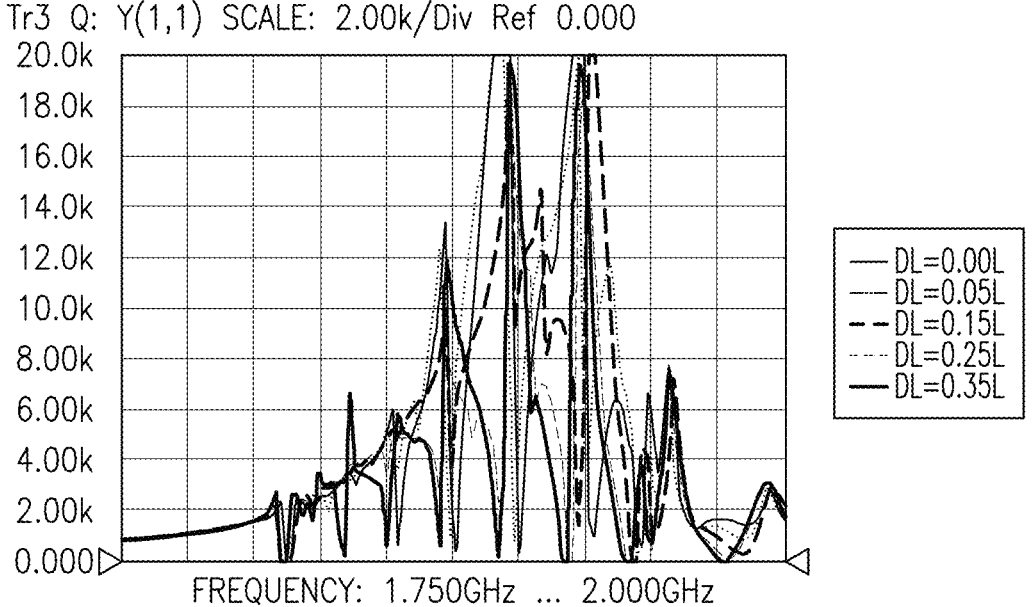

FIGS. 27A-27C are graphs illustrating the effect of the length DL of the dummy electrode fingers 121, 221 on the frequency response of the acoustic wave device 1000 having the first silicon-comprising structure 430 as shown in FIGS. 17A and 17B, without the protection layer 345. All of FIGS. 27A-27C show on their horizontal axis a frequency range between 1.700 GHz and 1.950 GHz. FIG. 27A shows on its vertical axis the magnitude of the admittance. FIG. 27B shows on its vertical axis the real part of the admittance. FIG. 27C shows on its vertical axis the Q value.

FIG. 27C indicates that the optimization of the length DL of the dummy electrode fingers 121, 221 has considerable effects on the Q value, and that values of DL between DL=0.15 L and DL=0.25 L exhibit the best overall performance.

Figure 28A:
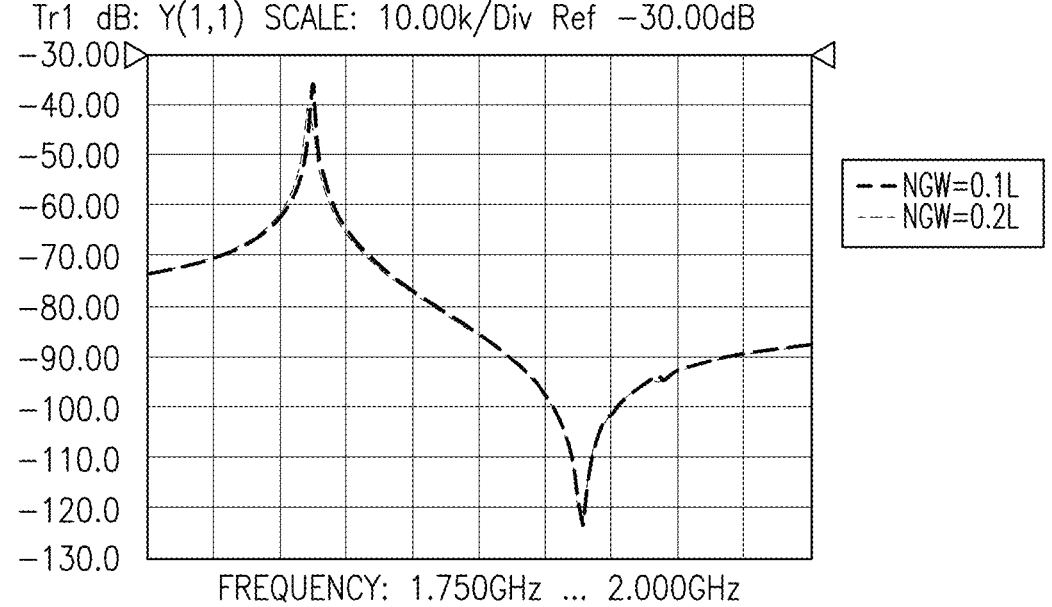
FIGS. 28A-28C are graphs illustrating the effect of the width of the gap between the dummy electrode fingers and the opposing electrode fingers on the frequency response of the acoustic wave device according to embodiments having the silicon-comprising structure as shown in FIGS. 17A and 17B.
Figure 28B:
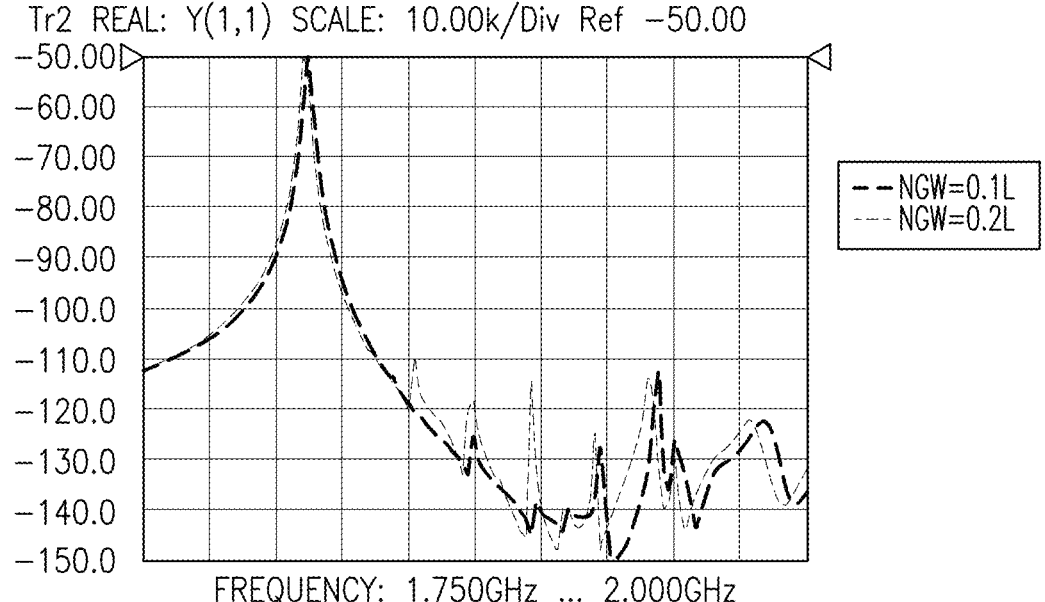
Figure 28C:
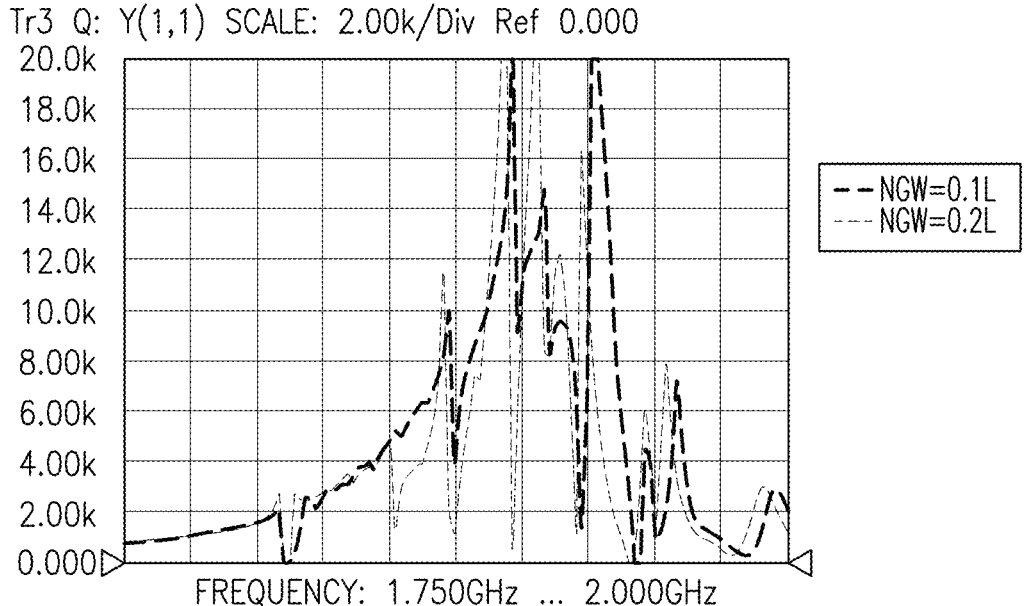

FIGS. 28A-28C are graphs illustrating the effect of the "narrow gap width" NGW between the dummy electrode fingers 121, 221 and the electrode fingers 130, 230 on the frequency response of the acoustic wave device 1000 having the first silicon-comprising structure 430 as shown in FIGS. 17A and 17B, without the protection layer 345. All of FIGS. 28A-28C show on their horizontal axis a frequency range between 1.700 GHz and 1.950 GHz. FIG. 28A shows on its vertical axis the magnitude of the admittance. FIG. 28B shows on its vertical axis the real part of the admittance. FIG. 28C shows on its vertical axis the Q value.

FIG. 28C indicates that the narrower values for the "narrow gap width", NGW=0.1 L is preferred over the wider choice of NGW=0.2 L.

Figure 29:
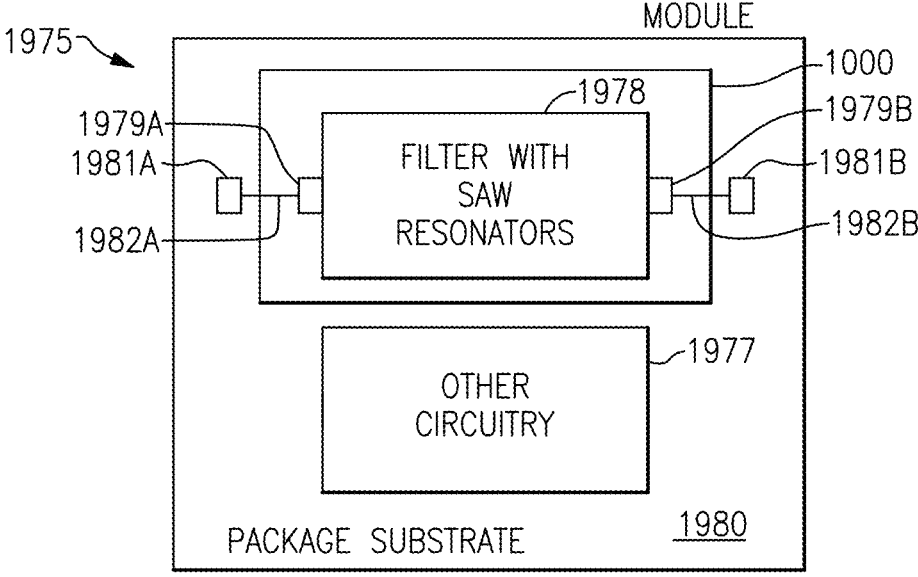
FIG. 29 is a schematic diagram of a radio frequency module that includes a surface acoustic wave component according to an embodiment.

FIG. 29 is a schematic diagram of a radio frequency module 1975 that includes an acoustic wave device 1000 according to an embodiment. The illustrated radio frequency module 1975 includes the acoustic wave device 1000 and other circuitry 1977. The acoustic wave device 1000 can include one or more resonators with any suitable combination of features of the resonators or packages disclosed herein, and the acoustic wave device 1000 may be configured according to any of the embodiments, variants, or refinements of embodiments as discussed and described herein, in particular with respect to the foregoing FIGS. 1-28C.

The acoustic wave device 1000 shown in FIG. 29 includes a filter 1978 and terminals 1979A and 1979B. The filter 1978 includes SAW resonators. One or more of the SAW resonators can be implemented in accordance with any suitable principles and advantages of the acoustic wave device 1000 of any of FIGS. 1-28C. The terminals 1979A and 1978B can serve, for example, as an input contact and an output contact. The acoustic wave device 1000 and the other circuitry 1977 are on a common packaging substrate 1980 in FIG. 29. The package substrate 1980 can be a laminate substrate. The terminals 1979A and 1979B can be electrically connected to contacts 1981A and 1981B, respectively, on the packaging substrate 1980 by way of electrical connectors 1982A and 1982B, respectively. The electrical connectors 1982A and 1982B can be bumps or wire bonds, for example. The other circuitry 1977 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 1975 can include one or more packaging structures to, for example, provide protection and/or facilitate easier handling of the radio frequency module 1975. Such a packaging structure can include an overmold structure formed over the packaging substrate 1980. The overmold structure can encapsulate some or all of the components of the radio frequency module 1975.

Figure 30:
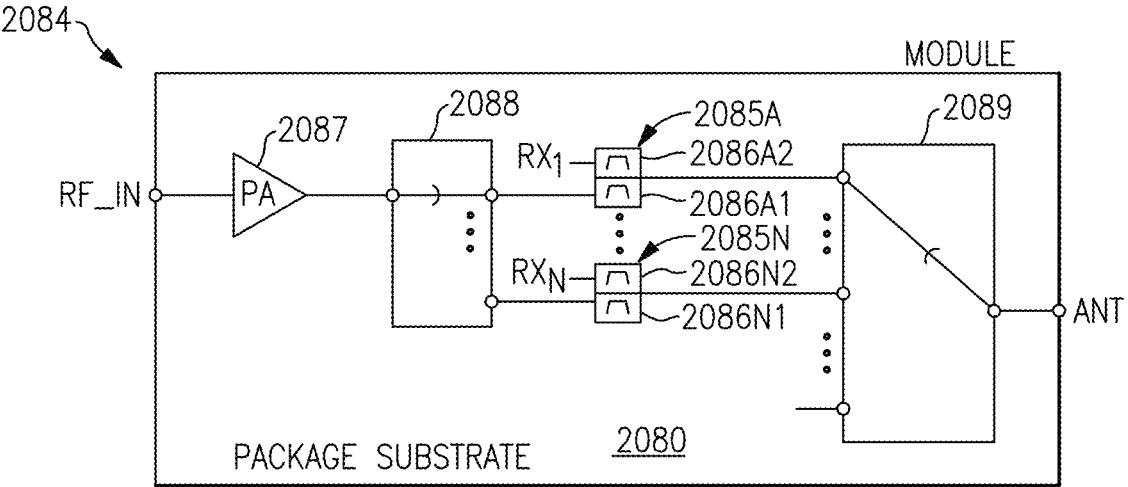
FIG. 30 is a schematic diagram of a radio frequency module that includes duplexers with surface acoustic wave resonators according to an embodiment.

FIG. 30 is a schematic diagram of a radio frequency module 2084 that includes an acoustic wave device 1000 according to an embodiment. As illustrated, the radio frequency module 2084 includes duplexers 2085A to 2085N that include respective transmit filters 2086A1 to 2086N1 and respective receive filters 2086A2 to 2086N2, a power amplifier 2087, a select switch 2088, and an antenna switch 2089. In some instances, the module 2084 can include one or more low noise amplifiers configured to receive a signal from one or more receive filters of the receive filters 2086A2 to 2086N2. The radio frequency module 2084 can include a package that encloses the illustrated elements. The illustrated elements can be disposed on a common packaging substrate 2080. The packaging substrate can be a laminate substrate, for example.

The duplexers 2085A to 2085N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 2086A1 to 2086N1 can include one or more resonators or packages in accordance with any suitable principles and advantages disclosed herein. Similarly, one or more of the receive filters 2086A2 to 2086N2 can include one or more resonators in accordance with any suitable principles and advantages disclosed herein. Although FIG. 9 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 2087 can amplify a radio frequency signal. The illustrated switch 2088 is a multi-throw radio frequency switch. The switch 2088 can electrically couple an output of the power amplifier 2087 to a selected transmit filter of the transmit filters 2086A1 to 2086N1. In some instances, the switch 2088 can electrically connect the output of the power amplifier 2087 to more than one of the transmit filters 2086A1 to 2086N1. The antenna switch 2089 can selectively couple a signal from one or more of the duplexers 2085A to 2085N to an antenna port ANT. The duplexers 2085A to 2085N can be associated with different frequency bands and/or different modes of operation (e.g., different power modes, different signaling modes, etc.).

Figure 31:
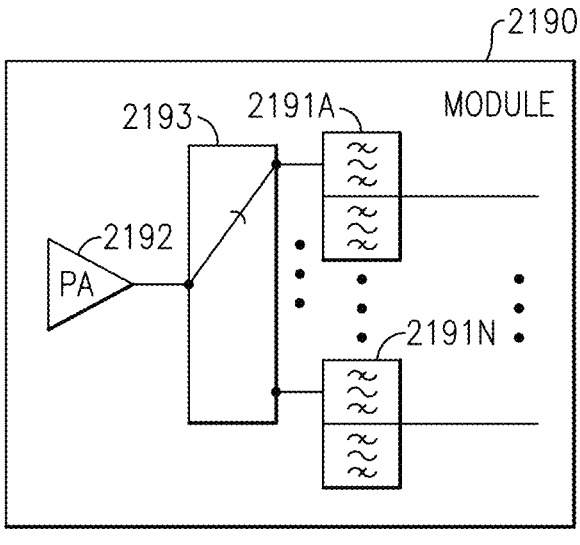
FIG. 31 is a schematic block diagram of a module that includes a power amplifier, a radio frequency switch, and duplexers that include one or more surface acoustic wave resonators according to an embodiment.

FIG. 31 is a schematic block diagram of a module 2190 that includes a power amplifier 2192, a radio frequency switch 2193, and duplexers 2191A to 2191N in accordance with one or more embodiments, i.e. comprising one or more acoustic wave devices 1000 according to embodiments. The power amplifier 2192 can amplify a radio frequency signal. The radio frequency switch 2193 can be a multi-throw radio frequency switch. The radio frequency switch 2193 can electrically couple an output of the power amplifier 2192 to a selected transmit filter of the duplexers 2191A to 2191N. One or more filters of the duplexers 2191A to 2191N can include any suitable number of surface acoustic wave resonators or packages in accordance with any suitable principles and advantages discussed herein. Any suitable number of duplexers 2191A to 2191N can be implemented.

Figure 32:
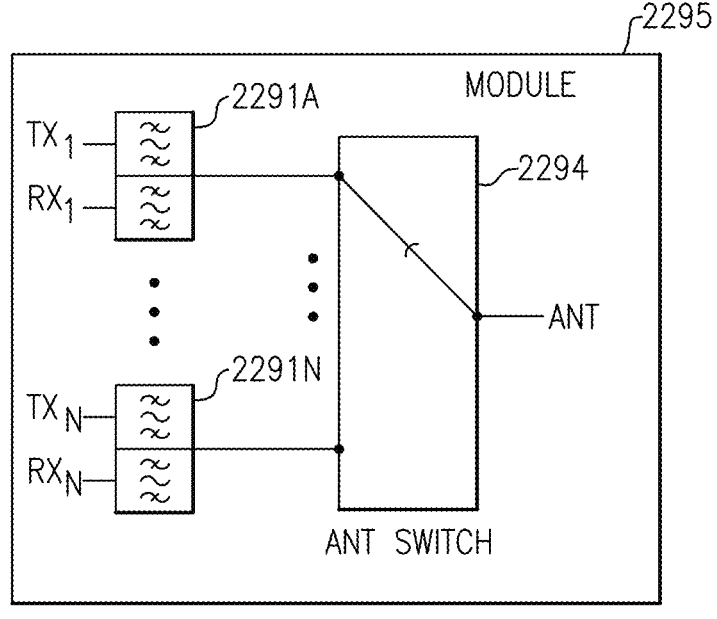
FIG. 32 is a schematic block diagram of a module that includes an antenna switch and duplexers that include one or more surface acoustic wave resonators according to an embodiment.

FIG. 32 is a schematic block diagram of a module 2295 that includes duplexers 2291A to 2291N and an antenna switch 2294. One or more filters of the duplexers 2291A to 2291N can include any suitable number of acoustic wave devices 1000 in accordance with any suitable principles and advantages discussed herein. Any suitable number of duplexers 2291A to 2291N can be implemented. The antenna switch 2294 can have a number of throws corresponding to the number of duplexers 2291A to 2291N. The antenna switch 2294 can electrically couple a selected duplexer to an antenna port of the module 2190.

Figure 33:
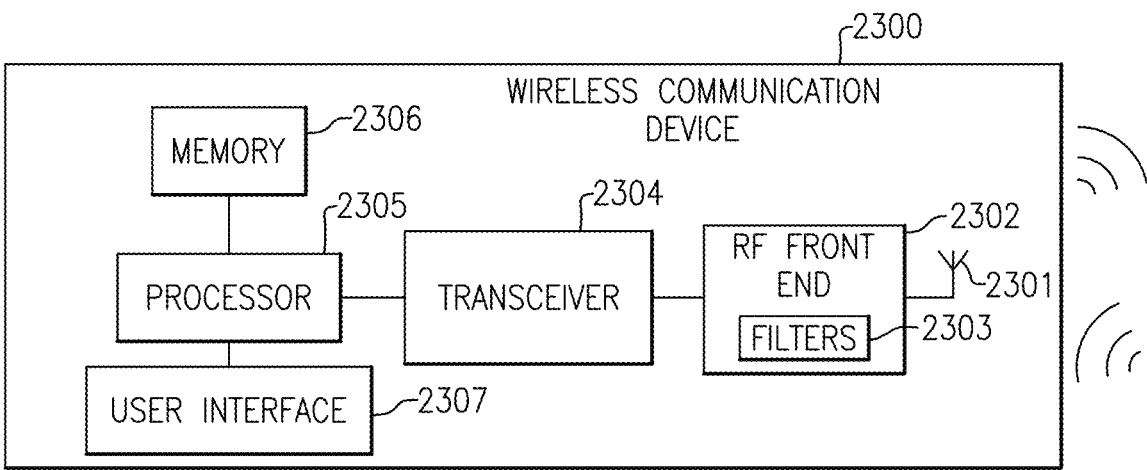
FIG. 33 is a schematic block diagram of a wireless communication device that includes a filter in accordance with one or more embodiments.

FIG. 33 is a schematic diagram of a wireless communication device 2300 that includes filters 2303 in a radio frequency front end 2302 according to an embodiment. The filters 2303 can include one or more acoustic wave devices 1000 in accordance with any embodiments and/or suitable principles and advantages discussed herein. The wireless communication device 2300 can be any suitable wireless communication device. For instance, a wireless communication device 2300 can be a mobile phone, such as a smart phone. As illustrated, the wireless communication device 2300 includes an antenna 2301, an RF front end 2302, a transceiver 2304, a processor 2305, a memory 2306, and a user interface 2307. The antenna 2301 can transmit/receive RF signals provided by the RF front end 2302. Such RF signals can include carrier aggregation signals. Although not illustrated, the wireless communication device 2300 can include a microphone and a speaker in certain applications.

The RF front end 2302 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 2302 can transmit and receive RF signals associated with any suitable communication standards. The filters 2303 can include any acoustic wave device 1000 that includes any suitable combination of features discussed with reference to any embodiments discussed above.

The transceiver 2304 can provide RF signals to the RF front end 2302 for amplification and/or other processing. The transceiver 2304 can also process an RF signal provided by a low noise amplifier of the RF front end 2302. The transceiver 2304 is in communication with the processor 2305. The processor 2305 can be a baseband processor. The processor 2305 can provide any suitable base band processing functions for the wireless communication device 2300. The memory 2306 can be accessed by the processor 2305. The memory 2306 can store any suitable data for the wireless communication device 2300. The user interface 2307 can be any suitable user interface, such as a display with touch screen capabilities.

Figure 34:
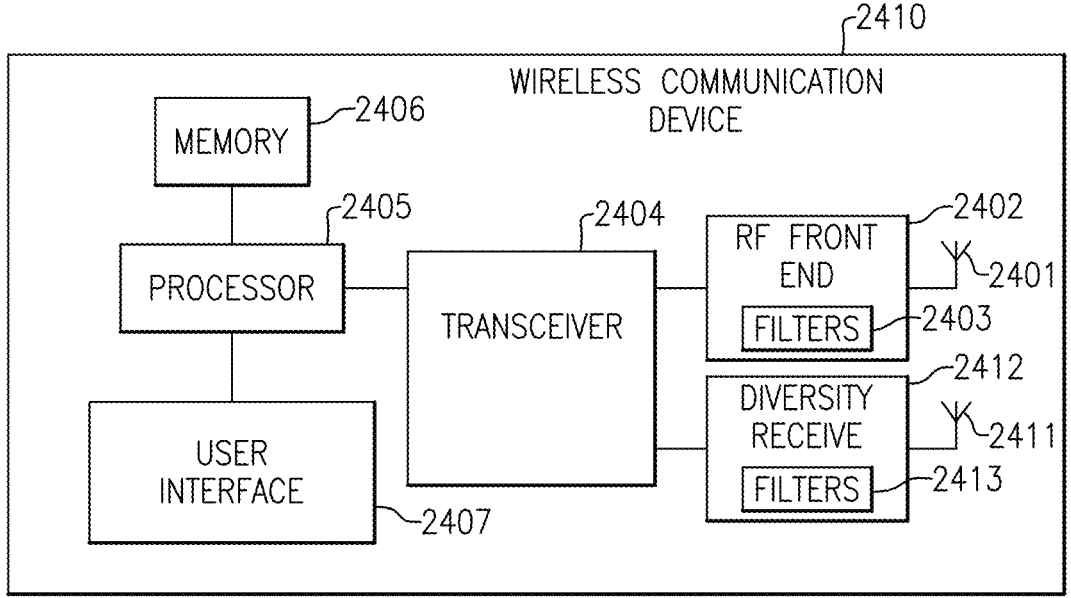
FIG. 34 is a schematic block diagram of another wireless communication device that includes a filter in accordance with one or more embodiments.

FIG. 34 is a schematic diagram of a wireless communication device 2410 that includes filters 2403 in a radio frequency front end 2402 and one or more second filter 2413 in a diversity receive module 2412. The wireless communication device 2410 is like the wireless communication device 2300 of FIG. 33, except that the wireless communication device 2410 also includes diversity receive features. As illustrated in FIG. 34, the wireless communication device 2410 includes a diversity antenna 2411, a diversity module 2412 configured to process signals received by the diversity antenna 2411 and including filters 2413, and a transceiver 2404 in communication with both the radio frequency front end 2402 and the diversity receive module 2412. The filters 2413 can include one or more acoustic wave devices 1000 that include any suitable combination of features discussed with reference to any embodiments discussed above.

Although embodiments disclosed herein relate to specific acoustic wave devices, any suitable principles and advantages disclosed herein can be applied to other types of acoustic wave devices such as acoustic wave resonators that include an IDT electrode, such as surface acoustic wave (SAW) resonators, bulk acoustic wave (BAW) resonators, Lamb wave resonators and/or boundary wave resonators.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHZ. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an car piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:

a layer of piezoelectric material; and two interdigital transducer electrodes disposed on an upper surface of the layer of piezoelectric material, each interdigital transducer electrode of the two interdigital transducer electrodes including a first bus bar, a second bus bar arranged in parallel to the first bus bar and having a smaller width than the first bus bar, a plurality of electrode fingers extending from the second bus bar towards the respective other interdigital transducer electrode, the electrode fingers of the two interdigital transducer electrodes being interleaved, the second bus bar of each interdigital transducer electrode being connected with the first bus bar of the same interdigital transducer electrode via a plurality of bridges, each bridge extending collinearly with one of the electrode fingers of the same interdigital transducer electrode, each bridge having a width smaller than a smallest width of the electrode finger with which it is collinear.

2. The acoustic wave device of claim 1 wherein the width of the bridge of each electrode finger is between 50% and 80% of the width of a central portion of that electrode finger.

3. The acoustic wave device of claim 2 wherein the width of the bridge of each electrode finger is between 60% and 75% of the width of the central portion of that electrode finger.

4. The acoustic wave device of claim 1 wherein each electrode finger is composed mainly of a central portion and further includes at least one flared portion having a greater width than the central portion.

5. The acoustic wave device of claim 4 wherein the at least one flared portion has a length of between 0.5 L and 2 L, L being a periodic distance between two electrode fingers of the same electrode.

6. The acoustic wave device of claim 4 wherein each electrode finger includes a proximal flared portion which is closer to the second bus bar from which that electrode finger extends than the central portion of that electrode finger.

7. The acoustic wave device of claim 6 wherein each electrode finger includes an intermediate portion between the second bus bar and the proximal flared portion, the intermediate portion being of the same width as the central portion of that electrode finger.

8. The acoustic wave device of claim 1 wherein each electrode finger includes a distal flared portion at its distal end facing the other interdigital transducer electrode.

9. The acoustic wave device of claim 8 wherein each second bus bar of each of the interdigital transducer electrode includes a dummy electrode finger extending from the second bus bar towards a corresponding one of the flared portions at the distal ends of the electrode fingers of the other interdigital transducer electrode.

10. The acoustic wave device of claim 9 wherein the width of each of the dummy electrode fingers is smaller than the width of the corresponding flared portion of the electrode finger it faces.

11. The acoustic wave device of claim 9 wherein a length of the dummy electrode finger is between 0.05 L and 0.25 L, L being a periodic distance between two electrode fingers of the same electrode.

12. The acoustic wave device of claim 9 wherein a length of each dummy electrode finger is between 0.05 and 0.25 times the length of the flared portion it faces, and the width of each dummy electrode finger is between 0.15 L and 0.25 L.

13. The acoustic wave device of claim 9 wherein a first silicon-comprising structure is arranged over a first area of the interdigital transducer electrodes where the electrode fingers of the two electrodes are interwoven.

14. The acoustic wave device of claim 13 wherein a second silicon-comprising structure is arranged over a second area of one or both of the interdigital transducer electrodes, the second area including at least the second bus bar, the dummy electrode fingers, and at least a part of the first bus bar.

15. The acoustic wave device of claim 14 wherein the second silicon-comprising structure has a width, in a direction parallel to the electrode fingers, of between 0.75 L and 1.0 L, and/or a depth between 0.007 L and 0.015 L.

16. The acoustic wave device of claim 1 wherein a gap between the first bus bar and the second bus bar is between 0.3 L and 1.0 L.

17. The acoustic wave device of claim 1 wherein a width of the second bus bar is between 0.05 L and 0.25 L.

18. The acoustic wave device of claim 1 wherein at least one trench is formed in the piezoelectric layer, the trench being arranged in parallel to the first and second bus bars, the at least one trench causing the surface of the piezoelectric layer to be lower between the electrode fingers compared to areas without the at least one trench.

19. The acoustic wave device of claim 18 wherein two parallel trenches are formed, each trench being formed in a respective region of distal ends of one of the interdigital transducers electrodes.

20. The acoustic wave device of claim 1 wherein the interdigital transducer electrodes are formed in at least a first and a second IDT electrode layers having different densities, and the second IDT electrode layer is disposed on an other side of the first IDT electrode layer as the piezoelectric layer, and includes aluminum, copper, magnesium, tungsten, titanium, platinum and/or ruthenium.

21. A radio frequency module comprising:

a module package; and an acoustic device within the module package, the acoustic device including a layer of piezoelectric material and two interdigital transducer electrodes disposed on an upper surface of the layer of piezoelectric material, each interdigital transducer electrode of the two interdigital transducer electrodes including a first bus bar, a second bus bar arranged in parallel to the first bus bar and having a smaller width than the first bus bar, a plurality of electrode fingers extending from the second bus bar towards the respective other interdigital transducer electrode, the electrode fingers of the two interdigital transducer electrodes being interleaved, the second bus bar of each interdigital transducer electrode being connected with the first bus bar of the same interdigital transducer electrode via a plurality of bridges, each bridge extending collinearly with one of the electrode fingers of the same interdigital transducer electrode, each bridge having a width smaller than a smallest width of the electrode finger with which it is collinear.

22. A wireless communication device comprising:
one or more antennas; and
a radio frequency module including an acoustic device, the acoustic device having a layer of piezoelectric material and two interdigital transducer electrodes disposed on an upper surface of the layer of piezoelectric material, each interdigital transducer electrode of the two interdigital transducer electrodes including a first bus bar, a second bus bar arranged in parallel to the first bus bar and having a smaller width than the first bus bar, a plurality of electrode fingers extending from the second bus bar towards the respective other interdigital transducer electrode, the electrode fingers of the two interdigital transducer electrodes being interleaved, the second bus bar of each interdigital transducer electrode being connected with the first bus bar of the same interdigital transducer electrode via a plurality of bridges, each bridge extending collinearly with one of the electrode fingers of the same interdigital transducer electrode, each bridge having a width smaller than a smallest width of the electrode finger with which it is collinear.

\* \* \* \* \*